(12) United States Patent
Kawai et al.

(10) Patent No.: US 8,963,207 B2
(45) Date of Patent: Feb. 24, 2015

(54) SEMICONDUCTOR DEVICE

(71) Applicant: Renesas Electronics Corporation, Kawasaki (JP)

(72) Inventors: Tohru Kawai, Kawasaki (JP); Takashi Inoue, Kawasaki (JP); Tatsuo Nakayama, Kawasaki (JP); Yasuhiro Okamoto, Kawasaki (JP); Hironobu Miyamoto, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/188,462

(22) Filed: Feb. 24, 2014

(65) Prior Publication Data

US 2014/0239311 A1   Aug. 28, 2014

(30) Foreign Application Priority Data

Feb. 25, 2013   (JP) ................................ 2013-035055

(51) Int. Cl.
*H01L 29/778*   (2006.01)
*H01L 21/768*   (2006.01)
(Continued)

(52) U.S. Cl.
CPC .......... *H01L 21/76895* (2013.01); *H01L 29/36* (2013.01); *H01L 29/66462* (2013.01); *H01L 29/7783* (2013.01); *H01L 29/7786* (2013.01); *H01L 29/7789* (2013.01); *H01L 29/105* (2013.01); *H01L 29/2003* (2013.01);
(Continued)

(58) Field of Classification Search
USPC .......................... 257/183, 190–192, 194, 201
See application file for complete search history.

(56) References Cited

U.S. PATENT DOCUMENTS 7,745,852 B2 *   6/2010   Teraguchi ...................... 257/194
7,821,032 B2 *   10/2010   Kinzer .......................... 257/192
(Continued)

FOREIGN PATENT DOCUMENTS

JP   2010-272728 A   12/2010
JP   2011-009493 A   1/2011
(Continued)

OTHER PUBLICATIONS

N. G. Weimann et al., "Scattering of Electrons at Threading Dislocations in GAN", Journal of Applied Physics, vol. 83, No. 7, p. 3656, 1998.

(Continued)

*Primary Examiner* — Evan Pert
(74) *Attorney, Agent, or Firm* — McGinn IP Law Group, PLLC

(57) ABSTRACT

A semiconductor device includes a buffer layer, a channel layer and a barrier layer formed over a substrate, a trench penetrating through the barrier layer to reach the middle of the channel layer, and a gate electrode disposed inside the trench via a gate insulating film. The channel layer contains n-type impurities, and a region of the channel layer positioned on a buffer layer side has an n-type impurity concentration larger than a region of the channel layer positioned on a barrier layer side, and the buffer layer is made of nitride semiconductor having a band gap wider than that of the channel layer. The channel layer is made of GaN and the buffer layer is made of AlGaN. The channel layer has a channel lower layer containing n-type impurities at an intermediate concentration and a main channel layer formed thereon and containing n-type impurities at a low concentration.

20 Claims, 54 Drawing Sheets

(51) Int. Cl.
  *H01L 29/36* (2006.01)
  *H01L 29/66* (2006.01)
  *H01L 29/10* (2006.01)
  *H01L 29/20* (2006.01)
  *H01L 29/417* (2006.01)
  *H01L 29/423* (2006.01)
  *H01L 29/45* (2006.01)

(52) U.S. Cl.
  CPC ....... *H01L29/41758* (2013.01); *H01L 29/4236* (2013.01); *H01L 29/452* (2013.01); *H01L 29/1045* (2013.01)
  USPC .......................................... 257/192; 257/194

(56) References Cited

U.S. PATENT DOCUMENTS

| | | | |
|---|---|---|---|
| 7,821,035 B2* | 10/2010 | Nomura et al. | 257/194 |
| 7,985,987 B2* | 7/2011 | Kaneko | 257/194 |
| 7,999,286 B2* | 8/2011 | Ohta et al. | 257/194 |
| 8,044,434 B2* | 10/2011 | Ohta et al. | 257/194 |
| 8,129,748 B2* | 3/2012 | Uemoto et al. | 257/192 |
| 8,183,558 B2* | 5/2012 | Makiyama et al. | 257/24 |
| 8,288,796 B2* | 10/2012 | Ito et al. | 257/192 |
| 8,344,420 B1* | 1/2013 | Jimenez | 257/192 |
| 8,441,035 B2* | 5/2013 | Hikita et al. | 257/192 |
| 8,525,231 B2* | 9/2013 | Park et al. | 257/194 |
| 2011/0006346 A1 | 1/2011 | Ando et al. | |
| 2013/0149828 A1 | 6/2013 | Sato et al. | |
| 2013/0292699 A1 | 11/2013 | Ueno et al. | |

FOREIGN PATENT DOCUMENTS

| | | |
|---|---|---|
| JP | 2011-243978 A | 12/2011 |
| WO | WO 2009/113612 A1 | 9/2009 |

OTHER PUBLICATIONS

N. Ikeda et al. "Over 1.71kV normally-off GaN-I hybrid MOS-HFETs with a lower on-resistance on a Si substrate", IE3 International Symposium on Power semiconductor Devices and ICs (ISPSD), pp. 284-287, 2011 (cited in the specification).

* cited by examiner

FIG. 12

| LAYER | MATERIAL | FILM THICKNESS (nm) | DOPING AMOUNT (/cm³) |
|---|---|---|---|
| GATE INSULATING FILM | ALUMINA | 100 | |
| CHANNEL LAYER | unGaN | 30 | Nd=1e15 |
| BUFFER LAYER | unGaN | 1000 | Nd=1e15 |

FIG. 14

| LAYER | MATERIAL | FILM THICKNESS (nm) | DOPING AMOUNT (/cm$^3$) |
|---|---|---|---|
| GATE INSULATING FILM | ALUMINA | 100 | |
| CHANNEL LAYER | nmGaN | 30 | Nd=1e17 |
| BUFFER LAYER | unGaN | 1000 | Nd=1e15 |

| LAYER | MATERIAL | FILM THICKNESS (nm) | DOPING AMOUNT (/cm³) |
|---|---|---|---|
| GATE INSULATING FILM | ALUMINA | 100 | |
| CHANNEL LAYER | nmGaN | 30 | Nd=1e17 |
| BUFFER LAYER | unAl$_{0.02}$Ga$_{0.98}$N | 1000 | |

| LAYER | MATERIAL | FILM THICKNESS (nm) | DOPING AMOUNT (/cm³) |
|---|---|---|---|
| GATE INSULATING FILM | ALUMINA | 100 | |
| MAIN CHANNEL LAYER | nmGaN | 20 | Nd=1e17 |
| CHANNEL LOWER LAYER | nGaN | 10 | Nd=1e18 |
| BUFFER LAYER | unAl$_{0.03}$Ga$_{0.97}$N | 1000 | |

FIG. 25

| LAYER | MATERIAL | FILM THICKNESS (nm) | DOPING AMOUNT (/cm³) |
|---|---|---|---|
| GATE INSULATING FILM | ALUMINA | 100 | |
| MAIN CHANNEL LAYER | nmGaN | 20 | Nd=1e17 |
| CHANNEL FIRST LOWER LAYER | nGaN | 10 | Nd=1e18 |
| CHANNEL SECOND LOWER LAYER | unGaN | 30 | Nd=1e15 |
| BUFFER LAYER | unAl$_{0.03}$Ga$_{0.97}$N | 1000 | |

FIG. 29

| LAYER | MATERIAL | FILM THICKNESS (nm) | DOPING AMOUNT (/cm$^3$) |
|---|---|---|---|
| GATE INSULATING FILM | ALUMINA | 100 | |
| MAIN CHANNEL LAYER | nmGaN | 30 | Nd=1e17 |
| CHANNEL LOWER LAYER | unGaN | 30 | Nd=1e15 |
| BUFFER LAYER | unAl$_{0.02}$Ga$_{0.98}$N | 1000 | |

SEMICONDUCTOR DEVICE

CROSS-REFERENCE TO RELATED APPLICATION

The present application claims priority from Japanese Patent Applications No. 2013-035055 filed on Feb. 25, 2013 and No. 2013-141305 filed on Jul. 5, 2013, the contents of which are hereby incorporated by reference into this application.

TECHNICAL FIELD OF THE INVENTION

The present invention relates to a semiconductor device and can be suitably utilized for a semiconductor device using nitride semiconductor.

BACKGROUND OF THE INVENTION

In recent years, attention has been paid to semiconductor devices using a group III-V compound having a band gap larger than that of Si. Among them, development of a semiconductor device using gallium nitride (GaN) which has such advantages as 1) large breakdown field, 2) large electron saturation rate, 3) large thermal conductivity, 4) capability for formation of excellent heterojunction between AlGaN and GaN, 5) non-toxicity and high safety, and the like has been advanced.

Further, in view of high withstand voltage and high-speed switch characteristics, development of a semiconductor device capable of normally-off operation such as a power MISFET (Metal Insulator Semiconductor Field Effect Transistor) using gallium nitride has been advanced.

For example, Japanese Patent Application Laid-Open Publication No. 2011-9493 (Patent Document 1) discloses a normally-off type nitride semiconductor device having a recess structure in which an AlGaN layer other than a gate region is made thick by a selective regrowth using an epitaxial growth method. In this nitride semiconductor device, a high-concentration doped layer (5) or a planar doped layer (52) is provided at an interface having many trap levels between an epitaxial growth layer and a selective regrowth layer.

Also, International Patent Publication No. 2009/113612 (Patent Document 2) discloses a semiconductor device in which a lower barrier layer made of lattice-relaxed $Al_xGa_{1-x}N$ ($0 \leq x \leq 1$), a channel layer made of $In_yGa_{1-y}N$ ($0 \leq x \leq 1$) having a compressive strain, and a contact layer made of $Al_zGa_{1-z}N$ ($0 \leq x \leq 1$) are sequentially stacked. Two dimensional electron gas is produced in the vicinity of an interface between the $In_yGa_{1-y}N$ channel layer and the $Al_zGa_{1-z}N$ contact layer.

Also, Japanese Patent Application Laid-Open Publication No. 2010-272728 (Patent Document 3) discloses a GaN-based semiconductor element (1) in which an AlN layer (12), a buffer layer (13) formed by stacking GaN layers and AlN layers alternately, and a channel layer (14) composed of a p-GaN layer are formed on a substrate (11) made of sapphire, SiC, Si or the like. On the channel layer (14), an electron transit layer (15) made of undoped GaN (un-GaN) and an electron supply layer (16) made of GaN-based semiconductor (AlGaN) having a band gap energy larger than that of the electron transit layer (15) are sequentially stacked. Further, portions (gate-electrode forming region) of the electron transit layer (15) and the electron supply layer (16) are removed to a depth reaching the channel layer (14), so that a recess portion (18) is formed.

Also, Japanese Patent Application Laid-Open Publication No. 2011-243978 (Patent Document 4) discloses a nitride-based semiconductor element (10) composed of a substrate (12), a buffer layer (14), a GaN layer (16), an AlGaN layer (20), a gate insulating film (22), a source electrode (24), a gate electrode (28), a drain electrode (26), and an SBD metal electrode (30) (see FIG. 1). Further, the Patent Document 4 discloses a nitride-based semiconductor element (80) in which an $n^+$ AlGaN layer (83-1) and an $n^+$ GaN layer (82-1) on the source electrode (24) side and an $n^+$AlGaN layer (83-2) and an $n^+$ GaN layer (82-2) on the SBD metal electrode (30) side constituting a first $n^+$ region are provided in a region below the gate insulating film (22) (see FIG. 11).

Also, N. Ikeda et al. "Over 1.7 kV normally-off GaN hybrid MOS-HFETs with a lower on-resistance on a Si substrate", IE3 International Symposium on Power semiconductor Devices and ICs (ISPSD), pp. 284-287, 2011 (Non-Patent Document 1) discloses a MISFET with a structure in which, in order to realize a normally-off operation by using a heterojunction between AlGaN and GaN, a gate recess is dug toward a back side beyond the heterojunction. Further, N. G. Weinmann et al., JOURNAL OF APPLIED PHYSICS, VOLUME 83, NUMBER 7, P. 3656, 1998 (Non-Patent Document 2) discloses a relationship between a doping amount into a GaN substrate and an electron mobility.

Incidentally, reference numerals in parentheses indicate reference numerals in the respective Patent Documents.

SUMMARY OF THE INVENTION

The inventors of the present invention have engaged in research and development of a semiconductor device using nitride semiconductor like those described above, and have earnestly studied the improvement in characteristics of a normally-off type semiconductor device. In the course of the study, the inventors have found that there is room for further improvement in the characteristics of the semiconductor device using nitride semiconductor.

The above and other objects and novel characteristics of the present invention will be apparent from the description of the present specification and the accompanying drawings.

The following is a brief description of an outline of the typical embodiment disclosed in the present application.

A semiconductor device described in an embodiment disclosed in this application includes a first nitride semiconductor layer formed over a substrate and a second nitride semiconductor layer formed thereon, and an n-type impurity concentration in the first nitride semiconductor layer is changed.

According to the semiconductor device described in the following representative embodiments disclosed in this application, characteristics of the semiconductor device can be improved.

BRIEF DESCRIPTIONS OF THE DRAWINGS

FIG. 12 is a table showing a configuration of a buffer layer, a channel layer and a gate insulating film of the semiconductor device of the related art 1;

FIG. 14 is a table showing a configuration of a buffer layer, a channel layer and a gate insulating film of the semiconductor device of the related art 2;

FIG. 25 is a table showing an example of a configuration of a buffer layer, a channel layer and a gate insulating film of the semiconductor device of the first embodiment;

FIG. 29 is a table showing an example of a configuration of a buffer layer, a channel layer and a gate insulating film of the semiconductor device of the third embodiment;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the number and others (including number of pieces, numerical values, amount, range and the like) described above.

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, when there are a plurality of similar members (portions), an individual or specific portion is indicated by adding a sign to a generic symbol in some cases. In addition, the description of the same or similar portions is not repeated in principle unless particularly required in the following embodiments.

Also, in some drawings used in the following embodiments, hatching is omitted even in a sectional view so as to make the drawings easy to see.

Further, the size of respective portions does not correspond to that of an actual device in sectional views, and a specific portion is shown in a relatively enlarged manner in some cases so as to make the drawings easy to see.

(First Embodiment)

Figure 1:
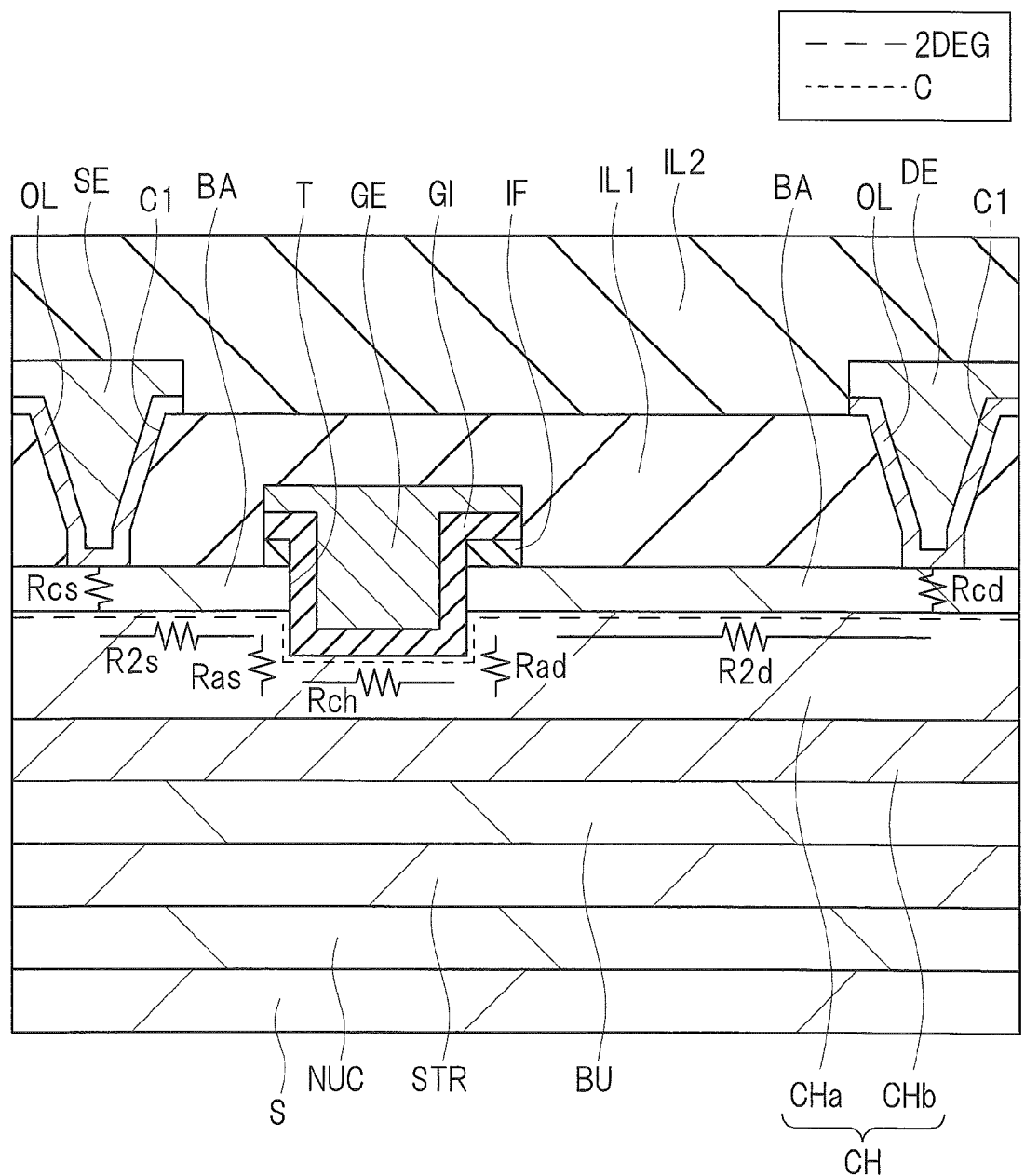
FIG. 1 is a sectional view showing a configuration of a semiconductor device of a first embodiment.

Hereinafter, the semiconductor device of the first embodiment will be described in detail with reference to drawings. FIG. 1 is a sectional view showing a configuration of the semiconductor device of the present embodiment. FIGs. 2 to 10 are sectional views showing a manufacturing process of the semiconductor device of the present embodiment.

Here, in this specification, regarding the impurity concentration in semiconductor, a low concentration (for example, a concentration represented as n⁻ (n minus), hereinafter described as nm) indicates a concentration in a range of 1e17 ($1\times10^{17}$)/cm$^3$ or more to less than 1e18 ($1\times10^{18}$)/cm$^3$. Also, an intermediate concentration (for example, a concentration represented as n) indicates a concentration in a range of 1e18 ($1\times10^{18}$)/cm$^3$ or more to less than 1e19 ($1\times10^{19}$)/cm$^3$. Further, a high concentration (concentration represented as n⁺ (n plus) in general) indicates a concentration of 1e19 ($1\times10^{19}$)/cm$^3$ or more. A case where donor or acceptor is not doped intentionally is defined as undoped. Note that, even in the undoped case (for example, concentration represented as un), conductive carriers are sometimes generated due to natural conversion to n. Considering this carrier concentration, an equivalent impurity concentration becomes 1e16 ($1\times10^{16}$)/cm$^3$ or less.

<Description of Related Art>

First, semiconductor devices of related arts will be described before a semiconductor device of the present embodiment is described.

(Related Art 1)

Figure 11:
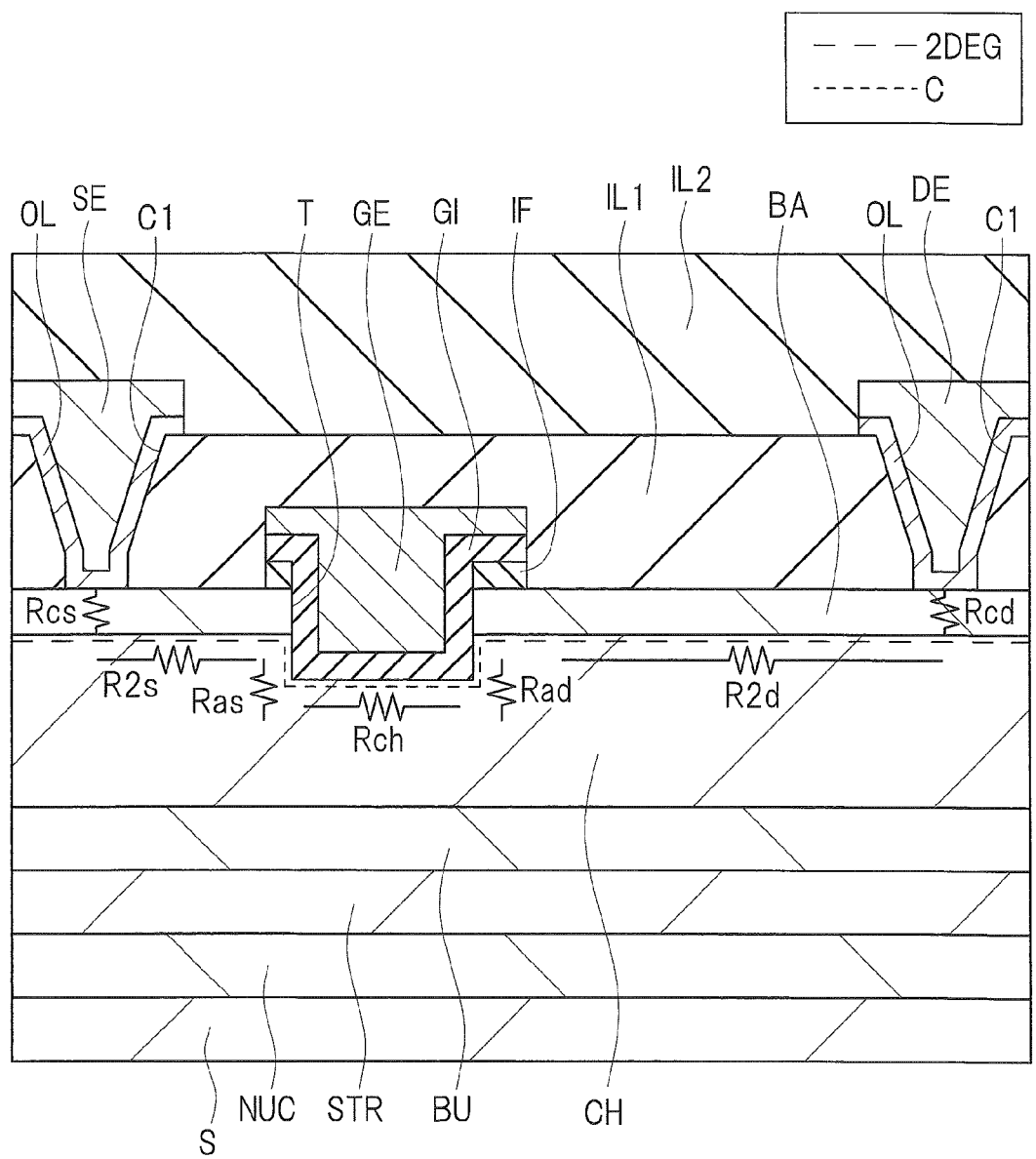
FIG. 11 is a sectional view showing a configuration of a semiconductor device of a related art 1 of the first embodiment.

FIG. 11 is a sectional view showing a configuration of a semiconductor device of a related art 1 of the present embodiment. FIG. 12 is a table showing a configuration of a buffer layer, a channel layer and a gate insulating film of the semiconductor device of the related art 1.

In the semiconductor device of the related art 1, a nucleation layer NUC, a strain relaxing layer STR, a buffer layer BU, a channel layer (also referred to as electron transit layer) CH, and a barrier layer BA are sequentially formed on a substrate S. A gate electrode GE is formed inside a trench T via a gate insulating film GI. The trench T is dug so as to penetrate through an insulating film IF and the barrier layer BA to reach the middle of the channel layer CH. A source electrode SE and a drain electrode DE are formed on the barrier layer BA on both sides of the gate electrode GE.

In the semiconductor device of the related art 1, a stacked layer portion in which the buffer layer BU, the channel layer CH and the gate insulating layer GI are stacked in this order from below (also referred to as buffer layer BU/channel layer CH/gate insulating film GI) has a configuration shown in FIG. 12. As shown in FIG. 12, the buffer layer BU is an undoped (also referred to as non-doped) GaN layer having a film thickness of about 1000 nm, and the channel layer CH is an undoped GaN layer (also referred to as un-GaN layer) which is a singular layer having a film thickness of about 30 nm. Also, the gate insulating film GI is alumina having a film thickness of about 100 nm, and the barrier layer BA is an undoped AlGaN layer. Note that, even in the undoped case, due to the natural conversion to n of each semiconductor layer, an equivalent impurity concentration (Nd, also referred to as doping amount or doping concentration) is described as about 1e15 ($1 \times 10^{15}$)/cm$^3$.

In this case, resistance of the semiconductor device (on resistance and access resistance) is as shown in FIG. 11. That is, as the resistance of the semiconductor device, there are a sheet resistance R2s between source and gate generated in a portion extending along two dimensional electron gas 2DEG between the gate electrode GE and the source electrode SE and a source resistance Rcs generated in the barrier layer BA between the two dimensional electron gas 2DEG and the source electrode SE. Further, there are a sheet resistance R2d between drain and gate generated in a portion extending along two dimensional electron gas 2DEG between the gate electrode GE and the drain electrode DE and a drain resistance Rcd generated in the barrier layer BA between the two dimensional electron gas 2DEG and the drain electrode DE. Furthermore, there are a channel resistance Rch which is a resistance of a MIS channel generated along a bottom surface of the trench T having the gate electrode GE formed therein, a channel resistance Ras which is a resistance of the MIS channel generated along a side surface (also referred to as sidewall) of the trench T on the source electrode SE side, and a channel resistance Rad which is a resistance of the MIS channel generated along a side surface of the trench T on the drain electrode DE side.

The inventors of the present invention have fabricated such a semiconductor device (FIG. 11) of the related art 1 experimentally and have examined the same. As a result, it has found that the above-described resistances Rch, Ras and Rad become excessively high. For example, it has found that, in a normally-off type semiconductor device having a threshold voltage value of 2 V, preferably 3 V, it is difficult to achieve a target of about 15 to 20 Ωmm (0.35 mΩmm$^2$ at Rsp) as the on resistance (@Vg=10 V and Vd=0.1 V). Therefore, it has found that it is necessary to reduce the above-described channel resistances Rch, Ras, and Rad in order to reduce the on resistance of the semiconductor device and improve characteristics of the semiconductor device.

It is considered that the cause of the increase of the above-described channel resistances Rch, Ras, and Rad lies in such a point that irregularities are formed on the bottom surface of the trench T by dry etching at the time of forming the trench T, so that interface roughness scattering is increased due to disorder of the bottom surface of the trench T, that is, an interface between the channel layer CH and the gate insulating film GI. Of the above-described channel resistances Rch, Ras and Rad, the channel resistance Rad generated along the side surface of the trench T on the drain electrode DE side is particularly large.

(Related Art 2)

The inventors of the present invention have examined a semiconductor device of a related art 2 in which an electron mobility is increased by introducing n-type impurities into the channel layer CH in order to reduce the on resistance of the semiconductor device (FIG. 11) of the above-described related art 1.

Figure 13:
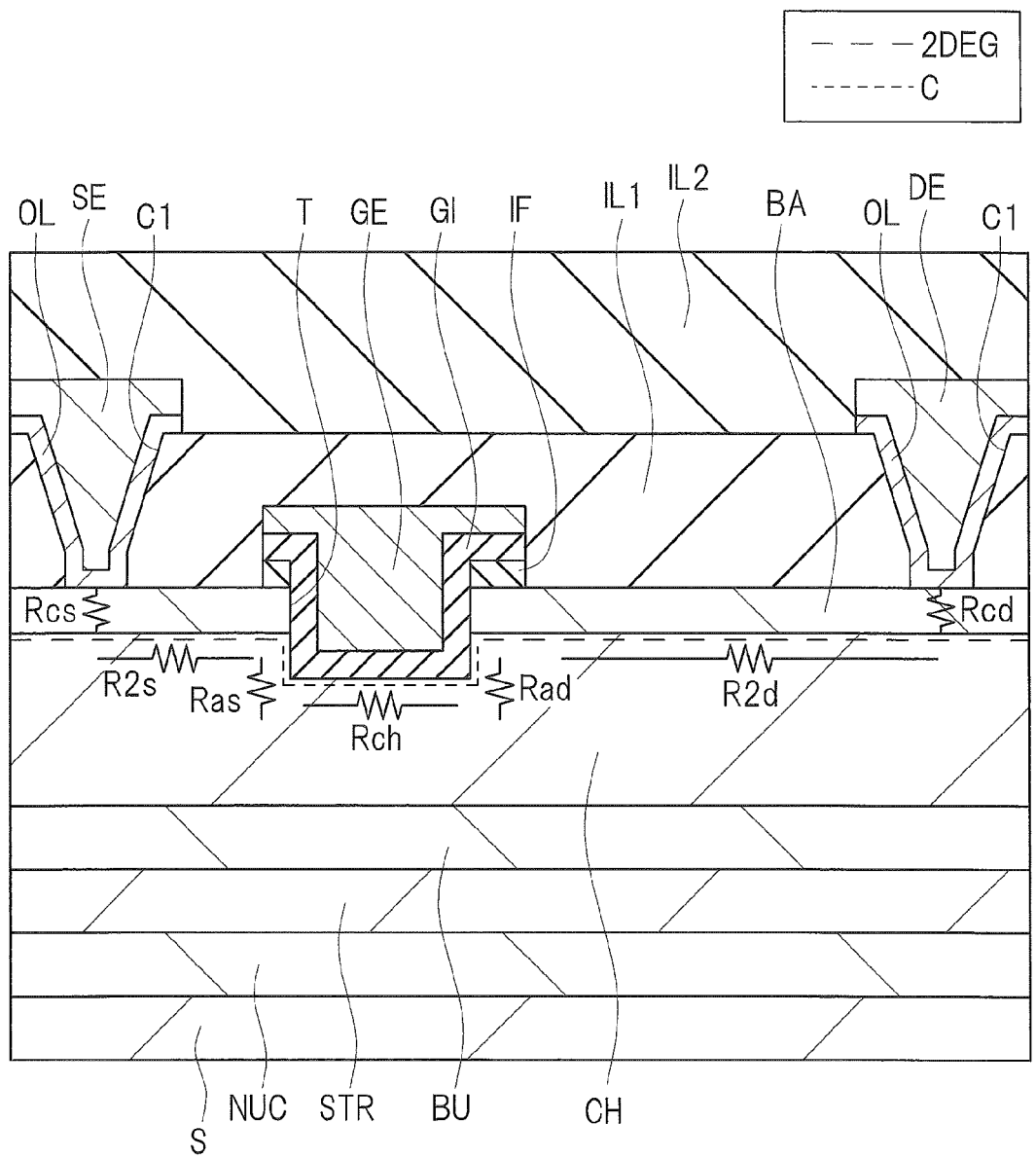
FIG. 13 is a sectional view showing a configuration of a semiconductor device of a related art 2 of the first embodiment.

FIG. 13 is a sectional view showing a configuration of a semiconductor device of a related art 2 of the present embodiment. FIG. 14 is a table showing a configuration of a buffer layer, a channel layer and a gate insulating film of the semiconductor device of the related art 2.

In the semiconductor device of the related art 2, a stacked layer portion in which a buffer layer BU, a channel layer CH and a gate insulating film GI are stacked in this order from below (also referred to as buffer layer BU/channel layer CH/gate insulating film GI) is different from that of the related art 1.

More specifically, in the related art 2 (FIG. 13), the buffer layer BU/channel layer CH/gate insulating film GI has the following configuration. As shown in FIG. 14, the buffer layer BU is an undoped (also referred to as non-doped) GaN layer having a film thickness of about 1000 nm, the channel layer CH is not the undoped GaN layer as shown in the related art 1 but a GaN layer containing n-type impurities and having a film thickness of about 30 nm. The concentration of the n-type impurities is Nd=1e17 ($1 \times 10^{17}$)/cm$^3$ (low concentration). The channel layer is represented as nmGaN in FIG. 14 (generally described as n$^-$-GaN).

The electron mobility is increased by introducing the n-type impurities into the GaN layer in this manner. For example, in the semiconductor device in which the n-type impurities have been introduced into an undoped GaN substrate, the electron mobility tends to increase in conjunction with the increase of the n-type impurity concentration (doping amount) until the n-type impurity concentration (also referred to as doping concentration) reaches 1e18 (/cm$^3$). For example, when the n-type impurity concentration increases from 1e16 to 1e17 (/cm$^3$), the electron mobility becomes double (see Non-Patent Document 2 mentioned above). Thus, if the electron mobility becomes high and the channel layer is changed to have a low resistance, channel electrons travel not only in the interface between the gate insulating film GI and the channel layer CH but also in the channel layer CH positioned on a back side. Therefore, the influence by the roughness scattering is reduced, and the channel resistance is decreased.

Figure 15:
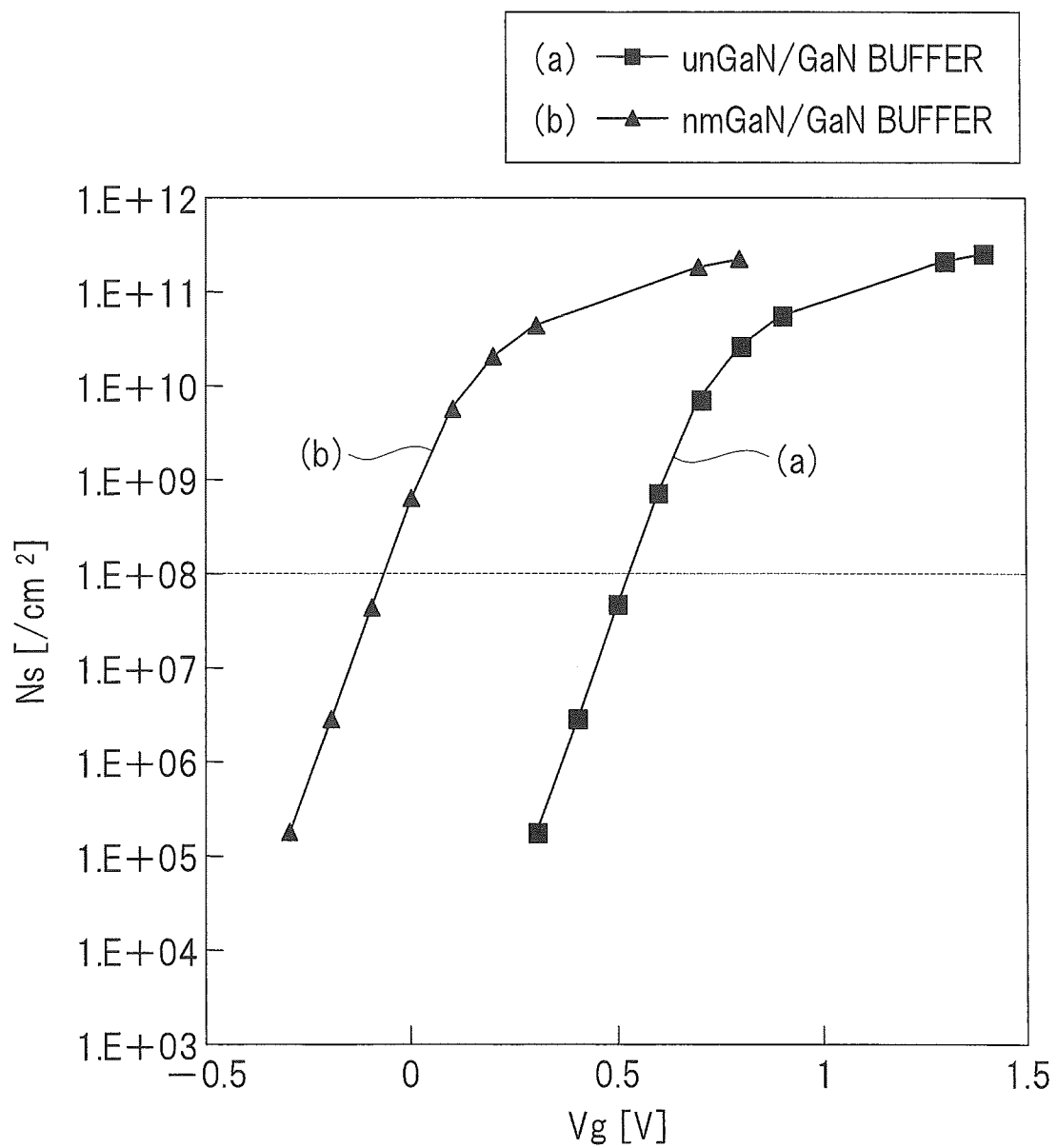
FIG. 15 is a graph showing a gate voltage (Vg) dependency of a channel-sheet charge concentration (Ns) of the semiconductor device of the related art 2.

FIG. 15 a graph showing a gate voltage (Vg) dependency of a channel-sheet charge concentration (Ns) of the semiconductor device of the relate art 2. In the graph, a vertical axis represents a channel-sheet charge concentration (Ns) [/cm$^2$] and a horizontal axis represents a gate voltage (Vg) [V]. In the graph, a curve (a) indicates the related art 1, that is, the case of the semiconductor device using a unGaN layer/unGaN layer as the buffer layer BU/channel layer CH, and a curve (b) indicates the related art 2, that is, the case of the semiconductor device using a unGaN layer/nmGaN layer as the buffer layer BU/channel layer CH.

From the comparison between the curve (a) and the curve (b), the increase of the channel-sheet charge concentration (Ns) due to introduction of the n-type impurities into the channel layer CH cannot be found. As described above, however, the electron mobility is increased.

In FIG. 15, when 1.E+08 (1×10$^8$)/cm$^2$ is adopted as a pinch-off point (broken line portion in FIG. 15) regarding the channel-sheet charge concentration (Ns), the curve (a), that is, the related art 1 has a channel-sheet charge concentration (Ns) less than the pinch-off point at the gate voltage (Vg) of 0 V and has a normally-off characteristic. On the other hand, it is understood that the curve (b), that is, the related art 2 has the channel-sheet charge concentration (Ns) equal to or more than the pinch-off point at the gate electrode (Vg) of 0 V and has a normally-on characteristic.

As described above, it has found that, although the electron mobility can be improved, the channel resistance can be reduced, and the on resistance of the semiconductor device can be reduced by introducing the n-type impurities into the channel layer CH, it is difficult to maintain the normal-off characteristic.

(Related Art 3)

The inventors of the present invention have examined a configuration of a semiconductor device of a related art 3 using an AlGaN layer as the buffer layer BU in order to maintain the normally-off characteristic of the semiconductor device (FIG. 13) of the above-described related art 2.

Figure 16:
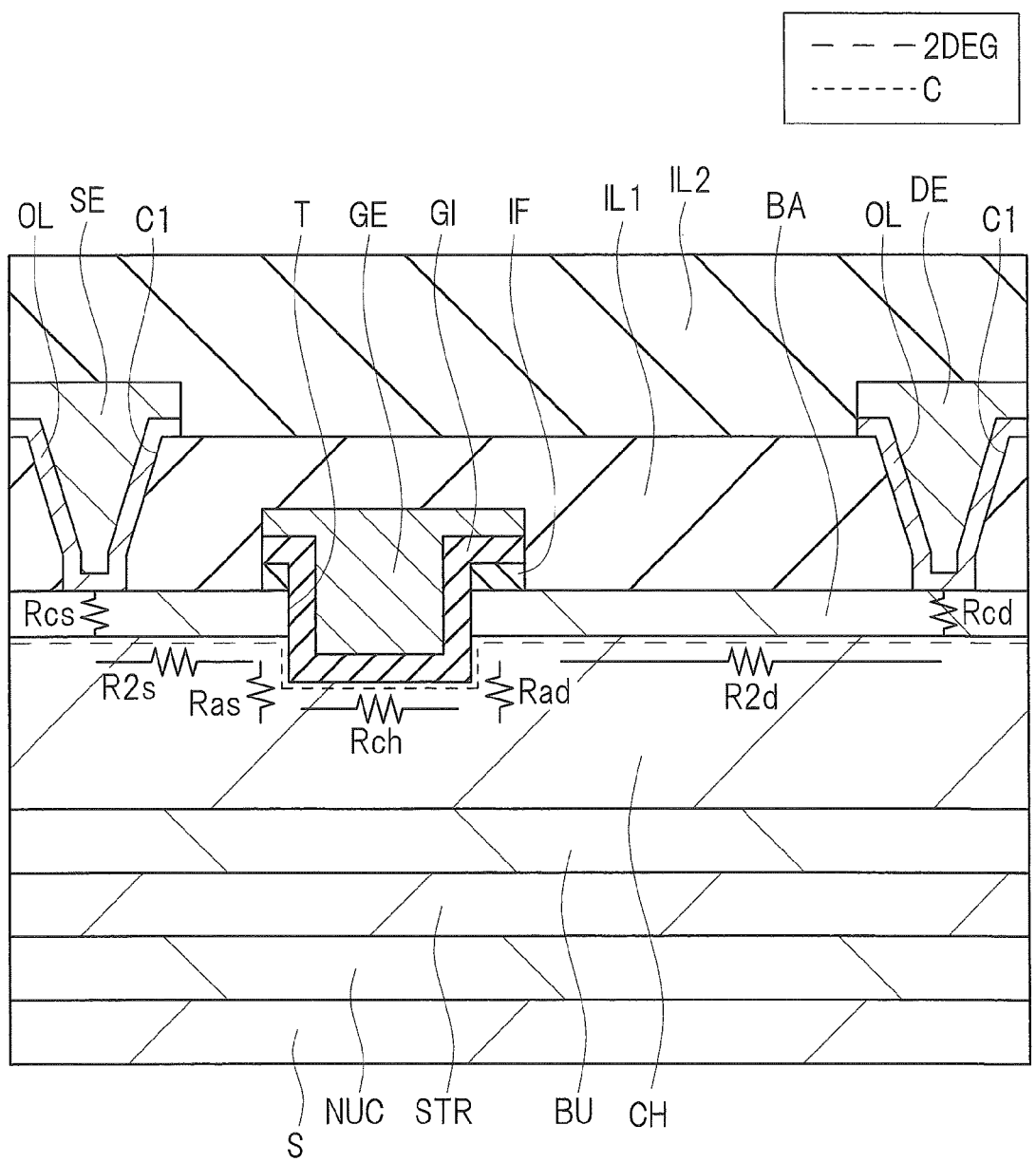
FIG. 16 is a sectional view showing a configuration of a semiconductor device of a related art 3 of the first embodiment.
Figures 17, 18:
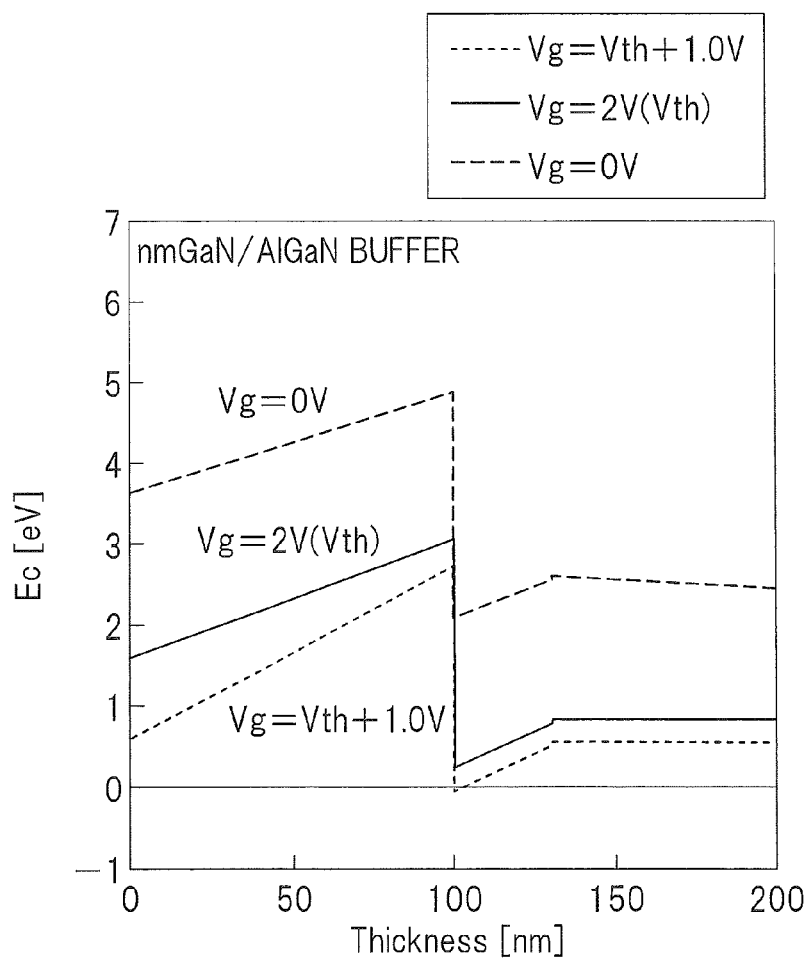
FIG. 17 is a table showing a configuration of a buffer layer, a channel layer and a gate insulating film of the semiconductor device of the related art 3.
FIG. 18 is a graph showing a bias dependency of a conduction band potential of a portion below a surface of a gate insulating film in a gate electrode portion of the semiconductor device of the related art 3.

FIG. 16 is a sectional view showing a configuration of the semiconductor device of the related art 3 of the present embodiment. FIG. 17 is a table showing a configuration of a buffer layer, a channel layer and a gate insulating film of the semiconductor device of the related art 3.

In the semiconductor device of the related art 3, a stacked layer portion in which a buffer layer BU, a channel layer CH and a gate insulating film GI are stacked in this order from below (also referred to as buffer layer BU/channel layer CH/gate insulating film GI) is different from that of the related art 2.

More specifically, in the related art 3 (FIG. 16), the buffer layer BU/channel layer CH/gate insulating film GI has the following configuration. As shown in FIG. 17, the buffer layer BU is not the undoped GaN layer as shown in the related art 2 but an undoped AlGaN layer (also referred to as unAlGaN layer) having a film thickness of about 1000 nm, and the channel layer CH is a GaN layer containing n-type impurities and having a film thickness of about 30 nm. Here, the composition of the AlGaN layer is Al$_{0.02}$Ga$_{0.98}$N. Therefore, in FIG. 17, the buffer layer is represented as unAl$_{0.02}$Ga$_{0.98}$N. Further, the concentration of the n-type impurities in the channel layer CH is about Nd=1e17 (1×10$^{17}$)/cm$^3$ (low concentration) (described as nmGaN in FIG. 17).

FIG. 18 is a graph showing a bias dependency of a conduction band potential of a portion below a surface of a gate insulating film in a gate electrode portion of the semiconductor device of the related art 3. In FIG. 18, a vertical axis represents energy (Ec) [eV] of the conduction band and a horizontal axis represents a depth (also referred to as thickness) [nm] from the surface of the gate insulating film in the gate electrode portion. A point of the thickness of 100 nm corresponds to a boundary portion between the gate insulating film GI and the channel layer CH. The depth dependency of energy (Ec) of the conduction band below the gate insulating film has been examined for the respective cases where the gate voltage (Vg, bias) is set at 0 V, 2 V (threshold potential Vth), and Vth+1.0 V.

A power device of a normally-off characteristic used for power control is assumed as the semiconductor device used here. Therefore, a value of 1.E+0.8 (1×10$^8$)/cm$^2$ which is lower than that for a communication device is defined as the pinch-off point regarding the sheet charge concentration (Ns) of channel-carrier. As a result, the gate voltage (threshold potential Vth) for the switching between on and off becomes a gate voltage where the energy (Ec) of the conduction band is not 0 eV but reaches several kT (here, k: Boltzmann constant and T: absolute temperature). In other words, the threshold potential Vth is defined as a minimum gate voltage required to lower the level of the conduction band of the channel to the range within a normal-temperature thermal excitation level (several kT) from Fermi energy level (0 V).

According to FIG. 18, when the gate voltage is 0 V, the energy (Ec) of the conduction band of the channel portion at the point of the thickness of 100 nm exceeds 1 eV, and the normally-off characteristic can be realized. On the other hand, when the gate potential is 2 V (threshold potential Vth based on Ns), the energy (Ec) of the conduction band at the point of the thickness of 100 nm is in the range within a normal-temperature thermal excitation level (several kT) from the Fermi energy level (0V), which shows that this gate voltage is the threshold Vth.

As described above, the normally-off characteristic (Vth>0 V) is realized by such an effect that negative polarization charge induced at an interface between the buffer layer BU made of AlGaN and the channel layer CH made of GaN raises a conduction band lower end potential. As described above, it has found that, by changing the buffer layer BU from the unGaN layer (related art 2) to the unAlGaN layer (related art 3), change from the normally-on to the normally-off can be achieved.

Figures 19, 20:
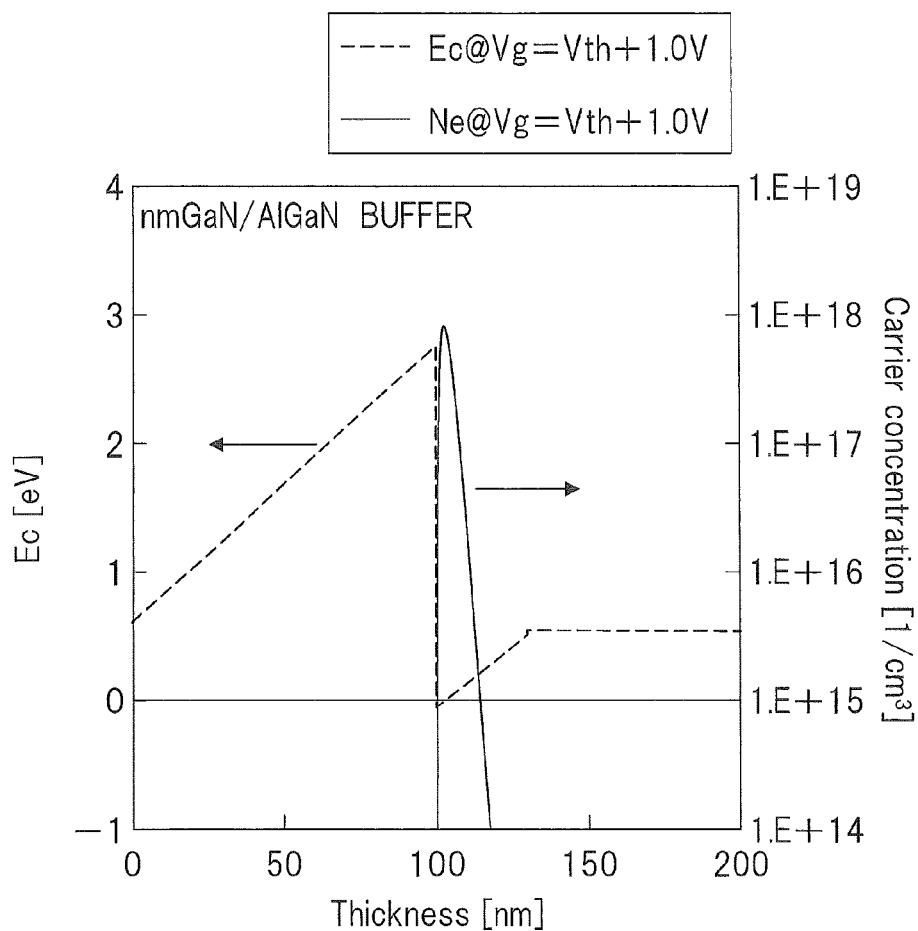
FIG. 19 is a graph showing a carrier concentration of a portion below a surface of a gate insulating film in the gate electrode portion of the semiconductor device of the related art 3.
FIG. 20 is a table showing an example of a configuration of a buffer layer, a channel layer and a gate insulating film of the semiconductor device of the first embodiment.

FIG. 19 is a graph showing a carrier concentration of a portion below the surface of the gate insulating film in the gate electrode portion of the semiconductor device of the related art 3. In the graph, a horizontal axis represents a depth from the surface of the gate insulating film. Here, the carrier concentration when the gate voltage (Vg) shown in FIG. 18 is set at Vth+1.0 V has been examined. In FIG. 19, a vertical axis (left scale) represents the energy (Ec) [eV] of the conduction band and a vertical axis (right scale) represents the carrier concentration [1/cm$^3$], and a horizontal axis represents the thickness (also referred to as depth) [nm] below the surface of the gate insulating film in the gate electrode portion. The point of the thickness of 100 nm corresponds to the boundary portion between the gate insulating film GI and the channel layer CH.

As shown in FIG. 19, it is understood that carriers (here, electrons) are distributed not only at the interface of MIS, that is, the boundary portion between the gate insulating film GI and the channel layer CH (point of the thickness of 100 nm) but also in a region from the thickness of about 100 nm to the thickness of about 120 nm. As described above, by changing the channel layer CH to the GaN layer containing the n-type impurities (nGaN layer), the fact that the electron mobility in the channel is increased and the channel resistance is reduced by introducing the n-type impurities into the GaN layer even in the case other than the case of the bulk described in Non-Patent Document 2 can be confirmed.

(Description of First Embodiment)
[Description of Structure]

FIG. 1 is a sectional view showing a configuration of a semiconductor device of the present embodiment. The semiconductor device shown in FIG. 1 is a MIS (Metal Insulator Semiconductor) type field effect transistor (FET) using nitride semiconductor. The semiconductor device is also referred to as high electron mobility transistor (HEMT) or power transistor. The semiconductor device of the present embodiment is a so-called recess gate type semiconductor device.

In the semiconductor device of the present embodiment, a nucleation layer NUC, a strain relaxing layer STR, a buffer layer BU, a channel layer (also referred to as electron transit layer) CH, and a barrier layer BA are sequentially formed on a substrate S. A gate electrode GE is formed, via a gate insulating film GI, inside a trench T dug so as to penetrate through an insulating film IF and the barrier layer BA to reach the middle of a main channel layer CHa. A source electrode SE and a drain electrode DE are formed on the barrier layer BA on both sides of the gate electrode GE. As resistances of the semiconductor device, there are the sheet resistance R2s between source and gate, the source resistance Rcs, the sheet resistance R2d between drain and gate, and the drain resistance Rcd as described in the paragraph of the related art 1. Further, there are the channel resistance Rch generated along a bottom surface of the trench T having the gate electrode GE formed therein, the channel resistance Ras generated along a side surface of the trench T on the source electrode SE side, and the channel resistance Rad generated along a side surface of the trench T on the drain electrode DE side.

As shown in FIG. 1, in the semiconductor device of the present embodiment, the nucleation layer NUC is formed on the substrate S and the strain relaxing layer STR is formed on the nucleation layer NUC. The nucleation layer NUC is formed in order to produce crystal nuclei for the growth of a layer to be formed above such as the strain relaxing layer STR. Further, the nucleation layer NUC is formed in order to prevent the substrate S from converting due to diffusion of constituent elements (for example, Ga or the like) in the layer to be formed above into the substrate S. Further, the strain relaxing layer STR is formed in order to relax stress to the substrate S, thereby suppressing occurrence of warp of the substrate S or a crack therein.

The buffer layer BU is formed on the strain relaxing layer STR, the channel layer (also referred to as electron transit layer) CH made of nitride semiconductor is formed on the buffer layer BU, and the barrier layer BA made of nitride semiconductor is formed on the channel layer CH. More specifically, the buffer layer BU, the channel layer CH, and the barrier layer BA are sequentially formed (stacked) on a main surface (upper surface) of the strain relaxing layer STR in this order from below. The source electrode SE and the drain electrode DE are formed on the barrier layer BA via ohmic layers OL, respectively. The buffer layer BU is an intermediate layer positioned between the channel layer CH and the strain relaxing layer STR. Here, the channel layer CH has a stacked structure composed of a main channel layer CHa and a channel lower layer CHb positioned below the main channel layer CHa.

The gate electrode GE is formed, via the gate insulating GI, inside a trench (also referred to as recess) T dug so as to penetrate through the insulating film IF and the barrier layer BA to reach the middle of the main channel layer CHa. The source electrode SE and the drain electrode DE are formed on the barrier layer BA on both sides of the gate electrode GE.

The source electrode SE and the drain electrode DE are formed so as to be connected to the barrier layer BA via openings of the insulating layer IL1, respectively. Since this connection is made via the ohmic layer OL as described above, the ohmic connection is formed.

Here, both of the main channel layer CHa positioned on the barrier layer BA side and the channel lower layer CHb positioned on the buffer layer BU side contain n-type impurities, and the impurity concentration of the channel lower layer CHb is set to be higher than the impurity concentration of the main channel layer CHa. As the n-type impurities, silicon (Si) can be used.

The buffer layer BU is composed of, for example, an AlGaN layer. The main channel layer CHa is composed of, for example, a GaN layer containing low-concentration n-type impurities and the channel lower layer CHb is composed of, for example, a GaN layer containing intermediate concentration n-type impurities. Thus, the channel layer CH has an nm/n structure (referred to as n$^-$/n structure). Further, the barrier layer BA is composed of, for example, an AlGaN layer.

By setting the impurity concentration of the channel lower layer CHb to be higher than the impurity concentration of the main channel layer CHa in this manner, characteristics of the semiconductor device can be improved. Details thereof will be described later.

An insulating layer IL1 is formed on the gate electrode GE. Further, the source electrode SE and the drain electrode DE are formed in contact holes formed in the insulating layer IL1 and on the contact holes. An insulating layer IL2 is formed on the insulating layer IL1, the source electrode SE and the drain electrode DE. Note that, though not illustrated in FIG. 1, element isolation regions may be formed in the barrier layer BA and the main channel layer CHa outside the source electrode SE and the drain electrode DE. The element isolation region is composed of an insulating film embedded in a trench dug so as to penetrate through the barrier layer BA to reach the middle of the main channel layer CHa.

Two dimensional electron gas 2DEG is produced on the channel layer side in the vicinity of the interface between the channel layer CH and the barrier layer BA. Further, when a positive potential (threshold potential) is applied to the gate electrode GE, a channel C is formed in the vicinity of the interface between the gate electrode GE and the channel layer CH.

The above-described two dimensional electron gas 2DEG is formed by the following mechanism. The nitride semiconductors (here, gallium nitride-based semiconductor) constituting the channel layer CH and the barrier layer BA are different in forbidden band width (band gap) and electron affinity from each other. Therefore, well-type potential is generated in a junction surface between these semiconductors. Electrons are accumulated in the well-type potential, so that two dimensional electron gas 2DEG is generated in the vicinity of the interface between the channel layer CH and the barrier layer BA.

Here, the two dimensional electron gas 2DEG formed in the vicinity of the interface between the channel layer CH and the barrier layer BA is split by the trench T having the gate electrode GE formed therein. Therefore, in the semiconductor device of the present embodiment, an off state can be maintained in a state where a positive potential (threshold potential) is not applied to the gate electrode GE, and an on state can be maintained in a state where a positive potential (threshold potential) is applied to the gate electrode GE. Thus, the normally-off operation can be performed.

Further, in the semiconductor device of the present embodiment, the two dimensional electron gas 2DEG serves as a current conduction path outside the gate electrode GE (namely, in the source region and the drain region), and the channel C of the MISFET serves as a current conduction path in the vicinity of the gate electrode GE. Further, since only electrons can be used as the carriers, a high electron saturation rate can be utilized. Furthermore, since there is no restriction of hole annihilation time, a turn-off time of the semiconductor device can be shortened, so that a high-speed switch can be realized.

Furthermore, in the semiconductor device of the present embodiment, since the channel layer CH is formed to have the stacked structure of the main channel CHa containing n-type impurities and the channel lower layer CHb positioned below the main channel layer CHa and containing n-type impurities at the concentration higher than the impurity concentration of the main channel layer CHa (also referred to as nm/n structure or n−/n structure), the mobility of carries in the channel C can be improved. Further, the channel resistances (Rch, Ras, Rad and the like) can be reduced and the on resistance of the semiconductor device can be reduced. Moreover, the withstand voltage can be improved as compared with a case where the entire channel layer CH is composed of a layer containing intermediate concentration n-type impurities.

[Description of Manufacturing Method]

Next, a manufacturing method of the semiconductor device of the present embodiment will be described with reference to FIG. 2 to FIG. 10, and the configuration of the semiconductor device will be further clarified. FIG. 2 to FIG. 10 are sectional views showing a manufacturing process of the semiconductor device of the present embodiment.

Figure 2:
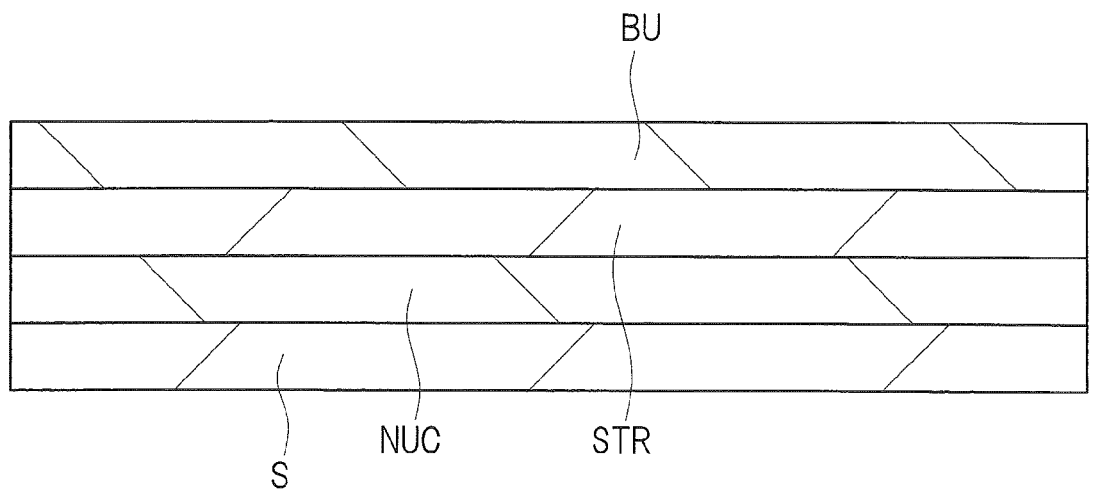
FIG. 2 is a sectional view showing a manufacturing process of the semiconductor device of the first embodiment.

As shown in FIG. 2, a nucleation layer NUC, a strain relaxing layer STR, and a buffer layer BU are sequentially formed on a substrate S. As the substrate S, for example, a semiconductor substrate made of silicon (Si) whose (111) surface is exposed is used, and for example, an aluminum nitride (AlN) layer is hetero-epitaxially grown as the nucleation layer NUC on the semiconductor substrate S by using metal organic chemical vapor deposition (MOCVD) method or the like. Next, a superlattice structure obtained by repeatedly stacking stacked films (AlN/GaN film) of a gallium nitride (GaN) layer and an aluminum nitride (AlN) layer is formed as the strain relaxing layer STR on the nucleation layer NUC. For example, the gallium nitride (GaN) layer and the aluminum nitride (AlN) layer each having a film thickness of about 2 to 3 nm are repeatedly hetero-epitaxially grown so that the numbers of layers reach about 100 (total of 200 layers) by using the MOCVD method or the like. Note that, as the substrate S, a substrate made of SiC, sapphire or the like may be used instead of the above-described silicon.

Next, a buffer layer BU is formed on the strain relaxing layer STR. For example, an $Al_xGa_{1-x}N$ layer (x: Al composition ratio) is hetero-epitaxially grown on the strain relaxing layer STR as the buffer layer BU by using the MOCVD method or the like. Note that, regarding the Al composition ratio x and Ga, for example, it is possible to properly adjust the Al composition ratio x in a range of more than 0 to 1.0 or less, but sufficient enhancement characteristic can be obtained at several percents in general. In more detail, in order to obtain the normally-off characteristic, when the n dope-sheet charge concentration of the MIS channel is set to Ns (@MIS) (>0), it is necessary to establish the relationship shown in the following Expression (1).

$$Ns\,(@MIS) < 5.25E13 \times x\,[cm^{-2}] \quad (1)$$

Figure 3:
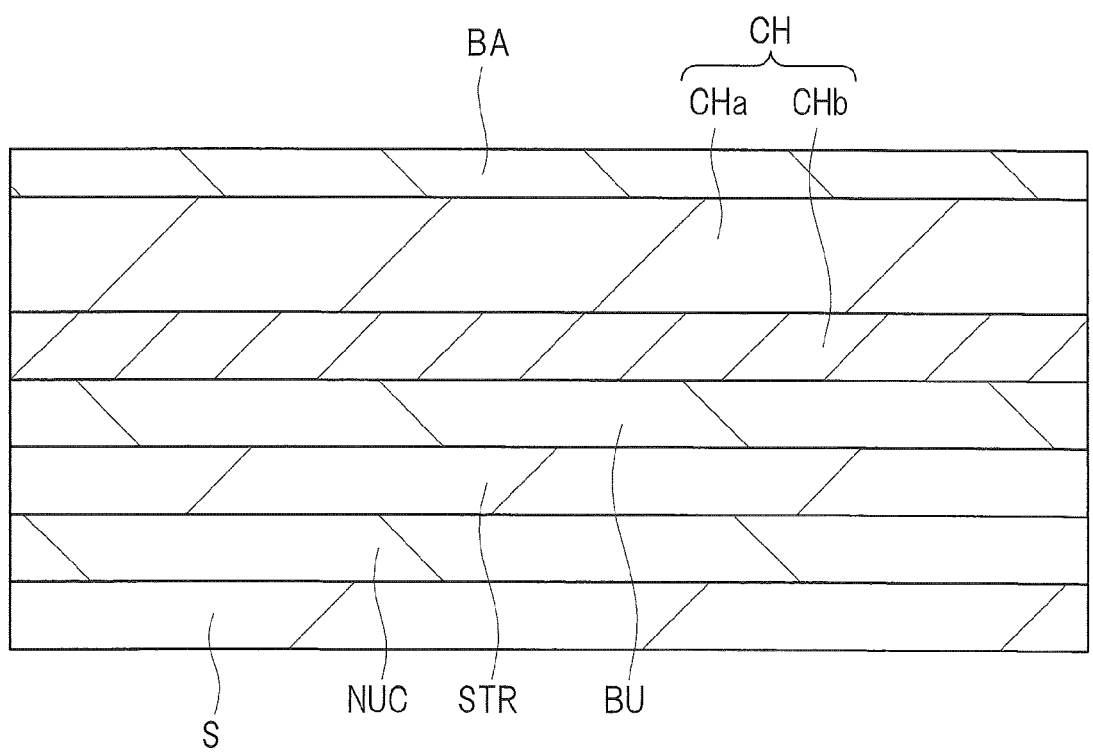
FIG. 3 is a sectional view showing the manufacturing process of the semiconductor device of the first embodiment continued from FIG. 2.

Next, as shown in FIG. 3, a channel layer CH composed of a main channel layer CHa and a channel lower layer CHb is formed on the buffer layer BU. First, as the channel lower layer CHb, for example, a gallium nitride layer (nGaN) doped with n-type impurities is hetero-epitaxially grown on the buffer layer BU by the MOCVD method or the like. For example, a gallium nitride layer (nGaN) doped with n-type impurities is hetero-epitaxially grown in an atmosphere in which n-type impurity gas is mixed in material gas of gallium nitride. As the n-type impurity gas, silane ($SiH_4$) can be used. Next, as the main channel layer CHa, for example, a gallium nitride layer (nmGaN) doped with low-concentration n-type impurities is hetero-epitaxially grown by using the MOCVD method or the like. For example, a gallium nitride layer (nGaN) doped with n-type impurities is hetero-epitaxially grown in an atmosphere in which n-type impurity gas is mixed in material gas of gallium nitride. At this time, by lowering the mixture amount of the n-type impurity gas, gallium nitride layers (nGaN and nmGaN) different in doping amount of the n-type impurities can be formed. The channel layer CH composed of a stacked body of the channel lower layer CHb and the main channel layer CHa which contain n-type impurities can be formed in this manner. The impurity concentration in the channel lower layer CHb is higher than the impurity concentration of the main channel layer CHa. In other words, in the channel layer CH, n-type impurities are introduced at a higher concentration on the buffer layer BU side than on the barrier layer BA side.

As described above, in this specification, the low concentration (for example, concentration represented as nm (n minus)) indicates a concentration in a range of $1e17\,(1\times10^{17})/cm^3$ or more to less than $1e18\,(1\times10^{18})/cm^3$. Further, the intermediate concentration (for example, concentration represented as n) indicates a concentration in a range of $1e18\,(1\times10^{18})/cm^3$ or more to less than $1e19\,(1\times10^{19})/cm^3$. Furthermore, the high concentration indicates a concentration of $1e19\,(1\times10^{19})/cm^3$ or more. Even in the undoped case (for example, concentration represented as un), impurities of $1e16\,(1\times10^{18})/cm^3$ or less are contained as an equivalent impurity concentration in consideration of natural conversion to n.

The film thickness of the channel layer CH (here, the stacked film composed of the main channel layer CHa and the channel lower layer CHb) is preferably 3 nm or more, more preferably 5 nm or more. This is because when the channel layer CH is excessively thin, sub-bands in the channel layer CH become discrete, which may result in increase in channel resistance. Also, this is because an etching margin becomes small in an etching process to be described later performed when the trench T is formed, so that controllability to the depth of the trench T is deteriorated. Also, when the total film thickness of the channel layer CH is excessively large, holes are generated at an interface between the channel layer and the buffer layer, and the holes compensate the negative polarization charges at the interface. Therefore, if a design to avoid the compensation effect is adopted, it is preferred that the total film thickness of the channel layer CH is 100 nm or less. Suppression of the polarization charge compensation effect will be described below in detail (CGS system).

A rough relationship established between the Al composition ratio x of the AlGaN buffer layer and the thickness d of the GaN layer in order to prevent the above-described compensation for polarization charges when the semiconductor device is in the on state will be described. If the compensation effect at the time of gate bias Vg=Vth is suppressed, the compensation effect at least at the on time can be suppressed.

It is assumed for simplification that the GaN channel layer is approximated by triangular potential. When a surface density of polarization charges generated at the interface between the GaN channel layer and the AlGaN buffer layer is represented as $\sigma_P$, the dielectric constant of vacuum is represented as $\epsilon_o$, the dielectric constant of GaN is represented as K, and the elementary charge is represented as q, the field intensity F sensed by electrons in the channel from the polarization charges ($\sigma_P$) of the buffer layer is represented by the following Expression (2).

$$F = q\sigma_P/\epsilon_o K \qquad (2)$$

On the other hand, in the case where the film thickness of the GaN channel layer is increased while fixing the composition of the buffer layer, when the maximum thickness of the channel layer where holes are not generated at the interface of the buffer layer is represented as d and the band gap of GaN is represented as Eg, the relationship of the following Expression (3) must be roughly established with the thermal excitation level of 3kT (k: Boltzmann constant, T: absolute temperature).

$$F \cdot d + 3kT \sim F \cdot d < Eg \qquad (3)$$

Here, the surface density $\sigma_P$ of the polarization charges in the AlGaN layer is represented by the following Expression (4) using the Al composition ratio x.

$$\sigma_P = 5.25E13 \times x \qquad (4)$$

Therefore, from the above Expression (2) to the Expression (4), the relationship of the following Expression (5) is derived.

$$d < \frac{\epsilon_o K E_g}{5.25 \times 10^{13} \times q} \cdot \frac{1}{x} \qquad (5)$$

More specifically, it is understood that the maximum value d of the film thickness of the GaN channel layer for suppressing the polarization charge compensation effect is inversely proportional to the Al composition ratio x of the AlGaN buffer layer. As a specific value, for example, when the Al composition ratio x of the AlGaN buffer layer is 6%, the maximum value d of the film thickness of the GaN channel layer is about 50 nm.

Next, for example, an $Al_yGa_{1-y}N$ layer (y: Al composition) is hetero-epitaxially grown as the barrier layer BA on the channel layer CH by using the MOCVD method or the like. Note that, regarding the composition ratio of Al and Ga, it is possible to properly adjust the Al composition ratio y in a range of more than 0 to 1.0 or less. Further, it is preferred that the film is formed while adjusting the Al composition ratio y within a range of 0.15 or more to 0.35 or less. By setting the Al composition ratio y to be equal to or less than 0.35, a film excellent in crystallinity can be formed even in the case where the film is formed by the MOCVD method. Further, by setting the Al composition ratio y to 0.15 or more, the reduction in resistance of the hetero-junction channel of the $Al_yGa_{1-y}N$ barrier layer and the GaN channel layer can be achieved.

However, the Al composition ratio y in the $Al_yGa_{1-y}N$ layer of the barrier layer BA must be made higher than the Al composition ratio x in the $Al_xGa_{1-x}N$ layer of the above-described buffer layer BU. By making the Al composition ratio y in the barrier layer BA higher than the Al composition ratio x in the buffer layer BU, when the gate voltage Vg is 0 V, the two dimensional electron gas 2DEG is produced on the channel layer side in the vicinity of the interface between the channel layer CH and the barrier layer BA in the region other than the gate electrode portion. In other words, the normally-on state is achieved in this region. In more detail, when the carrier-sheet charge amount by n dope of the channel layer of the channel portion composed of the 2DEG in the region other than the gate electrode portion is represented as Ns (@2DEG) (>0), the relationship shown in the following Expression (6) needs to be established.

$$5.25E13 \times (y-x) + Ns(@2DEG) > 0 \ [cm^{-2}] \qquad (6)$$

The stacked body composed of the buffer layer BU, the channel layer CH and the barrier layer BA is formed in this manner. The stacked body is formed by the above-described hetero-epitaxial growth, that is, a group-III plane growth stacking in the [0001] crystal axis (C axis) direction. In other words, the above-described stacked body is formed by (0001) Ga plane growth. In this stacked body, the two dimensional electron gas 2DEG is produced in the vicinity of the interface between the channel layer CH and the barrier layer BA.

Figure 4:
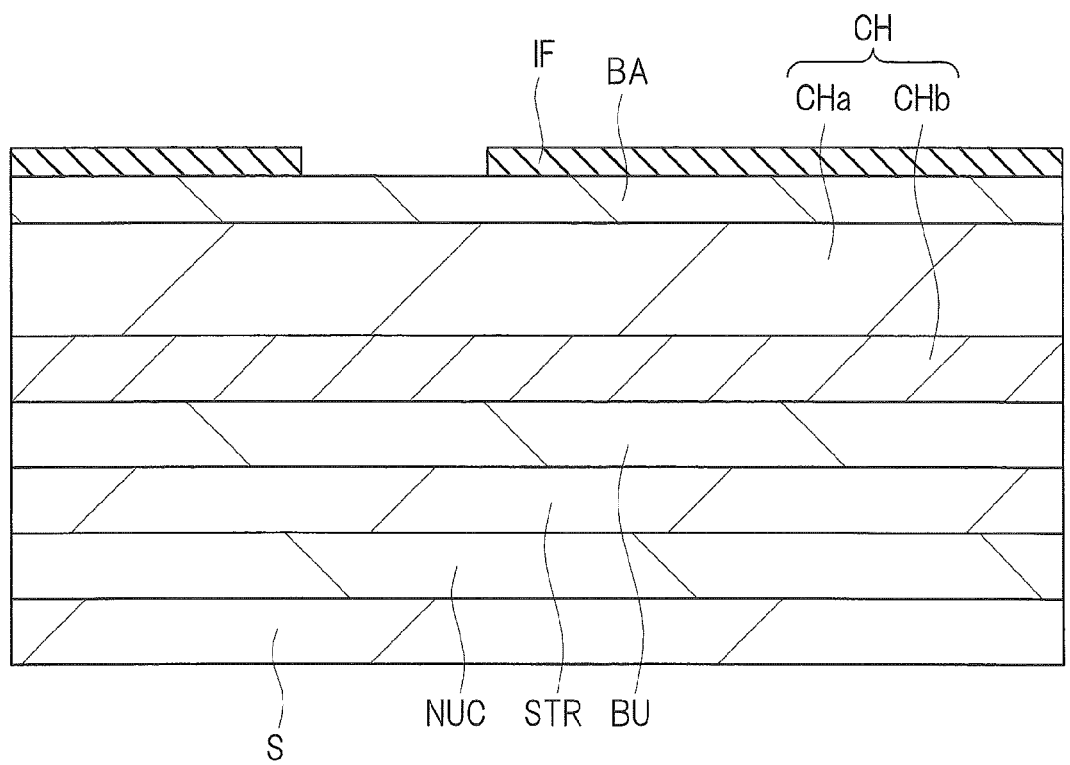
FIG. 4 is a sectional view showing the manufacturing process of the semiconductor device of the first embodiment continued from FIG. 3.
Figure 5:
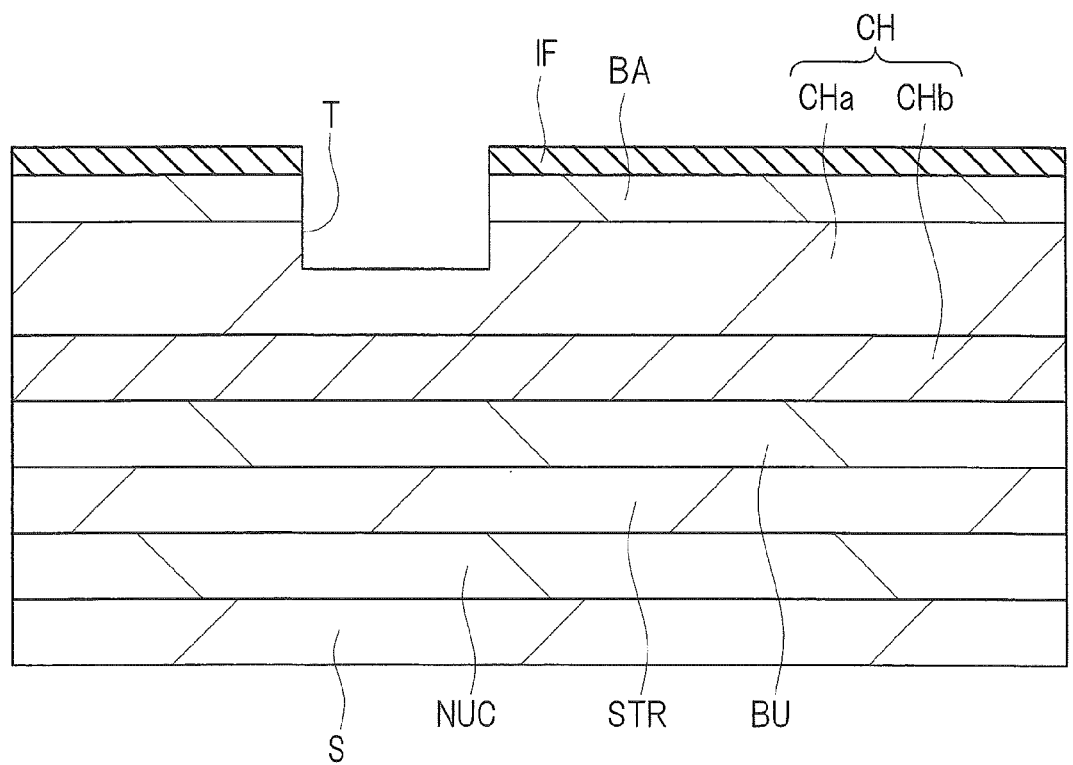
FIG. 5 is a sectional view showing the manufacturing process of the semiconductor device of the first embodiment continued from FIG. 4.

Next, as shown in FIG. 4, an insulating film IF having an opening is formed on the barrier layer BA. For example, a silicon nitride film is deposited as the insulating film IF on the barrier layer BA by using thermal CVD (Chemical Vapor Deposition) method or the like. Next, an opening is formed in the insulating film IF by using photolithography technique and etching technique. Next, as shown in FIG. 5, a trench T penetrating through the insulating film IF and the barrier layer BA to reach the middle of the main channel layer CHa is formed by etching the barrier layer BA and the channel layer CH with using the insulating film IF as a mask. As etching gas, for example, chlorine-based gas is used. After the etching, thermal treatment (annealing) may be performed for the recovery from etching damage.

Figure 6:
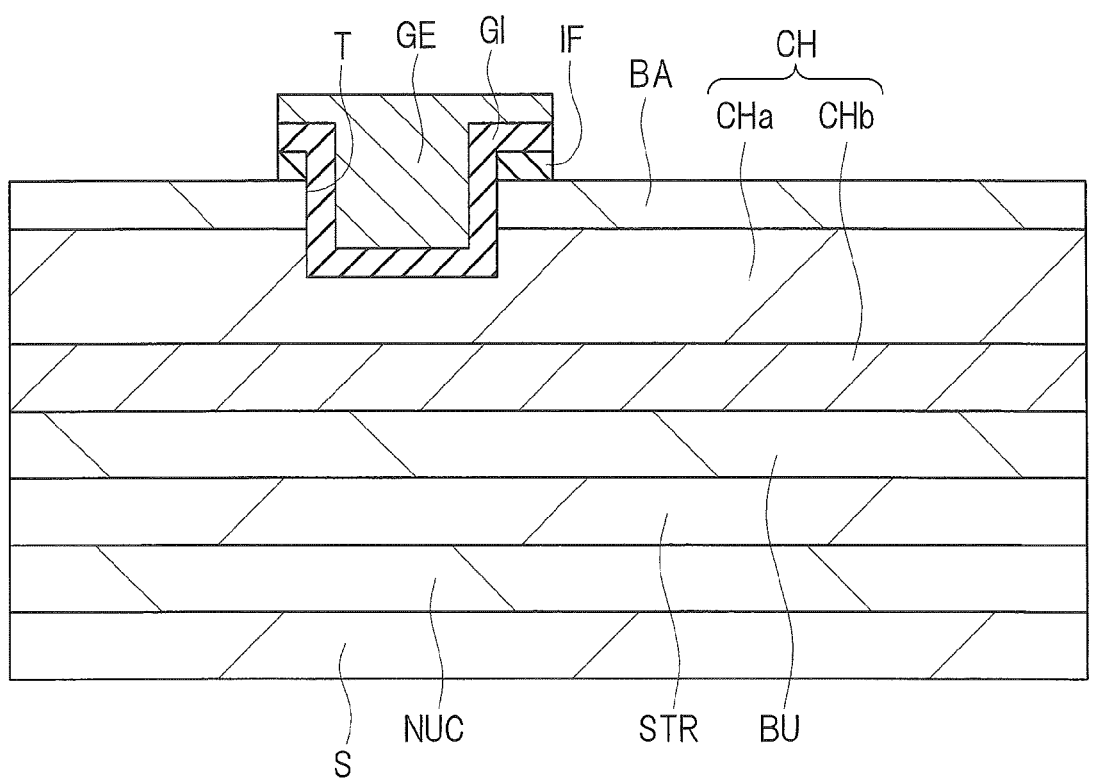
FIG. 6 is a sectional view showing the manufacturing process of the semiconductor device of the first embodiment continued from FIG. 5.

Next, as shown in FIG. 6, a gate insulating film GI is formed on the insulating film IF including inside of the trench T. For example, alumina (aluminum oxide film, $Al_2O_3$) is deposited as the gate insulating film GI on the insulating film IF including inside of the trench T by using ALD (atomic layer deposition) method or the like. As the gate insulating film GI, a silicon oxide film or a high dielectric constant film having dielectric constant higher than that of a silicon oxide film may be used instead of the alumina. As the high dielectric constant film, a hafnium oxide film ($HfO_2$ film) may be used. Further, as the high dielectric constant film, other hafnium-based insulating film such as a hafnium aluminate film, an HfON film (hafnium oxynitride film), an HfSiO film (hafnium silicate film), an HfSiON film (hafnium silicon oxynitride film), and an HfAlO film can be used.

Next, a gate electrode GE is formed on the gate insulating film GI inside the trench T. For example, a stacked film composed of a nickel (Ni) film and a gold (Au) film positioned thereon (also referred to as Au/Ni film) is deposited as a conductive film by using sputtering method or the like on the gate insulating film GI so as to have a film thickness capable of filling the inside of the trench T. Next, by patterning the Au/Ni film by using photolithography technique and etching technique, the gate electrode GE is formed. Note that, when the Au/Ni film is etched, the gate insulating film GI and the insulating film IF below the Au/Ni film may be etched. Further, as the formation material of the gate electrode GE, a metal film other than the Au/Ni film may be used, and a polycrystalline silicon film containing impurities or the like may be used.

Figure 7:
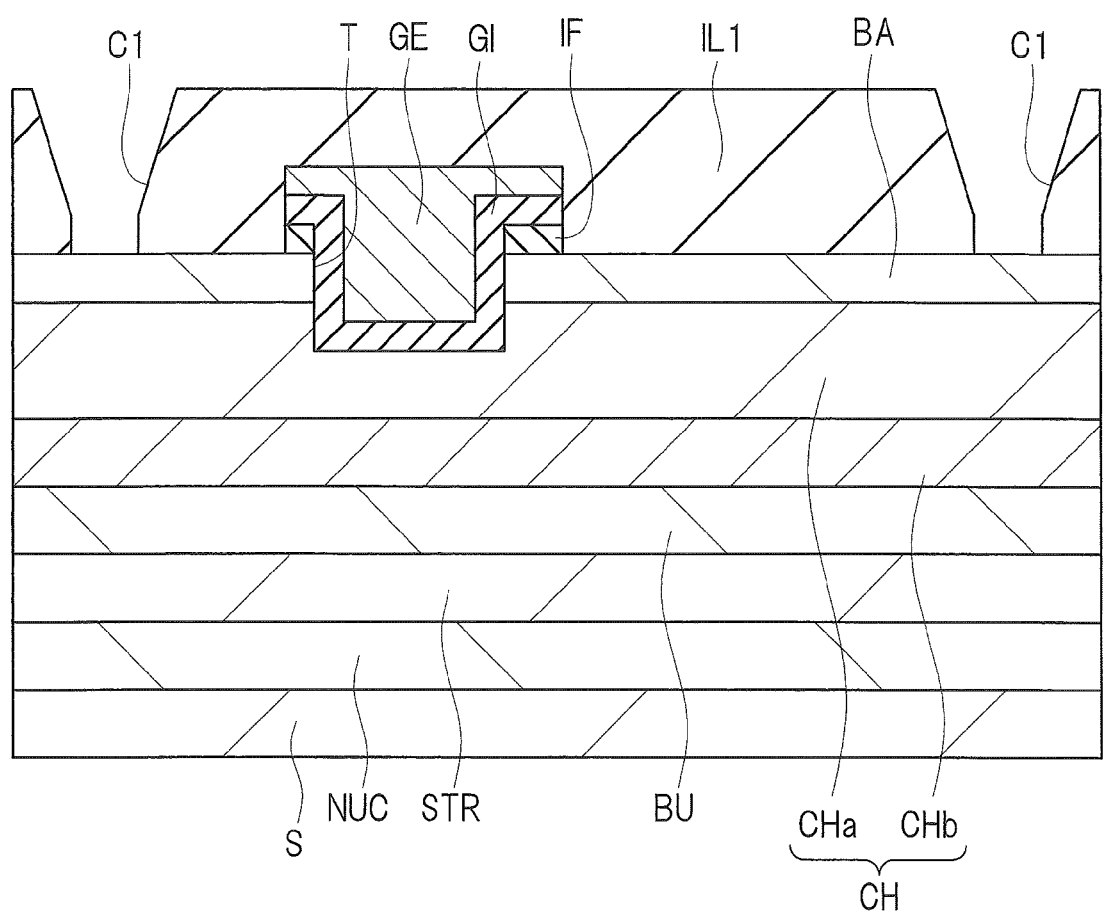
FIG. 7 is a sectional view showing the manufacturing process of the semiconductor device of the first embodiment continued from FIG. 6.

Next, as shown in FIG. 7, an insulating layer IL1 is formed on the gate electrode GE. For example, a silicon oxide film is formed as the insulating layer IL1 on the gate electrode GE and the barrier layer BA. Thereafter, contact holes C1 are formed in the insulating layer IL1 by using photolithography technique and etching technique. The contact holes C1 are disposed on the barrier layer BA on both sides of the gate electrode GE.

Figure 8:
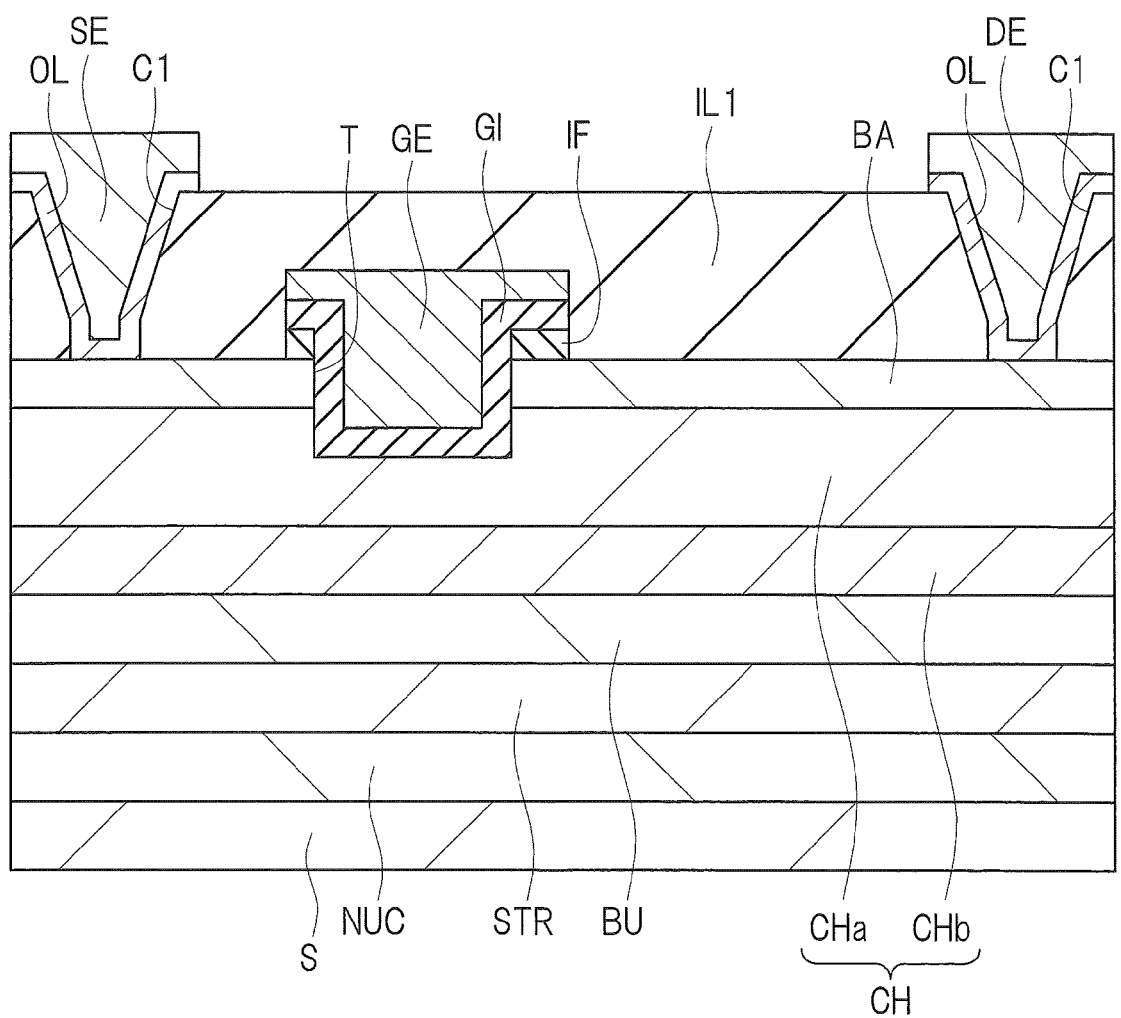
FIG. 8 is a sectional view showing the manufacturing process of the semiconductor device of the first embodiment continued from FIG. 7.

Next, as shown in FIG. 8, an ohmic layer OL is formed on the insulating layer IL1 including insides of the contact holes C1. For example, a stacked film composed of a titanium (Ti) film and an aluminum (Al) film positioned thereon (also referred to as Al/Ti film) is deposited on the insulating layer IL1 including insides of the contact holes C1 by using vapor-deposition method or the like. Further, for example, a stacked film composed of a titanium (Ti) film and a titanium nitride (TiN) film positioned thereon (also referred to as TiN/Ti film) is deposited on the Al/Ni film by using sputtering method or the like. In this manner, the stacked film composed of the titanium (Ti) film, the aluminum (Al) film, the titanium (Ti) film, and the titanium nitride (TiN) film (also referred to as TiN/Ti/Al/Ti film) is formed, and thermal treatment is then performed at, for example, a temperature of 550° C. for about 30 minutes. The ohmic contact is provided by this heat treatment as the contact between the TiN/Ti/Al/Ti film and the GaN-based semiconductor interface. Next, an aluminum alloy film is deposited on the TiN/Ti/Al/Ti film (ohmic layer OL) by using sputtering method or the like. As the aluminum alloy, for example, an alloy of Al and Si (Al—Si), an alloy of Al and Cu (copper) (Al—Cu), an alloy of Al, Si and Cu (Al—Si—Cu) or the like can be used. Next, by patterning the TiN/Ti/Al/Ti film and the aluminum alloy by using photolithography technique and etching technique, a source electrode SE and a drain electrode DE are formed in the contact holes C1 via the ohmic layers OL.

Figure 9:
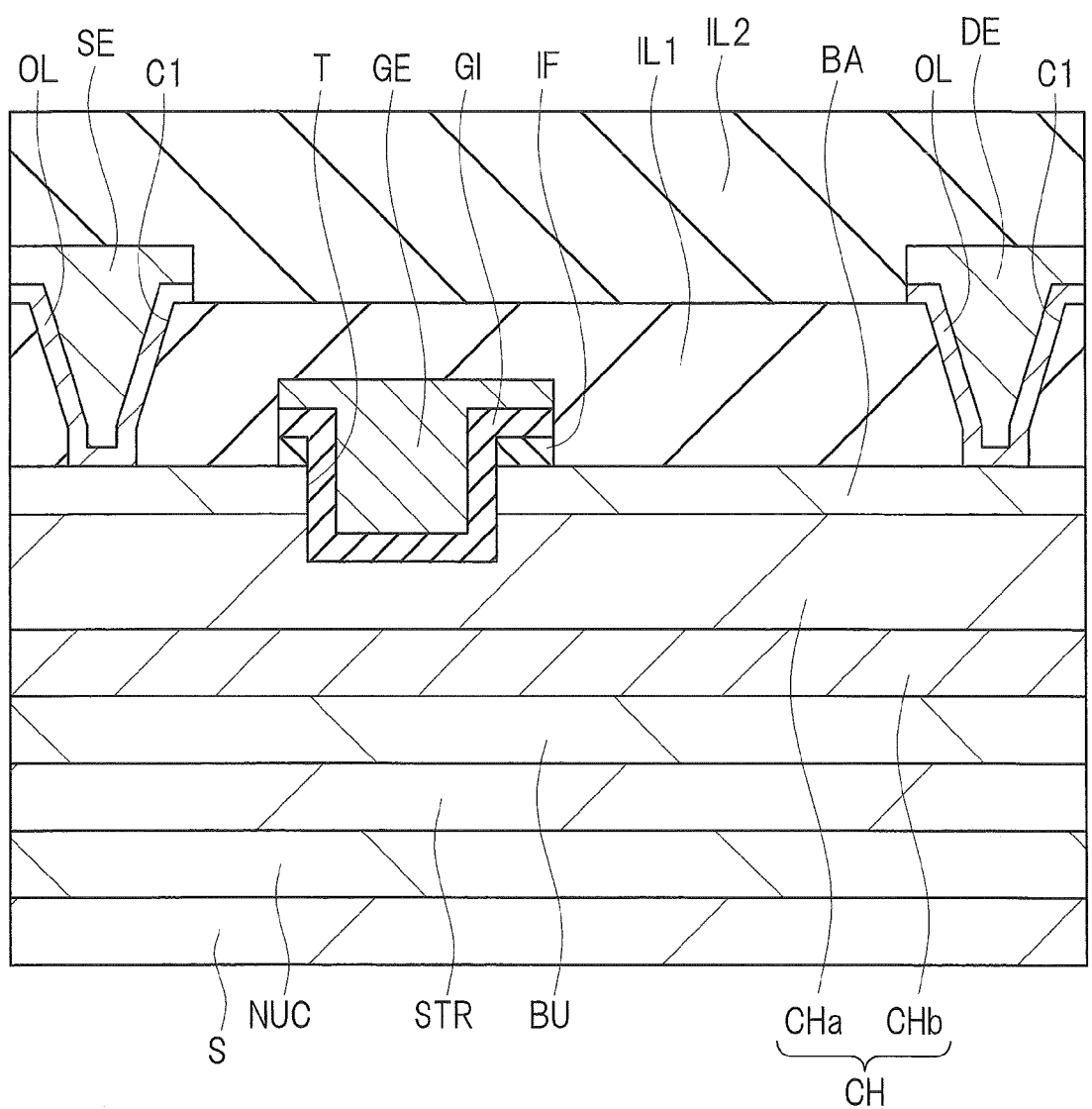
FIG. 9 is a sectional view showing the manufacturing process of the semiconductor device of the first embodiment continued from FIG. 8.

Next, as shown in FIG. 9, an insulating layer (also referred to as cover film or surface protection film) IL2 is formed on the insulating layer IL1 including regions on the source electrode SE and the drain electrode DE. For example, a silicon oxynitride (SiON) film is deposited as the insulating layer IL2 on the insulating layer IL1 including the regions on the source electrode SE and the drain electrode DE by using the CVD method or the like.

Through the process described above, the semiconductor device shown in FIG. 1 can be formed.

Figure 10:
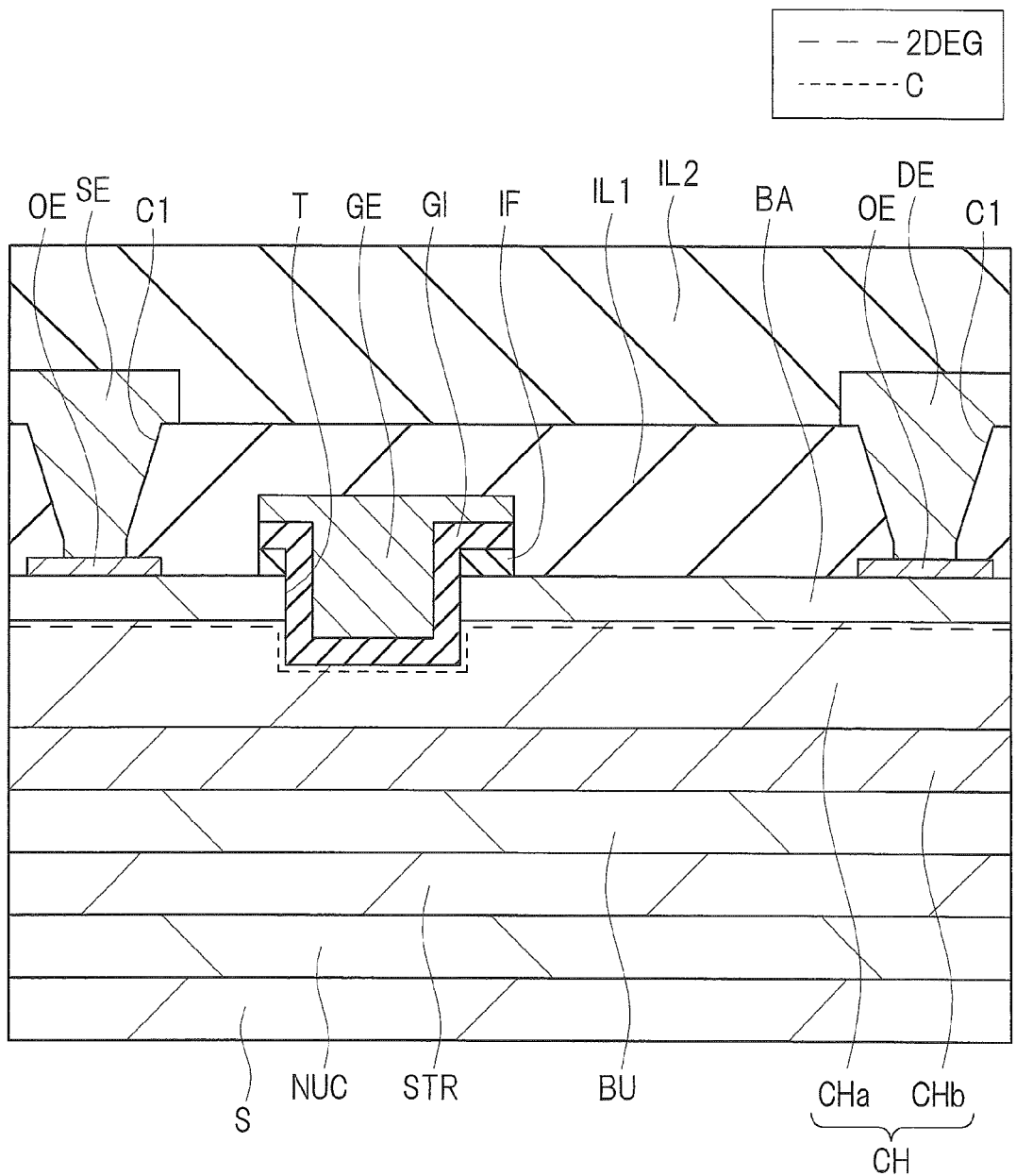
FIG. 10 is a sectional view showing the manufacturing process of the semiconductor device of the first embodiment continued from FIG. 9.

Note that, in the above-described embodiment (FIG. 1), though the source electrode SE and the drain electrode DE are formed in the contact holes C1 via the ohmic layers OL, the source electrode SE and the drain electrode DE may be formed on ohmic electrodes OE formed in advance. FIG. 10 is a sectional view showing another configuration of the semiconductor device of the present embodiment.

For example, as shown in FIG. 10, it is also possible to adopt the configuration in which the ohmic electrodes OE are formed on the barrier layer BA in advance, the contact holes C1 are formed in the insulating layer IL1 on the ohmic electrodes OE, and the source electrode SE and the drain electrode DE are formed inside the contact holes C1.

Thus, according to the present embodiment, since the channel layer CH is composed of the stacked film of the main channel layer CHa containing n-type impurities and the channel lower layer CHb positioned below the main channel layer CHa and having an n-type impurity concentration higher than that of the main channel layer CHa, the characteristics of the semiconductor device can be improved.

More specifically, by adopting the nm/n structure in the channel layer CH, carries are spread on the back face side (also referred to as back side or buffer layer BU side) of the channel layer CH, so that the roughness scattering can be reduced in the vicinity of the channel C portion. Therefore, the carrier mobility (here, electron mobility) in the vicinity of the channel C portion can be improved and the on resistances can be reduced.

The details will be described below.

In the present embodiment (FIG. 1), by changing the buffer layer BU from the unGaN layer (related art 2) to the unAlGaN layer, the normally-off characteristic can be achieved. A p-type nitride semiconductor layer such as a p-type GaN layer may be used instead of the AlGaN layer.

When the AlGaN layer is used as the buffer layer BU, since negative polarization charges are generated at the interface between the channel layer CH made of GaN and the buffer layer BU made of AlGaN, the conduction band level is raised and the threshold potential Vth shifts in a positive direction, so that the normally-off characteristic can be achieved. Further, even when the p-type nitride semiconductor layer (p-type GaN layer) is used, since the conduction band level is raised and the threshold potential Vth shifts in a positive direction, so that the normally-off characteristic can be achieved.

Furthermore, by adopting the nm/n structure in the channel layer CH, carries are spread on the back face side (also referred to as back side or buffer layer BU side) of the channel layer CH, so that the roughness scattering can be reduced in the vicinity of the channel C portion. Therefore, the carrier mobility (here, electron mobility) in the vicinity of the channel C portion can be improved and the on resistances (channel resistances Rch, Ras, Rad) can be reduced. Moreover, the withstand voltage can be improved as compared with a case where the entire channel layer CH is composed of a layer containing intermediate concentration n-type impurities.

FIG. 20 is a table showing an example of a configuration of a buffer layer, a channel layer and a gate insulating film of the semiconductor device of the present embodiment. More specifically, as shown in FIG. 20, the buffer layer BU is not an undoped GaN layer as shown in the related art 2 but an undoped AlGaN layer (also referred to as unAlGaN layer) having a film thickness of about 1000 nm. The composition of the AlGaN layer is here $Al_{0.03}Ga_{0.97}N$. Further, the channel layer CH is not a single-layered GaN layer containing n-type impurities (nmGaN layer) as shown in the related art 3 but the stacked structure (nm/n structure) of the main channel layer CHa which is the GaN layer containing n-type impurities (nmGaN layer) and the channel lower layer CHb which is the GaN layer (nGaN layer) positioned below the main channel layer CHa and containing n-type impurities at a concentration higher than the impurity concentration of the main channel layer CHa. The concentration of the n-type impurities in the main channel layer (nmGaN layer) CHa is about $Nd=1e17$ $(1\times10^{17})/cm^3$ (low concentration) and the concentration of the n-type impurities in the channel lower layer (nGaN layer) CHb is about $Nd=1e18$ $(1\times10^{18})/cm^3$ (intermediate concentration). The film thicknesses of the main channel layer CHa and the channel lower layer CHb are about 20 nm and about 10 nm, respectively. Note that the gate insulating film GI is alumina having a film thickness of about 100 nm.

Figure 21:
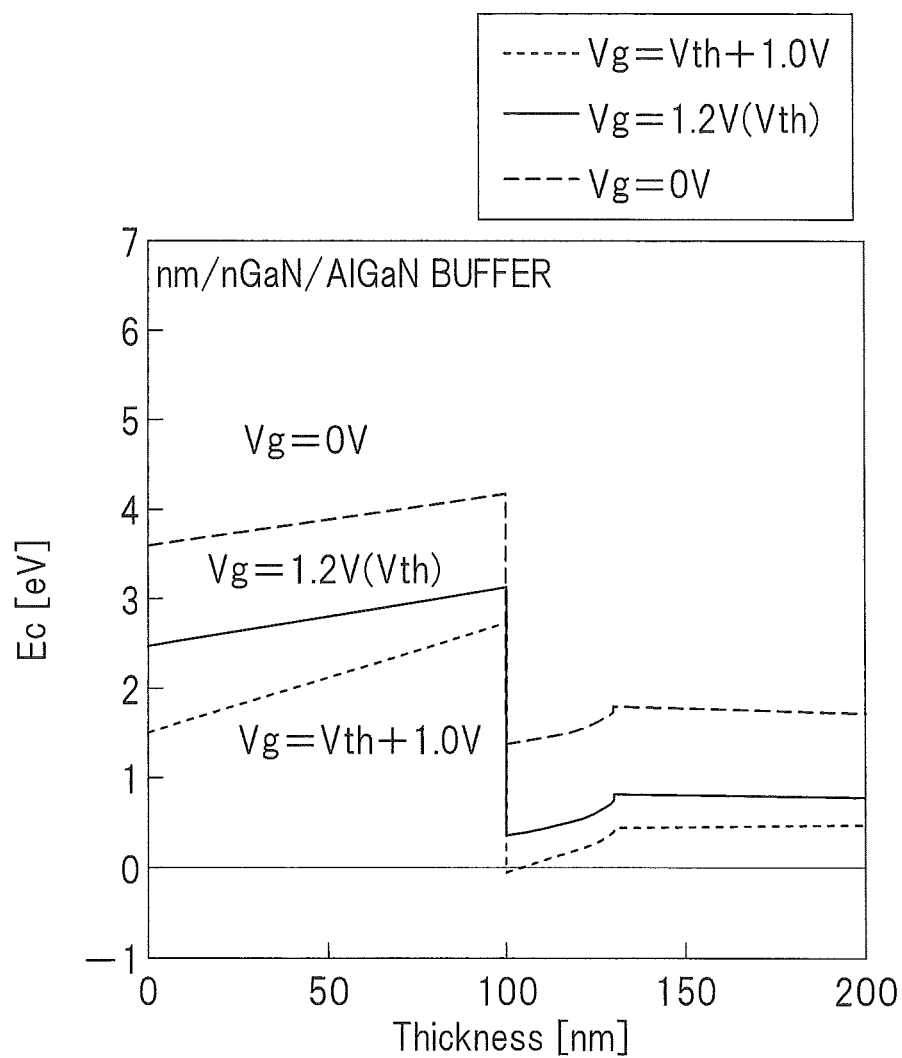
FIG. 21 is a graph showing a bias dependency of a conduction band potential of a portion below a surface of a gate insulating film in a gate electrode portion of the semiconductor device shown in FIG. 20.

FIG. 21 is a graph showing a bias dependency of the conduction band potential of a portion below the surface of the gate insulating film in the gate electrode portion of the semiconductor device shown in FIG. 20. In FIG. 21, a vertical axis represents the energy (Ec) [eV] of the conduction band and a horizontal axis represents the thickness (also referred to as depth) [nm] below the surface of the gate insulating film in the gate electrode portion. A point of the thickness of 100 nm corresponds to a boundary portion between the gate insulating film GI and the channel layer CH. The relationship between the energy (Ec) of the conduction band and the thickness below the surface of the gate insulating film in the gate electrode portion has been examined for the respective cases where the gate voltage (Vg, bias) is set at 0 V, 1.2 V (threshold potential Vth), and Vth+1.0 V.

According to FIG. 21, when the gate voltage is 0 V, the energy (Ec) of the conduction band of the channel portion at the point of the thickness of 100 nm exceeds 1 eV, and the normally-off characteristic can be realized. On the other hand, when the gate potential is 1.2 V (threshold potential Vth based on Ns), the energy (Ec) of the conduction band at the point of the thickness of 100 nm becomes several kT (k: Boltzmann constant, T: absolute temperature) level, which shows that the gate voltage is the threshold potential Vth. By changing the buffer layer BU from the unGaN layer (related art 2) to the unAlGaN layer as described above, change from the normally-on to the normally-off can be achieved. This is because of the effect that negative polarization charge induced at an interface between the AlGaN buffer layer and the GaN channel layer raises a conduction band lower end potential.

Figure 22:
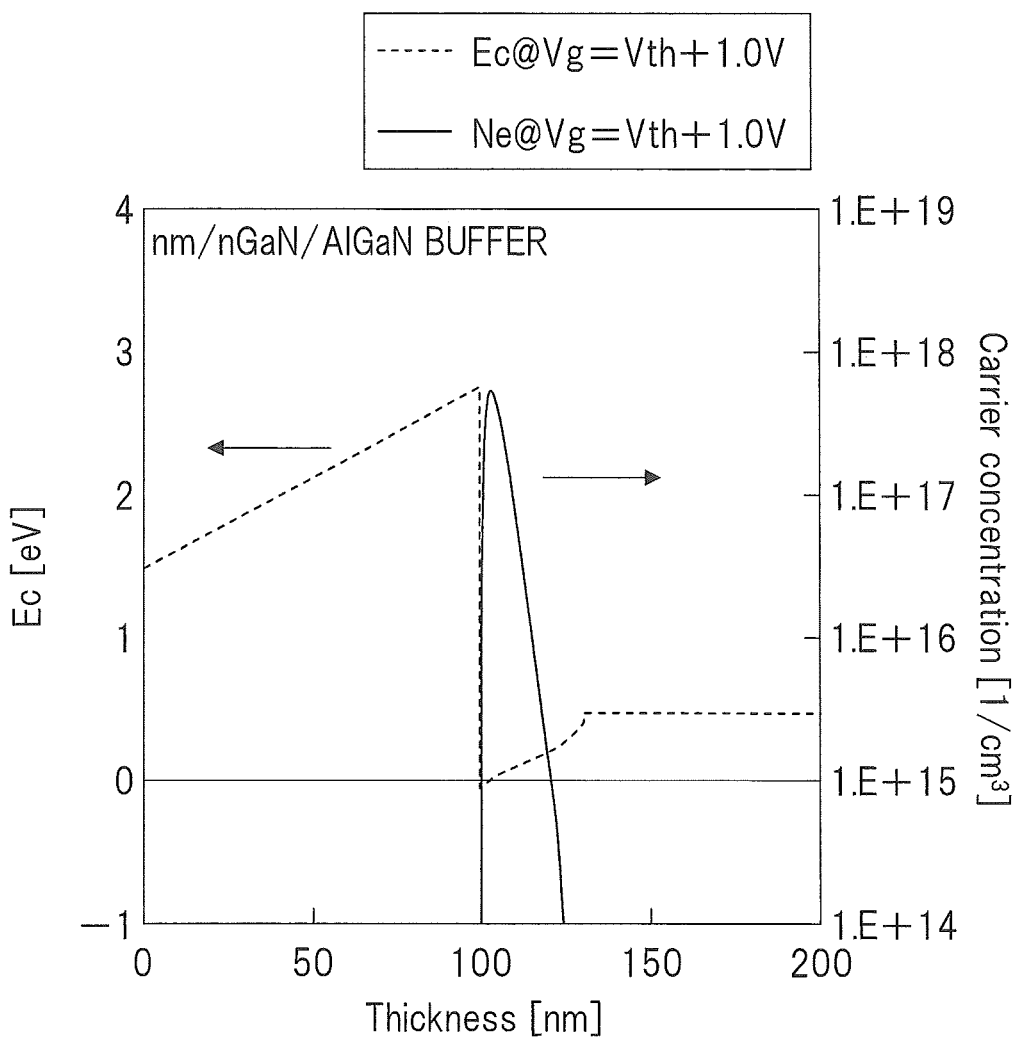
FIG. 22 is a graph showing a carrier concentration of a portion below a surface of a gate insulating film in the gate electrode portion of the semiconductor device shown in FIG. 20.

FIG. 22 is a graph showing the carrier concentration of a portion below the gate insulating film in the gate electrode portion of the semiconductor device shown in FIG. 20. Here, the carrier concentration when the gate voltage (Vg) shown in FIG. 21 is set at Vth+1.0 V has been examined. In FIG. 22, a vertical axis (left scale) represents the energy (Ec) [eV] of the conduction band and a vertical axis (right scale) represents the carrier concentration [$1/cm^3$], and a horizontal axis represents the thickness (also referred to as depth) [nm] below the surface of the gate insulating film in the gate electrode portion. The point of the thickness of 100 nm corresponds to the boundary portion between the gate insulating film GI and the channel layer CH.

As shown in FIG. 22, carriers (here, electrons) are distributed not only at the interface of MIS, that is, the boundary portion (point of the thickness of 100 nm) between the gate insulating film GI and the channel layer CH but also in a region from the thickness of about 100 nm to the thickness of about 125 nm. In the region having the thickness (also referred to as depth) below the surface of the gate insulating film of 100 nm or more, the raise of the energy (Ec) [eV] of the conduction band becomes gentle. Therefore, it is understood that carriers are more spread to the back face side (also referred to as back side or buffer layer BU side) of the channel layer CH as compared with the case of the related art 3 (FIG. 19). As a result, the roughness scattering of carries in the vicinity of the channel C portion can be reduced, the carrier mobility (here, electron mobility) in the channel C portion can be improved, and the on resistance can be reduced.

Figure 23:
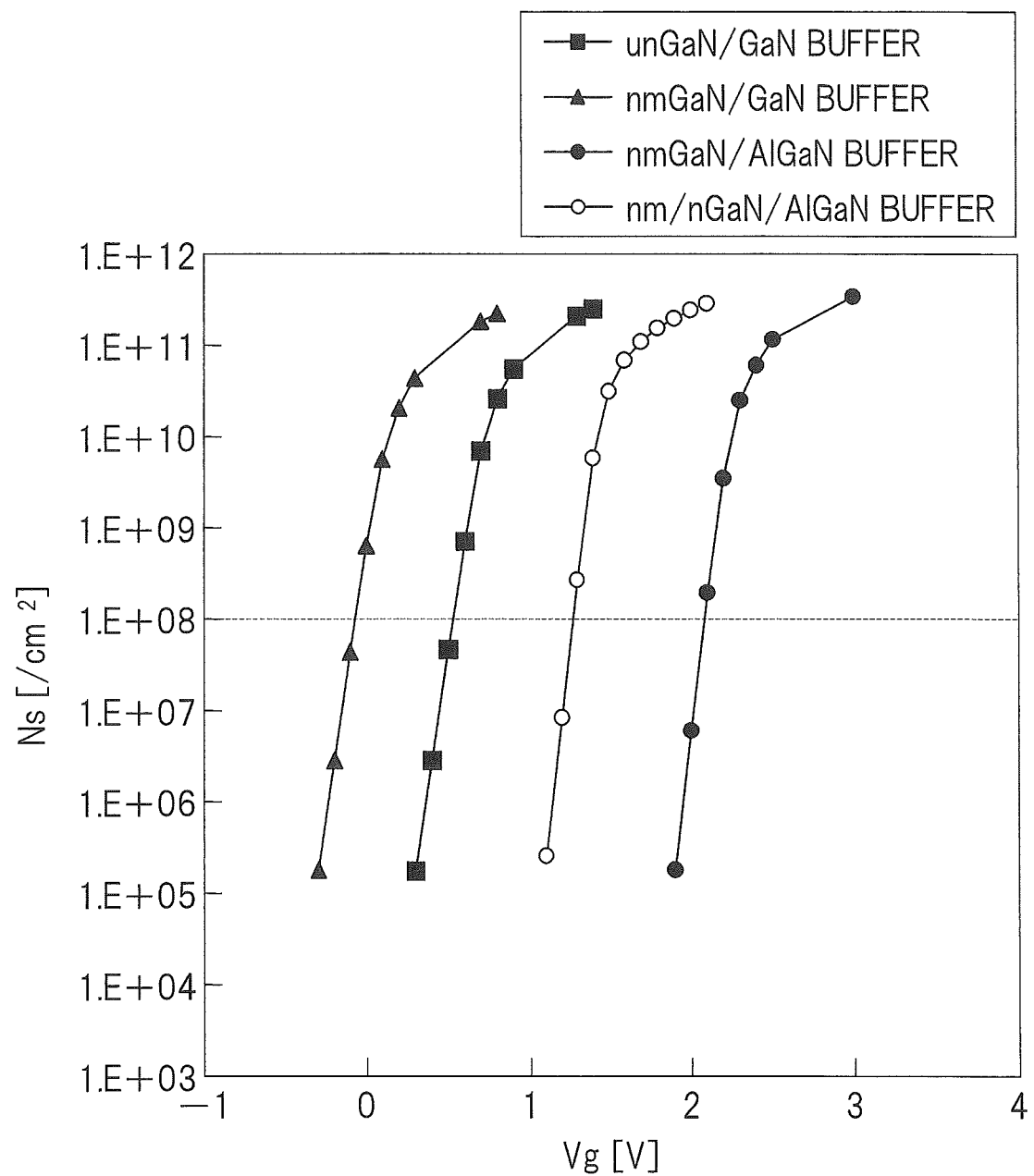
FIG. 23 is a graph showing gate voltage (Vg) dependencies of channel-sheet charge concentrations (Ns) of the semiconductor devices of the related arts 1 to 3 and the first embodiment.

Note that FIG. 23 is a graph showing gate voltage (Vg) dependencies of channel-sheet charge concentrations (Ns) of the semiconductor devices of the related arts 1 to 3 and the present embodiment. In FIG. 23, a vertical axis represents the channel-sheet charge concentration (Ns) [$/cm^2$] and a horizontal axis represents the gate voltage (Vg) [V]. According to FIG. 23, it can be confirmed that the semiconductor device of the related art 1 (unGaN/GaN buffer), the semiconductor device of the related art 3 (nmGaN/AlGaN buffer), and the semiconductor device of the present embodiment (nmGaN/nGaN/AlGaN buffer) have the normally-off characteristic. On the other hand, it can be confirmed that the semiconductor device of the relate art 2 (nmGaN/GaN buffer) has a channel-sheet charge concentration (Ns) higher than the pinch-off point when the gate voltage (Vg) is 0 V and has the normally-on characteristic. Further, it can be understood that the respective semiconductor devices have approximately the same channel-sheet charge concentrations (Ns) [$/cm^2$].

Note that, in the above-described first embodiment, the example of the channel layer CH having two-layered structure different in impurity concentration between respective layers has been described, but a similar effect can be achieved also in the case where the n-type impurity concentration becomes gradually larger from a region on the barrier layer BA side to a region on the buffer layer BU side (substrate S side) in the channel layer. Thus, if the requirement of n-type impurity concentration is satisfied in the respective regions of the channel layer (region on the buffer layer BU side and region on the barrier layer BA side), it is not necessarily required that a boundary between the layers is clear.

(Second Embodiment)

In the first embodiment, the example where the channel layer CH has the two-layered structure (nm/n structure) of the main channel layer CHa containing n-type impurities and the channel lower layer CHb positioned below the main channel layer CHa and containing n-type impurities at a concentration higher than the impurity concentration of the main channel layer CHa has been described, but the channel layer may have a three-layered structure. More specifically, the channel layer CH may have a three-layered structure (nm/n/un) of a main channel layer CHa containing n-type impurities, a channel first lower layer CHb positioned below the main channel layer CHa and containing n-type impurities at a concentration higher than the impurity concentration of the main channel layer CHa, and an undoped channel second lower layer CHc positioned below the channel first lower layer CHb.

This structure corresponds to the structure where the undoped channel second lower layer CHc is provided between the buffer layer BU and the channel lower layer CHb in the first embodiment (FIG. 1).

[Description of Structure]

Figure 24:
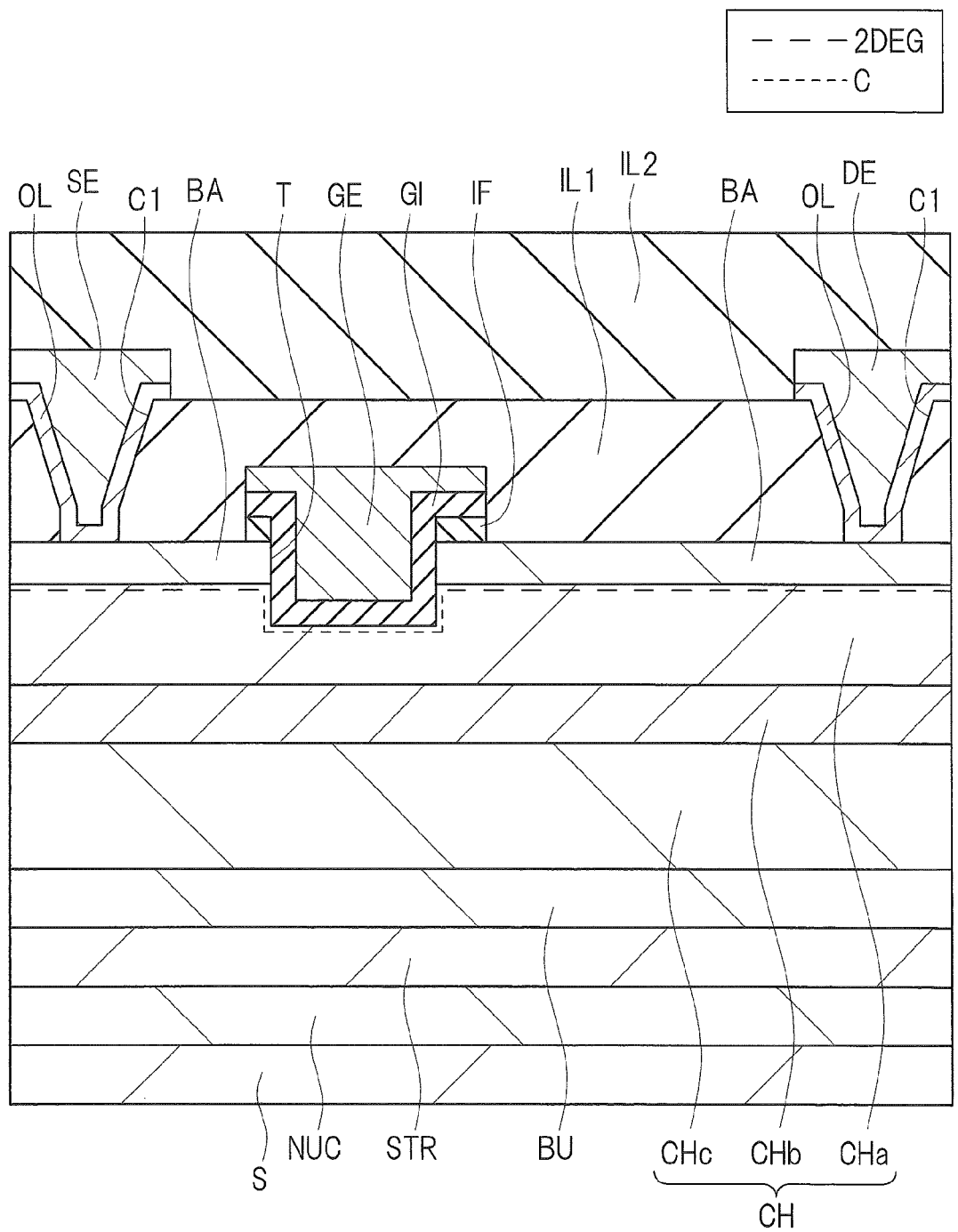
FIG. 24 is a sectional view showing a configuration of a semiconductor device of a second embodiment.

FIG. 24 is a sectional view showing a configuration of a semiconductor device of the second embodiment. The semiconductor device shown in FIG. 24 is a MIS type field effect transistor using nitride semiconductor like the semiconductor device (FIG. 1) of the first embodiment. The semiconductor device is also referred to as high electron mobility transistor or power transistor. The semiconductor device of the present embodiment is a so-called recess gate type semiconductor device.

Since a point different from the first embodiment is only a configuration of the channel layer CH, this point will be described in detail.

In the semiconductor device of the present embodiment, a nucleation layer NUC, a strain relaxing layer STR, a buffer layer BU, a channel layer (also referred to as electron transit layer) CH and a barrier layer BA are sequentially formed on a substrate S like the first embodiment. A gate electrode GE is formed, via a gate insulating film GI, inside a trench T dug so as to penetrate through the insulating film IF and the barrier layer BA to reach the middle of the main channel layer CHa. A source electrode SE and a drain electrode DE are formed on the barrier layer BA on both sides of the gate electrode GE.

In the semiconductor device of the present embodiment, the channel layer CH has a stacked structure of a main channel layer CHa, a channel first lower layer CHb positioned below the main channel layer CHa, and a channel second lower layer CHc positioned below the channel first lower layer CHb.

Here, both the main channel layer CHa and the channel first lower layer CHb contain n-type impurities, and the impurity concentration of the channel first lower layer CHb is set to be higher than the impurity concentration of the main channel layer CHa. Further, the channel second lower layer CHc positioned below the channel first lower layer CHb is an undoped (also referred to as non-doped) layer.

FIG. 25 is a table showing an example of a configuration of a buffer layer, a channel layer and a gate insulating film of the semiconductor device of the present embodiment. More specifically, as shown in FIG. 25, the buffer layer BU is an undoped AlGaN layer (also referred to as unAlGaN layer) having a film thickness of about 1000 nm. The composition of the AlGaN layer is here $Al_{0.03}Ga_{0.97}N$. Further, the channel layer CH has a three-layered structure (nm/n/un structure) of the main channel layer CHa which is a GaN layer containing n-type impurities (nmGaN layer), the channel first lower layer CHb which is a GaN layer (nGaN layer) positioned below the main channel layer CHa and containing n-type impurities at a concentration higher than the impurity concentration of the main channel layer CHa, and the channel second lower layer CHc which is an undoped GaN layer (unGaN layer) positioned below the channel first lower layer CHb. Since the channel second lower layer CHc is an undoped GaN layer, the impurity concentration thereof is lower than those of the main channel layer CHa and the channel first lower layer CHb.

The concentration of the n-type impurities in the main channel layer (nmGaN layer) CHa is about Nd=1e17 $(1\times10^{17})/cm^3$ (low concentration), and the concentration of the n-type impurities in the channel first lower layer (nGaN layer) CHb is about Nd=1e18 $(1\times10^{18})/cm^3$ (intermediate concentration). Further, as described above, even in the undoped case, since each semiconductor layer has been naturally converted to n, the equivalent impurity concentration (Nd) is 1e15 $(1\times10^{15})/cm^3$.

The film thicknesses of the main channel layer CHa, the channel first lower layer CHb, and the channel second lower layer CHc are about 20 nm, 10 nm, and 30 nm, respectively. Note that the gate insulating film GI is alumina having a film thickness of about 100 nm.

Figure 26:
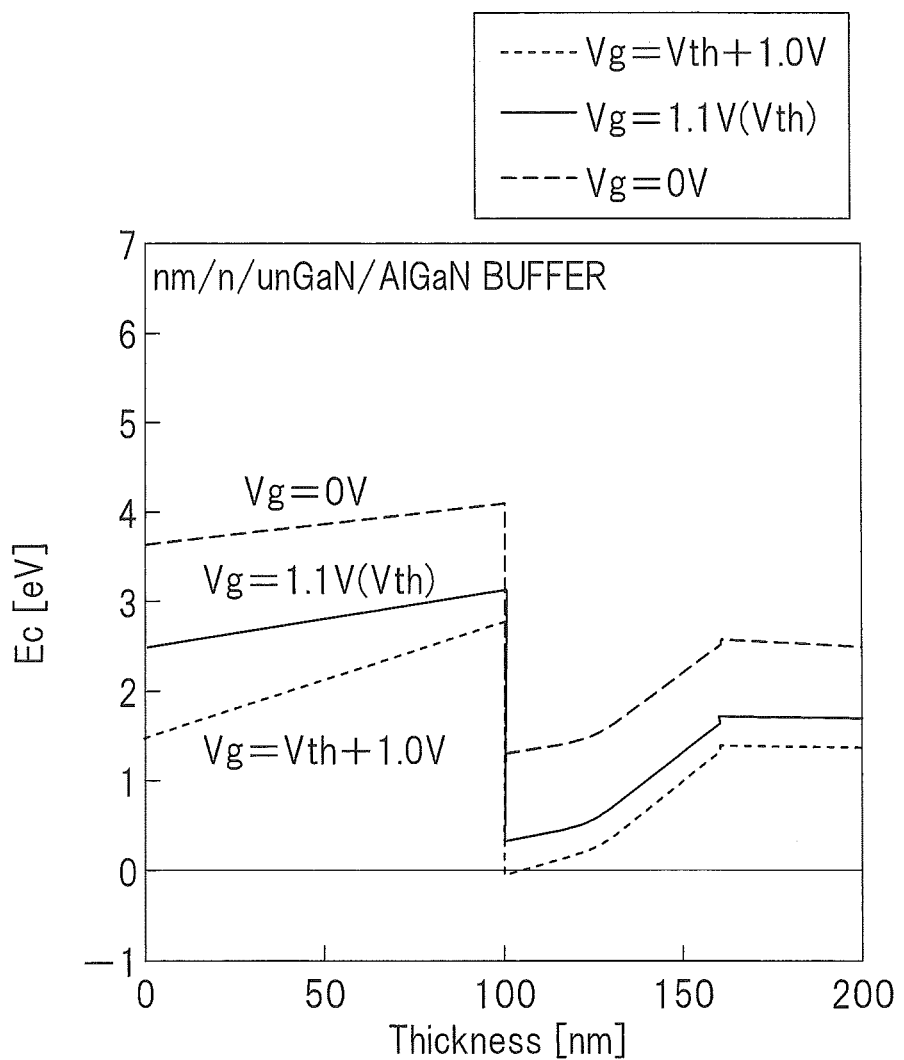
FIG. 26 is a graph showing a bias dependency of a conduction band potential of a portion below a surface of a gate insulating film in a gate electrode portion of the semiconductor device shown in FIG. 25.

FIG. 26 is a graph showing a bias dependency of a conduction band potential in a portion below a surface of the gate insulating film in the gate electrode portion of the semiconductor device shown in FIG. 25. In FIG. 26, a vertical axis represents the energy (Ec) [eV] of the conduction band and a horizontal axis represents the thickness (also referred to as depth) [nm] below the surface of the gate insulating film in the gate electrode portion. A point of the thickness of 100 nm corresponds to a boundary portion between the gate insulating film GI and the channel layer CH. The relationship between the energy (Ec) of the conduction band and the thickness below the surface of the gate insulating film in the gate electrode portion has been examined for the respective cases where the gate voltage (Vg, bias) is set at 0 V, 1.1 V (threshold potential Vth), and Vth+1.0 V.

According to FIG. 26, when the gate voltage is 0 V, the energy (Ec) of the conduction band of the channel portion at the point of the thickness of 100 nm exceeds 1 eV, and the normally-off characteristic can be realized. On the other hand, when the gate potential is 1.1 V (threshold potential Vth based on Ns), the energy (Ec) of the conduction band at the point of the thickness of 100 nm becomes several kT (k: Boltzmann constant, T: absolute temperature) level, which shows that the gate voltage is the threshold potential Vth.

Figure 27:
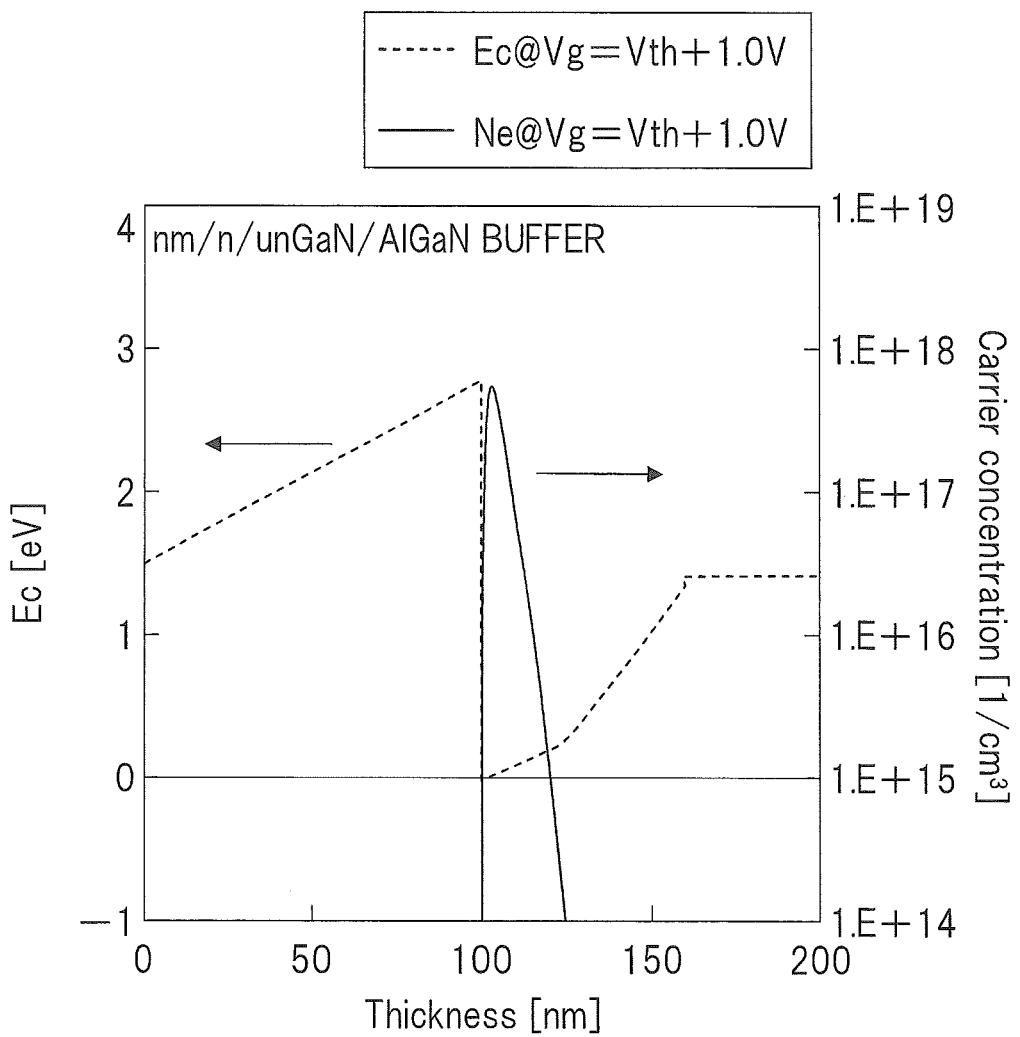
FIG. 27 is a graph showing a carrier concentration of a portion below a surface of a gate insulating film in the gate electrode portion of the semiconductor device shown in FIG. 25.

FIG. 27 is a graph showing a carrier concentration of a portion below a surface of the gate insulating film in the gate electrode portion of the semiconductor device shown in FIG. 25. Here, the carrier concentration when the gate voltage (Vg) shown in FIG. 26 is set at Vth+1.0 V has been examined. In FIG. 27, a vertical axis (left scale) represents the energy (Ec) [eV] of the conduction band and a vertical axis (right scale) represents the carrier concentration $[1/cm^3]$, and a horizontal axis represents the thickness (also referred to as depth) [nm] below the surface of the gate insulating film in the gate electrode portion. The point of the thickness of 100 nm corresponds to the boundary portion between the gate insulating film GI and the channel layer CH.

As shown in FIG. 27, carriers (here, electrons) are distributed not only at the interface of MIS, that is, the boundary portion (point of the thickness of 100 nm) between the gate insulating film GI and the channel layer CH but also in a region from the thickness of about 100 nm to the thickness of about 125 nm, and carriers are more spread to the back face side (also referred to as back side or buffer layer BU side) of the channel layer CH as compared with the case of the related art 3 (FIG. 19). As a result, the roughness scattering in the vicinity of the channel C portion can be reduced, the carrier mobility (here, electron mobility) in the vicinity of the channel C portion can be improved, and the on resistance can be reduced.

Even in the structure in which the undoped channel second lower layer CHc is provided between the buffer layer BU and the channel lower layer CHb of the first embodiment (FIG. 1) in this manner, the carriers are spread to the back face side (also referred to as back side or buffer layer BU side) of the channel layer CH like the first embodiment, so that the roughness scattering can be reduced in the vicinity of the channel C portion. Therefore, the carrier mobility (here, the electron mobility) can be improved in the vicinity of the channel C portion, and the on resistances (channel resistances Rch, Ras, Rad) can be reduced.

Further, by providing the undoped channel second lower layer CHc as the lowermost layer of the channel layer CH, crystallinity of the channel first lower layer CHb and the main channel layer CHa can be improved. Furthermore, the withstand voltage of the semiconductor device can be improved. In addition, since the channel layer CH becomes thick when an ion implantation region is formed in a recess edge portion in a fourth embodiment described below, a process margin can be increased.

[Description of Manufacturing Method]

The semiconductor device of the present embodiment can be formed in the same manner as the first embodiment. Since a step different from the first embodiment is only a step of forming the channel layer CH, this step will be described in detail.

A nucleation layer NUC, a strain relaxing layer STR, and a buffer layer BU are sequentially formed on a substrate S like the first embodiment (see FIG. 24 and FIG. 2).

Next, a channel layer CH composed of a main channel layer CHa, a channel first lower layer CHb and a channel second lower layer CHc is formed on the buffer layer BU. For example, an undoped gallium nitride layer (unGaN) is hetero-epitaxially grown as the channel second lower layer CHc on the buffer layer BU by using the MOCVD method or the like.

Next, for example, a gallium nitride layer (nGaN) doped with n-type impurities is hetero-epitaxially grown as the channel first lower layer CHb on the channel second lower layer CHc by using MOCVD method or the like. For example, the gallium nitride layer (nGaN) doped with n-type impurities is hetero-epitaxially grown in an atmosphere in which n-type impurity gas is mixed in material gas of gallium nitride. Next, for example, a gallium nitride layer (nmGaN) doped with low-concentration n-type impurities is hetero-epitaxially grown as the main channel layer CHa on the channel first lower layer CHb by using MOCVD method or the like. For example, the gallium nitride layer (nmGaN) doped with n-type impurities is hetero-epitaxially grown in an atmosphere in which n-type impurity gas is mixed in material gas of gallium nitride. At this time, by lowering the mixture amount of the n-type impurity gas, gallium nitride layers (nGaN and nmGaN) different in doping amount of the n-type impurities can be formed (see FIG. 24).

Next, for example, an AlGaN layer is hetero-epitaxially grown as the barrier layer BA on the channel layer CH by using MOCVD method or the like in the same manner as the first embodiment. Next, an insulating film IF having an opening is formed on the barrier layer BA, and a trench T penetrating through the insulating film IF and the barrier layer BA to reach the middle of the main channel layer CHa is formed by etching the barrier layer BA and the channel layer CH with using the insulating film IF as a mask.

Next, a gate insulating film GI is formed on the insulating film IF including inside of the trench T and a gate electrode GE is formed on the gate insulating film GI inside the trench T like the first embodiment.

Thereafter, an insulating layer IL1, an ohmic layer OL, a source electrode SE and a drain electrode DE are formed on the gate electrode GE, and an insulating layer IL2 is further formed like the first embodiment (see FIG. 24 and FIG. 4 to FIG. 9).

Note that, in the above-described second embodiment, the example of the channel layer CH having three-layered structure different in impurity concentration between respective layers has been described, but if the requirement of n-type impurity concentration is satisfied in the respective regions (region on the buffer layer BU side, region at a central portion, and a region on the barrier layer BA side) of the channel layer, it is not necessarily required that boundaries between the layers are clear.

(Third Embodiment)

In the second embodiment, the channel layer CH has the three-layered structure (nm/n/un structure), but the channel layer CH may have a two-layered structure (n/un structure) of a main channel layer CHA containing n-type impurities at an intermediate concentration and an undoped channel lower layer CHB positioned below the main channel layer CHA. This structure corresponds to a configuration in which the main channel layer CHa has been removed from the channel layer CH of the second embodiment (FIG. 24) composed of the main channel layer CHa, the channel first lower layer CHb positioned below the main channel layer CHa and containing n-type impurities at a concentration higher than the impurity concentration of the main channel layer CHa, and the undoped channel second lower layer CHc positioned below the channel first lower layer CHb.

[Description of Structure]

Figure 28:
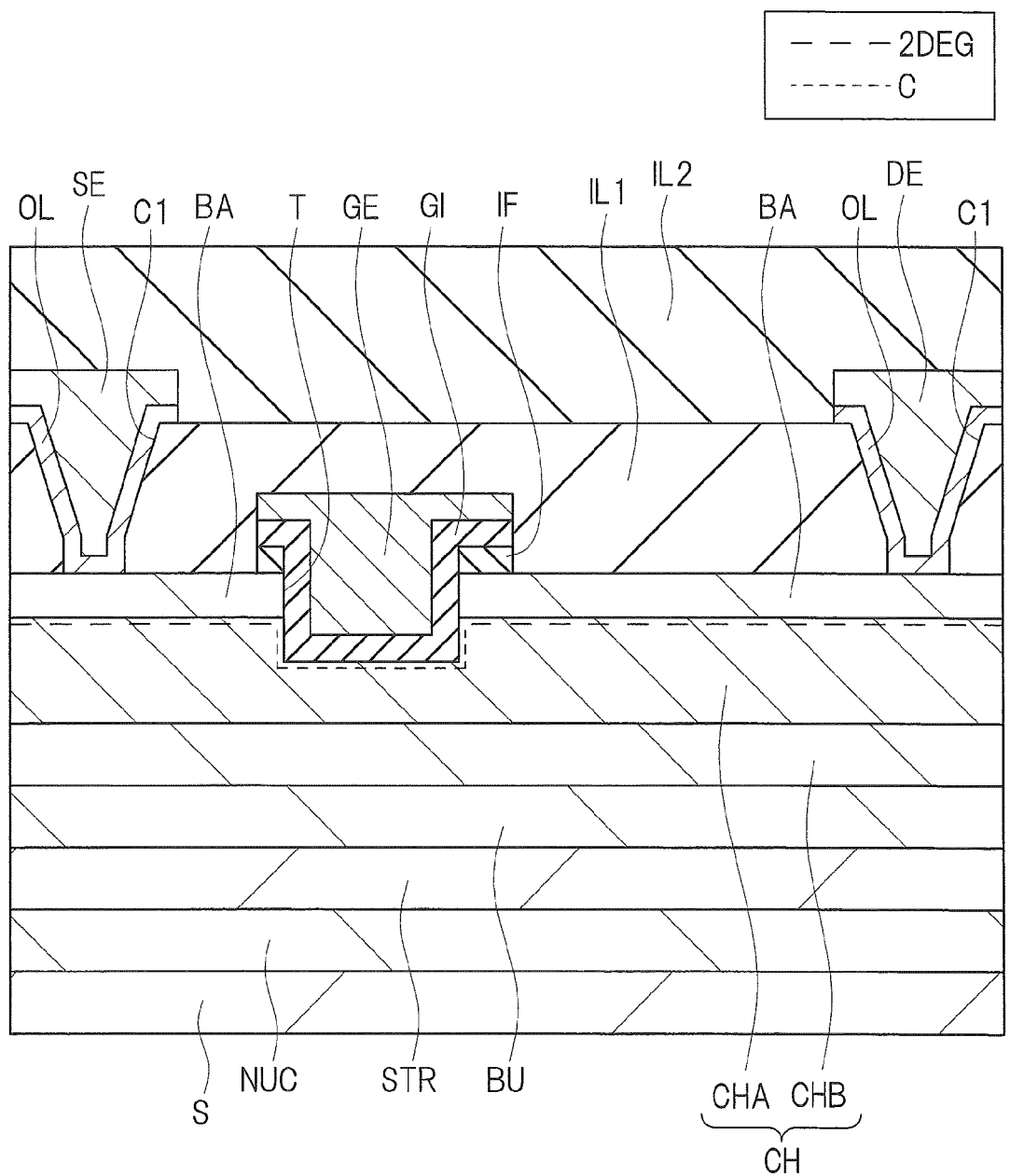
FIG. 28 is a sectional view showing a configuration of a semiconductor device of a third embodiment.

FIG. 28 is a sectional view showing a configuration of a semiconductor device of the present embodiment. The semiconductor device shown in FIG. 28 is a MIS type field effect transistor using nitride semiconductor like the semiconductor device (FIG. 1) of the first embodiment. The semiconductor device is also referred to as high electron mobility transistor or power transistor. The semiconductor device of the present embodiment is a so-called recess gate type semiconductor device.

Since a point different from the second embodiment is only a configuration of the channel layer CH, this point will be described in detail.

In the semiconductor device of the present embodiment, a nucleation layer NUC, a strain relaxing layer STR, a buffer layer BU, a channel layer (also referred to as electron transit layer) CH and a barrier layer BA are sequentially formed on a substrate S like the first and second embodiments. A gate electrode GE is formed, via a gate insulating film GI, inside a trench T dug so as to penetrate through the insulating film IF and the barrier layer BA to reach the middle of the main channel layer CHA. A source electrode SE and a drain electrode DE are formed on the barrier layer BA on both sides of the gate electrode GE.

The channel layer CH of the semiconductor device of the present embodiment has a stacked structure of a main channel layer CHA containing n-type impurities and an undoped channel lower layer CHB positioned below the main channel layer CHA.

Here, the main channel layer CHA contains n-type impurities at a low concentration (1e17 ($1 \times 10^{17}$)/cm$^3$ or more to less than 1e18 ($1 \times 10^{18}$)/cm$^3$), and the channel lower layer CHB is an undoped (also referred to as non-doped) layer.

FIG. 29 is a table showing an example of a configuration of a buffer layer, a channel layer and a gate insulating film of the semiconductor device of the present embodiment. More specifically, as shown in FIG. 29, the buffer layer BU is an undoped AlGaN layer (also referred to as unAlGaN layer) having a film thickness of about 1000 nm. The composition of the AlGaN layer is here $Al_{0.02}Ga_{0.98}N$. Further, the channel layer CH has a stacked structure (nm/un structure) of two semiconductor layers of a main channel layer CHA composed of a GaN layer (nmGaN layer) containing n-type impurities at a low concentration and a channel lower layer CHB positioned below the main channel layer CHA and composed of an undoped GaN layer (unGaN layer). Since the channel lower layer CHB is the undoped GaN layer, the impurity concentration thereof is lower than that of the main channel layer CHA. The film thicknesses of the main channel layer CHA and the channel lower layer CHB are about 30 nm. Note that the gate insulating film GI is alumina having a film thickness of about 100 nm.

As described above, the concentration of the n-type impurities in the main channel layer (nGaN layer) CHA is, for example, about Nd=1e17 ($1 \times 10^{17}$)/cm$^3$ (low concentration). Further, even in the undoped case, since each semiconductor layer has been naturally converted to n, the equivalent impurity concentration (Nd) is 1e15 ($1 \times 10^{15}$)/cm$^3$.

Figure 30:
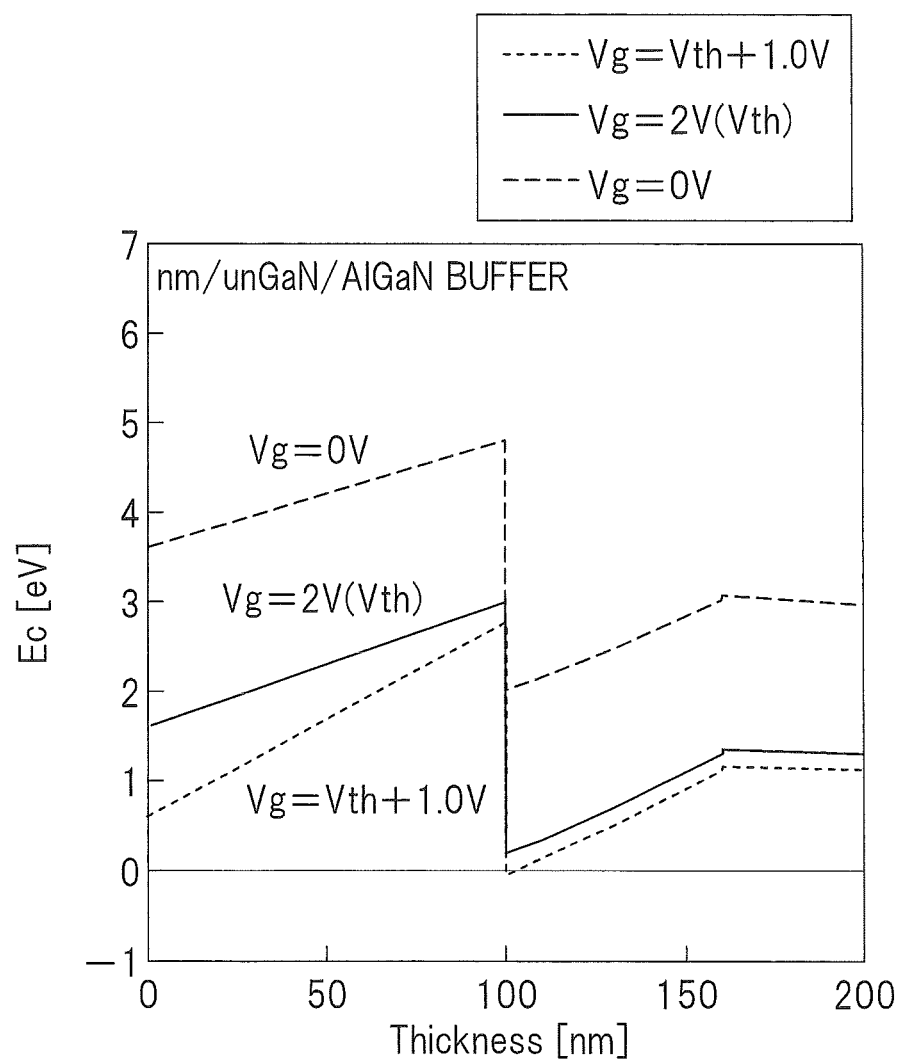
FIG. 30 is a graph showing a bias dependency of a conduction band potential of a portion below a surface of a gate insulating film in a gate electrode portion of the semiconductor device shown in FIG. 29.

FIG. 30 is a graph showing a bias dependency of a conduction band potential of a portion below a surface of a gate insulating film in a gate electrode portion of the semiconductor device shown in FIG. 29. In FIG. 30, a vertical axis represents the energy (Ec) [eV] of the conduction band and a horizontal axis represents the thickness (also referred to as depth) below the surface of the gate insulating film in the gate electrode portion. A point of the thickness of 100 nm corresponds to a boundary portion between the gate insulating film GI and the channel layer CH. The relationship between the energy (Ec) of the conduction band and the thickness below the surface of the gate insulating film in the gate electrode portion has been examined for the respective cases where the gate voltage (Vg, bias) is set at 0 V, 2 V (threshold potential Vth), and Vth+1.0 V.

According to FIG. 30, when the gate voltage is 0 V, the energy (Ec) of the conduction band of the channel portion at the point of the thickness of 100 nm exceeds 1 eV, and the normally-off characteristic can be realized. On the other hand, when the gate potential is 2 V (threshold potential Vth based on Ns), the energy (Ec) of the conduction band at the point of the thickness of 100 nm becomes several kT (k: Boltzmann constant, T: absolute temperature) level, which shows that the gate voltage is the threshold potential Vth.

Figure 31:
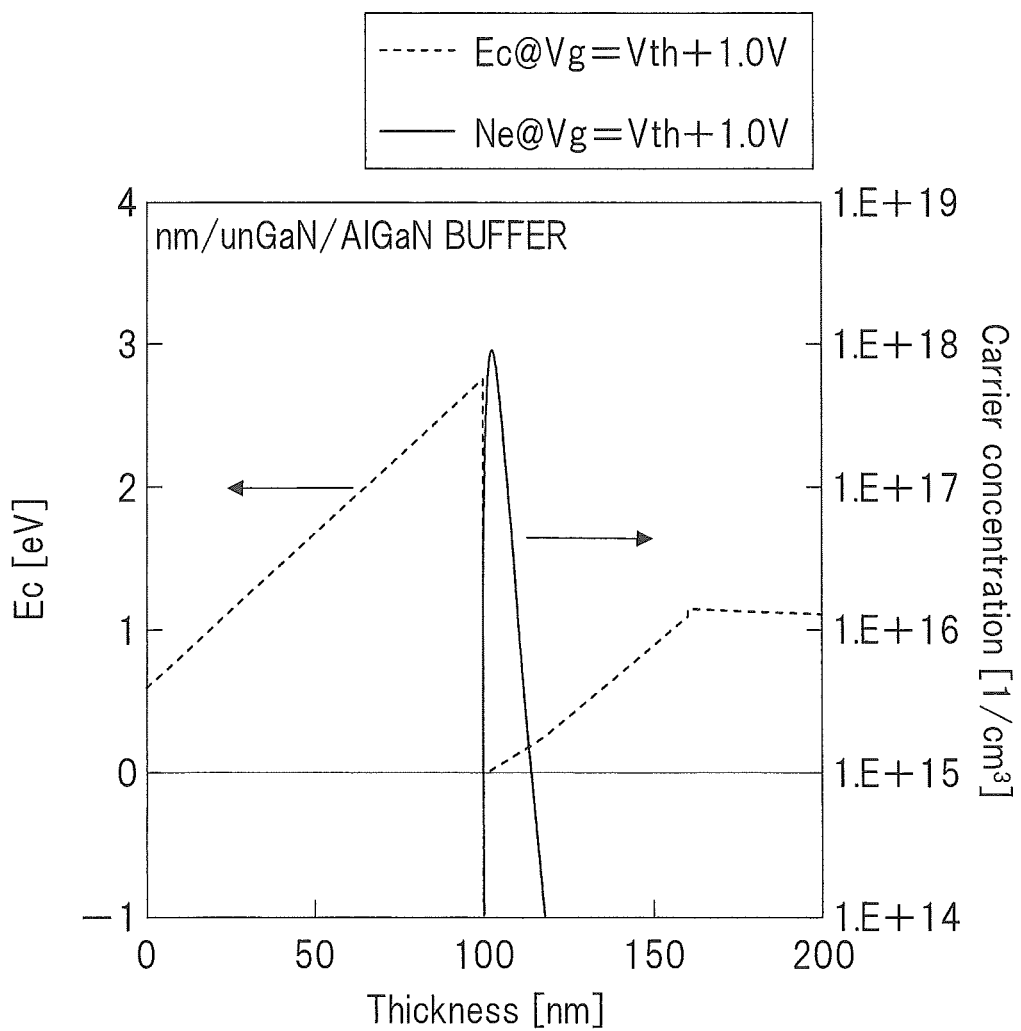
FIG. 31 is a graph showing a carrier concentration of a portion below a surface of a gate insulating film in the gate electrode portion of the semiconductor device shown in FIG. 29.

FIG. 31 is a graph showing a carrier concentration of a portion below the gate insulating film in the gate electrode portion of the semiconductor device shown in FIG. 29. Here, the carrier concentration when the gate voltage (Vg) shown in FIG. 30 is set at Vth+1.0 V has been examined. In FIG. 31, a vertical axis (left scale) represents the energy (Ec) [eV] of the conduction band and a vertical axis (right scale) represents the carrier concentration [1/cm$^3$], and a horizontal axis represents the thickness (also referred to as depth) [nm] below the surface of the gate insulating film in the gate electrode portion. The point of the thickness of 100 nm corresponds to the boundary portion between the gate insulating film GI and the channel layer CH.

As shown in FIG. 31, carriers (here, electrons) are distributed not only at the interface of MIS, that is, the boundary portion (point of the thickness of 100 nm) between the gate insulating film GI and the channel layer CH but also in a region from the thickness of about 100 nm to the thickness of about 120 nm, and carriers are spread to the back face side (also referred to as back side or buffer layer BU side) of the channel layer CH in the same extent as the case of the related art 3 (FIG. 19). As a result, the roughness scattering in the vicinity of the channel C portion can be reduced, the carrier mobility (here, electron mobility) in the vicinity of the channel C portion can be improved, and the on resistance can be reduced.

Further, by providing the undoped channel lower layer CHB as the lowermost layer of the channel layer CH, crystallinity of the main channel layer CHA can be improved. Furthermore, the withstand voltage of the semiconductor device can be improved. In addition, when anion implantation region is formed in a recess edge portion in a fourth embodiment described below, a process margin can be increased.

[Description of Manufacturing Method]

The semiconductor device of the present embodiment can be formed in the same manner as the first embodiment. Since a step different from the first embodiment is only a step of forming the channel layer CH, this step will be described in detail. FIG. 32 to FIG. 37 are sectional views showing the manufacturing process of the semiconductor device of the present embodiment.

Figure 32:
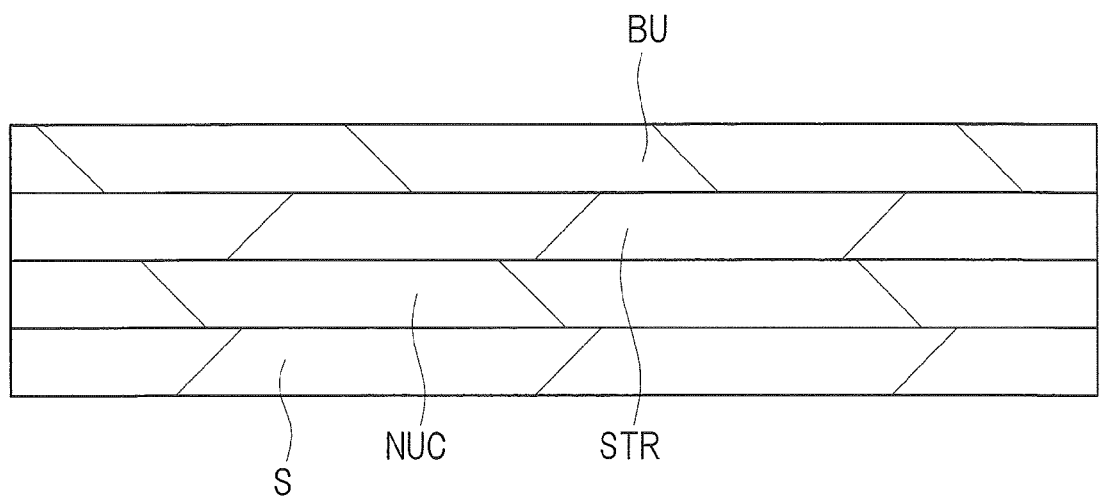
FIG. 32 is a sectional view showing a manufacturing process of a semiconductor device of a third embodiment.

As shown in FIG. 32, a nucleation layer NUC, a strain relaxing layer STR, and a buffer layer BU are sequentially formed on a substrate S. These layers can be formed in the same manner as the case in the first embodiment.

Figure 33:
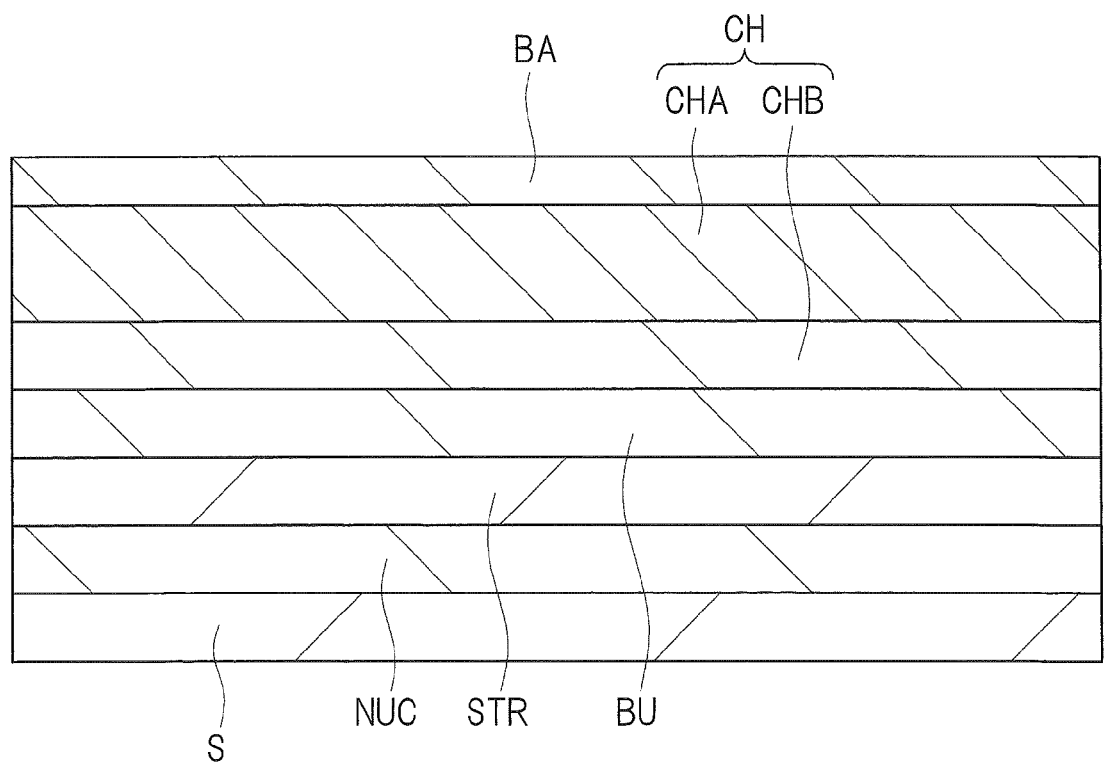
FIG. 33 is a sectional view showing the manufacturing process of the semiconductor device of the third embodiment continued from FIG. 32.

Next, as shown in FIG. 33, a channel layer CH composed of a main channel layer CHA and a channel lower layer CHB is formed on the buffer layer BU. For example, an undoped gallium nitride layer (unGaN) is hetero-epitaxially grown as the channel lower layer CHB on the buffer layer BU by using MOCVD method or the like.

Next, for example, a gallium nitride layer (nGaN) doped with n-type impurities is hetero-epitaxially grown as the main channel layer CHA on the channel lower layer CHB by using the MOCVD method or the like. For example, the gallium nitride layer (nGaN) doped with n-type impurities is hetero-epitaxially grown in an atmosphere in which n-type impurity gas is mixed in material gas of gallium nitride. Next, for example, in the same manner as the first embodiment, an AlGaN layer is hetero-epitaxially grown as the barrier layer BA on the channel layer CH by using MOCVD method or the like.

Figure 34:
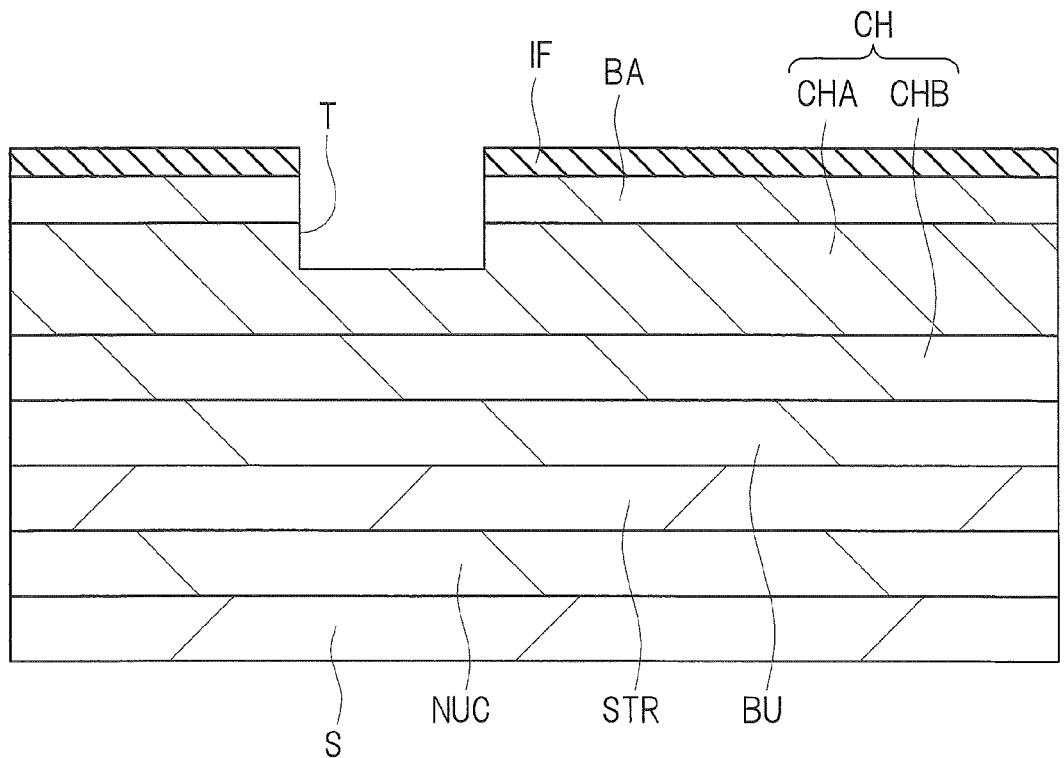
FIG. 34 is a sectional view showing the manufacturing process of the semiconductor device of the third embodiment continued from FIG. 33.

Next, as shown in FIG. 34, an insulating film IF having an opening is formed on the barrier layer BA, and a trench T penetrating through the insulating film IF and the barrier layer BA to reach the middle of the main channel layer CHa is formed by etching the barrier layer BA and the channel layer CH with using the insulating film IF as a mask. The insulating film IF and the trench T can be formed in the same manner as the first embodiment.

Figure 35:
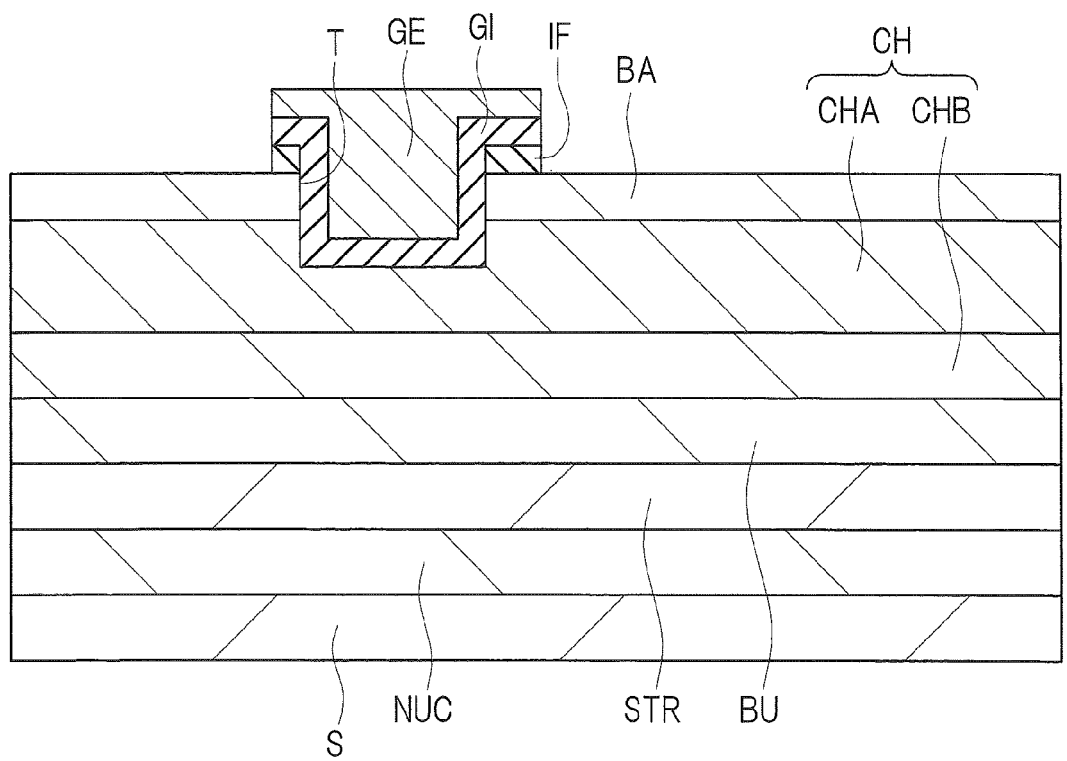
FIG. 35 is a sectional view showing the manufacturing process of the semiconductor device of the third embodiment continued from FIG. 34.

Next, as shown in FIG. 35, a gate insulating film GI is formed on the insulating film IF including inside of the trench T, and a gate electrode GE is then formed on the gate insulating film GI inside the trench T. The gate insulating film GI and the gate electrode GE can be formed in the same manner as the first embodiment.

Figure 36:
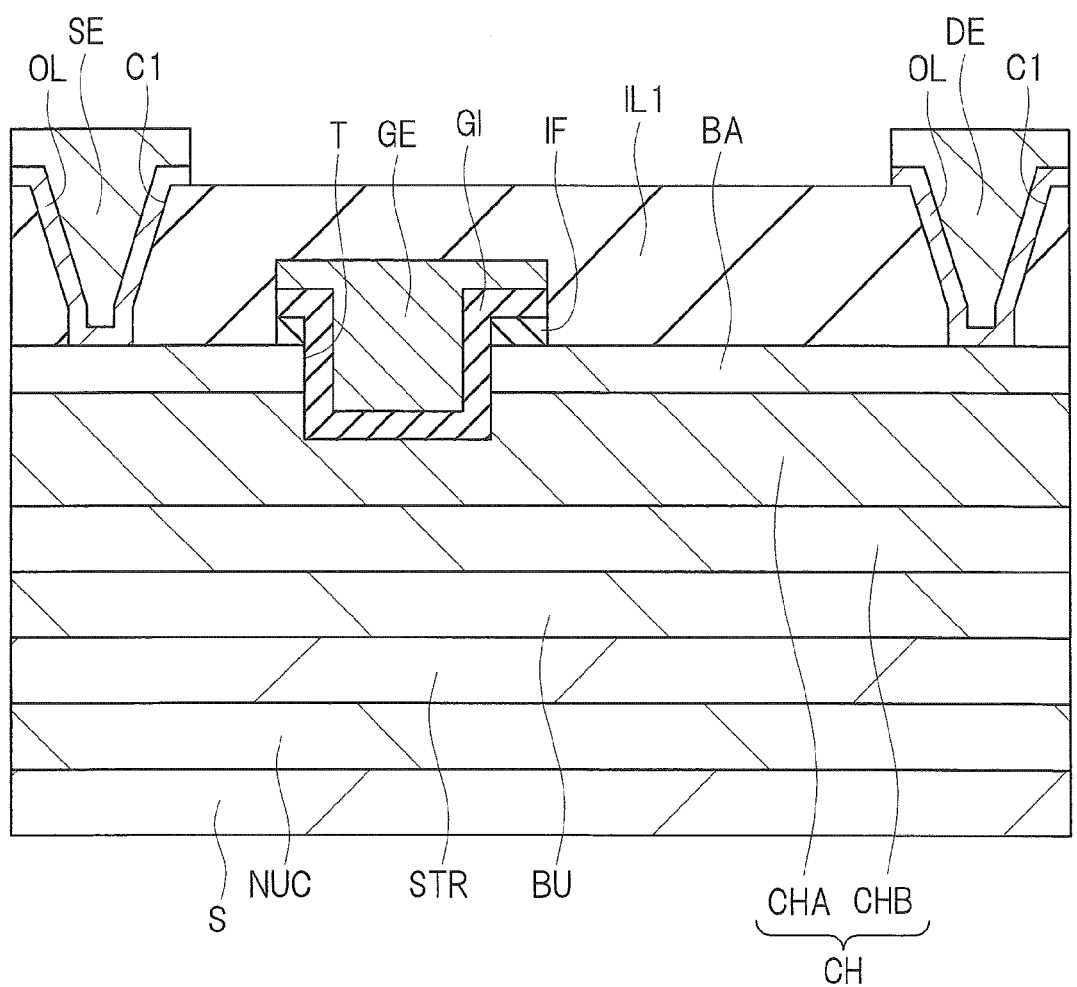
FIG. 36 is a sectional view showing the manufacturing process of the semiconductor device of the third embodiment continued from FIG. 35.
Figure 37:
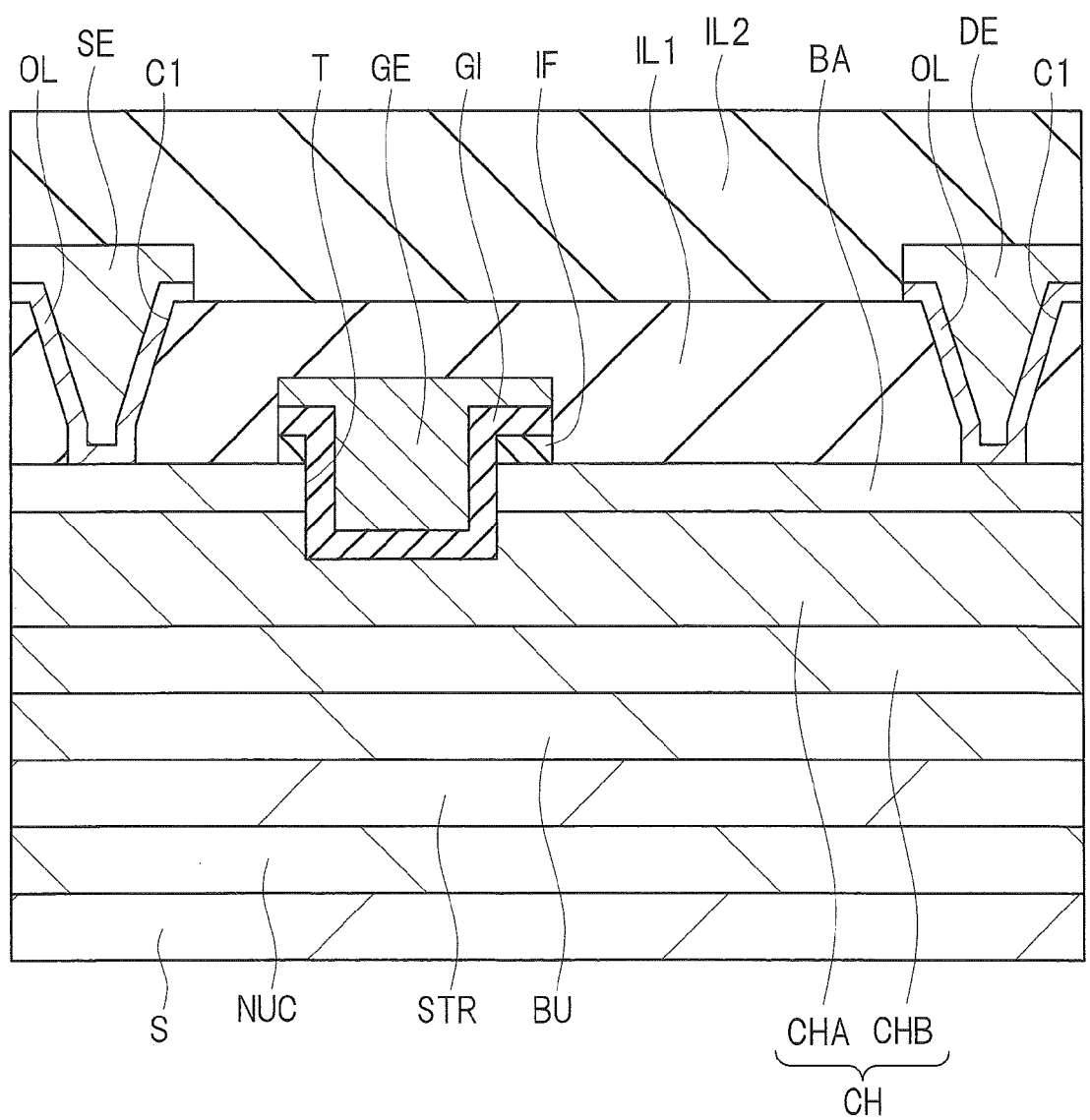
FIG. 37 is a sectional view showing the manufacturing process of the semiconductor device of the third embodiment continued from FIG. 36.

Thereafter, as shown in FIG. 36, an insulating layer IL1, an ohmic layer OL, a source electrode SE and a drain electrode DE are formed on the gate electrode GE, and an insulating layer IL2 is further formed as shown in FIG. 37. The insulating layers IL1 and IL2, the ohmic layer OL, the source electrode SE and the drain electrode DE can be formed in the same manner as the first embodiment.

Note that, in the third embodiment described above, the example of the channel layer CH having the two-layered structure different in impurity concentration between respective layers has been described, but if the requirement of n-type impurity concentration is satisfied in the respective regions of the channel layer (region on the buffer layer BU side and region on the barrier layer BA side), it is not necessarily required that a boundary between the layers is clear.

(Fourth Embodiment)

In the fourth embodiment, a structure in which a high-concentration impurity region is provided on a side surface portion of the trench T will be described.

In the first to third embodiments described above, the fact that the on resistance can be reduced by doping the channel layer CH with n-type impurities has been described. However, when the sheet charge concentration Ns of the channel-carrier is excessively increased by making the n-type impurity concentration in the channel layer CH excessively high, the off withstand voltage of the device is lowered. Therefore, there is a limit on the reduction of the on resistance.

As a result of the examination for the further reduction of the on resistance by the inventors of the present invention, it has found that a resistance at a portion of the MIS channel on the side surface of a gate (side surface portion of the trench T) is high and it is effective for the reduction of the on resistance to lower the resistance of this portion in addition to doping of n-type impurities into the channel layer CH.

In the present embodiment, by providing a high-concentration impurity region on a side surface of the gate, a region having a high carrier concentration is formed between the MIS channel and the two dimensional electron gas. In this manner, the on resistance can be further reduced while securing the withstand voltage.

[Description of Structure]

Figure 38:
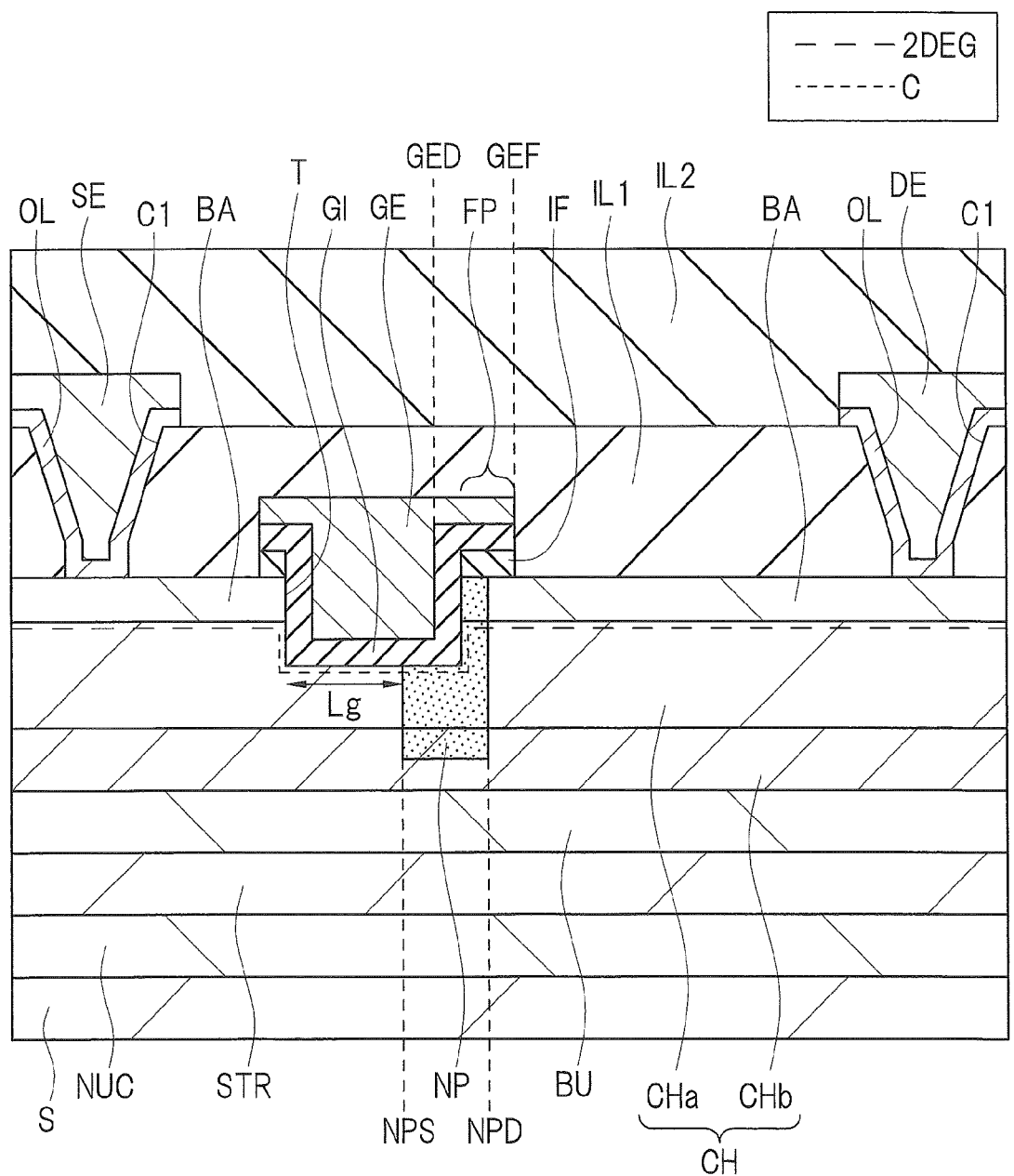
FIG. 38 is a sectional view showing a configuration of a semiconductor device of a fourth embodiment.

FIG. 38 is a sectional view showing a configuration of the semiconductor device of the present embodiment. The semiconductor device shown in FIG. 38 is a MIS type field effect transistor using nitride semiconductor like the semiconductor device (FIG. 1) of the first embodiment. The semiconductor device is also referred to as high electron mobility transistor or power transistor. The semiconductor device of the present embodiment is a so-called recess gate type semiconductor device.

Since a point different from the first embodiment is only a configuration of the n-type high-concentration impurity region NP, this point will be described in detail.

In the semiconductor device of the present embodiment, a nucleation layer NUC, a strain relaxing layer STR, a buffer layer BU, a channel layer (also referred to as electron transit layer) CH, and a barrier layer BA are sequentially formed on a substrate S like the first embodiment.

The channel layer CH has a stacked structure of a main channel layer CHa containing n-type impurities and a channel lower layer CHb positioned below the main channel layer CHa and containing n-type impurities at a concentration higher than the impurity concentration of the main channel layer CHa.

Here, the main channel layer CHa contains n-type impurities at a low concentration (1e17 ($1\times10^{17}$)/cm$^3$ or more to less than 1e18 ($1\times10^{18}$)/cm$^3$), and the channel lower layer CHb contains n-type impurities at an intermediate concentration (1e18 ($1\times10^{18}$)/cm$^3$ or more to less than 1e19 ($1\times10^{19}$)/cm$^3$).

By adopting the nm/n structure in the channel layer CH in this manner, carries are spread to the back face side (also referred to as back side or buffer layer BU side) of the channel layer CH and the roughness scattering can be reduced in the vicinity of the channel C portion like the case of the first embodiment. Therefore, the carrier mobility (here, electron mobility) in the vicinity of the channel C portion can be improved and the on resistance can be reduced.

The gate electrode GE is formed, via a gate insulating film GI, inside a trench T dug so as to penetrate through the insulating film IF and the barrier layer BA to reach the middle of the main channel layer CHA. The source electrode SE and the drain electrode DE are formed on the barrier layer BA on both sides of the gate electrode GE.

Here, in the semiconductor device of the present embodiment, an n-type high-concentration impurity region NP in contact with a side surface portion of the trench T positioned on the drain electrode DE side is formed. The n$^+$-type high-concentration impurity region NP is a region in which impurities such as silicon (Si) ions are implanted into the channel layer CH (main channel layer CHa and channel lower layer CHb). As described above, the high concentration (n$^+$) generally indicates the concentration of 1e19 ($1\times10^{19}$)/cm$^3$ or more, but it is defined here by the concentration where the characteristic of the semiconductor (here, GaN layer) constituting the channel layer CH degenerates, and it is the concentration of 4e18 ($4\times10^{18}$)/cm$^3$ or more.

By providing the n-type high-concentration impurity region NP in contact with the side surface portion of the trench T positioned on the drain electrode DE side in this manner, the channel resistance Rad (see FIG. 1) generated along the side surface of the trench T positioned on the drain electrode DE side can be reduced.

Further, in the semiconductor device of the present embodiment, a gate length Lg is a distance from an end portion of the trench T positioned on the source electrode SE side to the n-type high-concentration impurity region NP (see FIG. 38).

Incidentally, a desirable positional relationship is present between the high-concentration impurity region NP and the gate electrode GE. This will be described.

It is desirable that an end portion NPS of the high-concentration impurity region NP positioned on the source electrode side is located on the source electrode SE side relative to a position GED of a side surface portion of the gate electrode GE inside the trench T positioned on the drain electrode DE side when seen from above. The MIS channel defined by the gate length Lg is formed so as to correspond to a flat portion of a bottom surface of the gate electrode. In other words, the MIS channel is formed on the source electrode SE side relative to the position GED. In this manner, the MIS channel and the bottom portion of the gate electrode form a parallel plate structure, and ideal gate modulation can be realized.

Furthermore, it is desirable that an end portion NPD of the high-concentration impurity region NP positioned on the drain electrode DE side is located on the source electrode SE side relative to an end portion GEF of the gate electrode GE positioned on the drain electrode DE side when seen from above. More specifically, the end portion NPD of the high-concentration impurity region NP positioned on the drain electrode DE side is formed inside the end portion GEF of the gate electrode GE positioned on the drain electrode DE side when seen in a plan view. In this manner, the end portion NPD of the high-concentration impurity region NP positioned on the drain electrode DE side is covered with a portion FP of the gate electrode GE projecting to the drain side. Therefore, electric field concentration at an interface (NPD) between the high-concentration impurity region NP and the other regions can be prevented at a portion of the gate on the drain side. As a result, the off withstand voltage of the device can be improved.

Here, the projecting portion FP of the gate electrode is referred to as field plate electrode. As shown in FIG. 38, the field plate electrode is a region of one portion of the gate electrode GE and indicates an electrode portion extending over an upper layer portion of the semiconductor region on the drain side having no trench (recess) T formed therein.

[Description of Manufacturing Method]

The semiconductor device of the present embodiment can be formed in the same manner as the first embodiment. Since a step different from the first embodiment is only a step of forming the n-type high-concentration impurity region NP, this step will be described in detail. FIG. 39 to FIG. 44 are sectional views showing the manufacturing process of the semiconductor device of the present embodiment.

Figure 39:
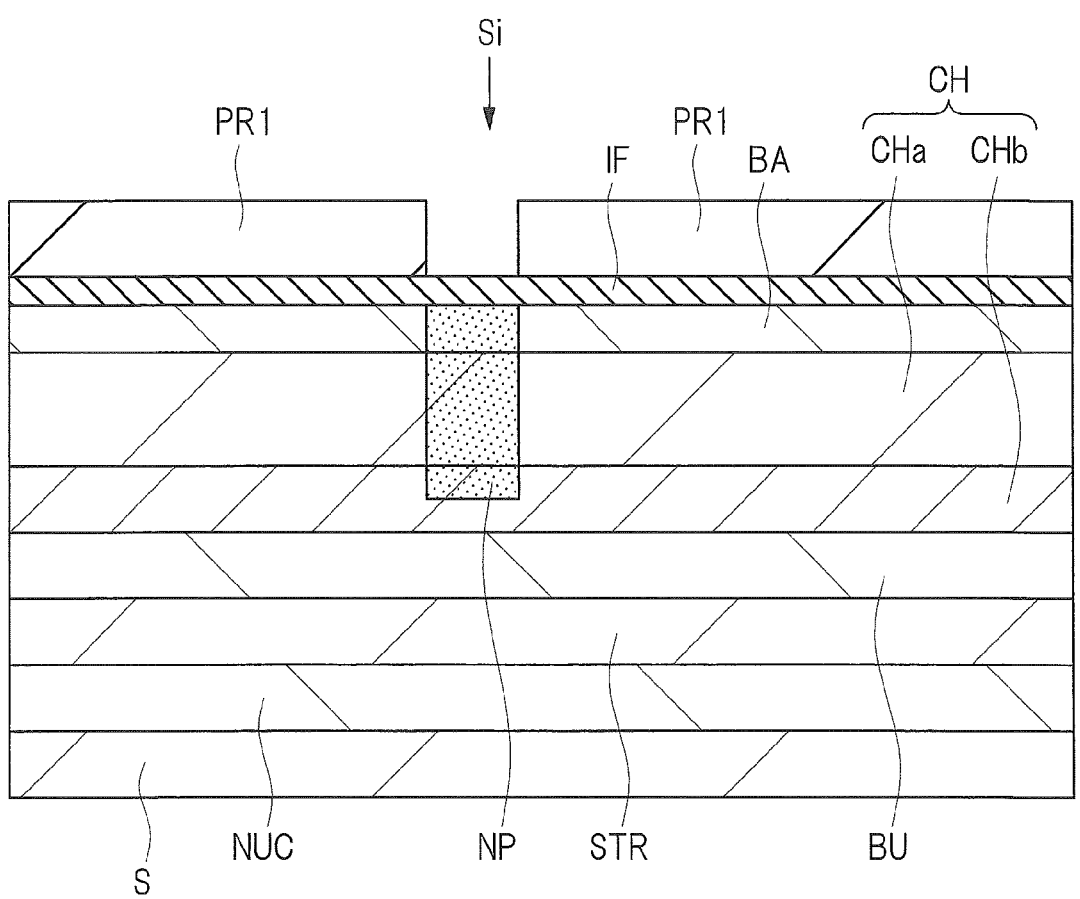
FIG. 39 is a sectional view showing a manufacturing process of the semiconductor device of the fourth embodiment.

As shown in FIG. 39, a nucleation layer UNC, a strain relaxing layer STR, and a buffer layer BU are sequentially formed on a substrate S. Next, a channel layer CH composed of a main channel layer CHa and a channel lower layer CHb, and a barrier layer BA are sequentially formed on the buffer layer BU. These layers can be formed in the same manner as the case of the first embodiment.

Next, an insulating film IF is formed on the barrier layer BA. For example, a silicon nitride film is deposited as the insulating film IF on the barrier layer BA by using a thermal CVD method or the like.

Next, by using photolithography technique, a photoresist film PR1 having an opening is formed on the insulating film IF. Next, an n$^+$-type high-concentration impurity region NP is formed by implanting Si ions into the barrier layer BA and the channel layer CH with acceleration energy of about 100 keV at a dose amount of 1e16/cm$^2$ with using the photoresist film PR1 as a mask. If possible, it is desirable that an implantation condition of ions is adjusted so that a bottom portion of the n-type high-concentration impurity region NP is located in the channel lower layer CHb. Thereafter, thermal treatment is performed at, for example, a temperature of 1200° C. for about 5 minutes in order to activate the implanted ions. Next, the photoresist film PR1 is removed by ashing process or the like.

Next, though not illustrated, an element isolation region may be formed. For example, the element isolation region is formed by forming a trench dug so as to penetrate through the barrier layer BA to reach the middle of the main channel layer CHa in the barrier layer BA and the main channel layer CHa outside the regions where the source electrode SE and the drain electrode DE are to be formed and then embedding an insulating film into the trench.

Figure 40:
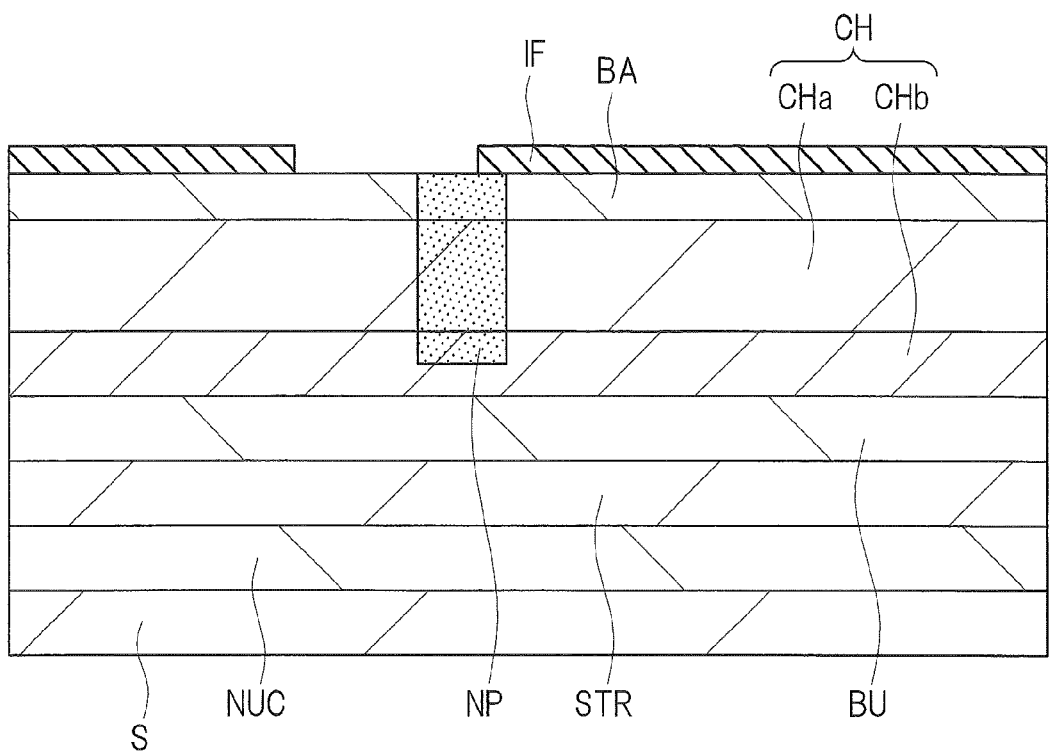
FIG. 40 is a sectional view showing the manufacturing process of the semiconductor device of the fourth embodiment continued from FIG. 39.

Next, as shown in FIG. 40, an opening for forming the trench T is formed in the insulating film IF by using photolithography technique and etching technique. At this time, the opening is formed so that an end portion of the opening of the insulating film IF is located on the n-type high-concentration impurity region NP.

Figure 41:
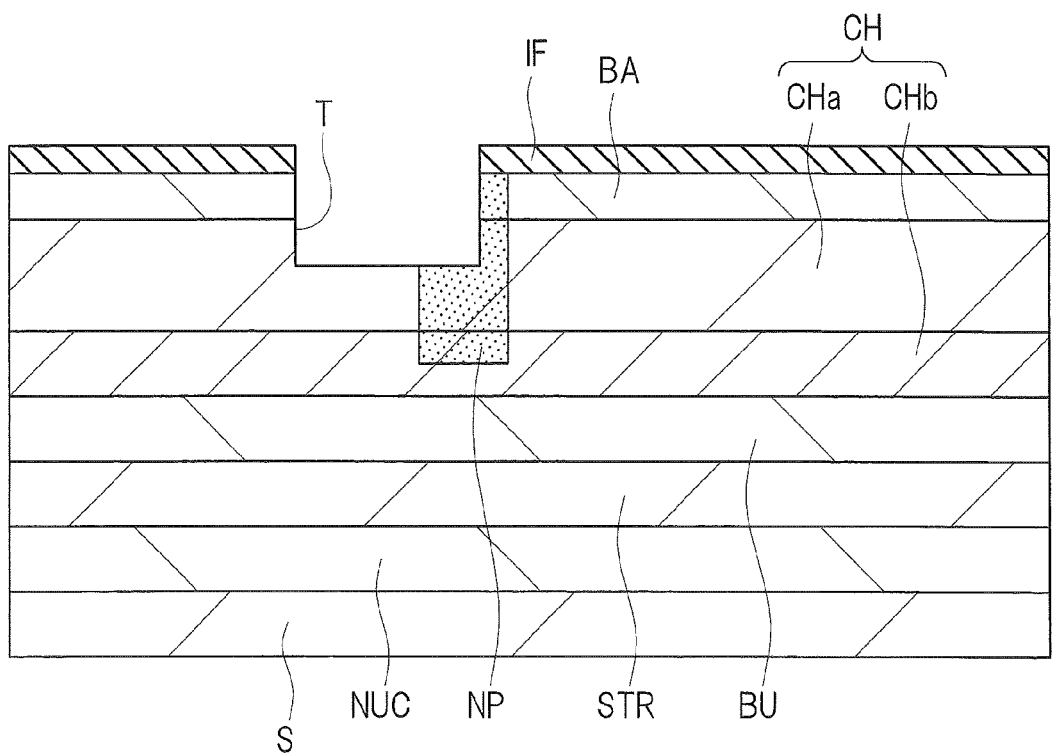
FIG. 41 is a sectional view showing the manufacturing process of the semiconductor device of the fourth embodiment continued from FIG. 40.

Next, as shown in FIG. 41, a trench T penetrating through the insulating film IF and the barrier layer BA to reach the middle of the main channel layer CHa is formed by etching the barrier layer BA and the channel layer CH with using the insulating film IF as a mask. At this time, the n-type high-concentration impurity region NP is exposed from one side surface of the trench T (on the drain electrode DE side described later).

Figure 42:
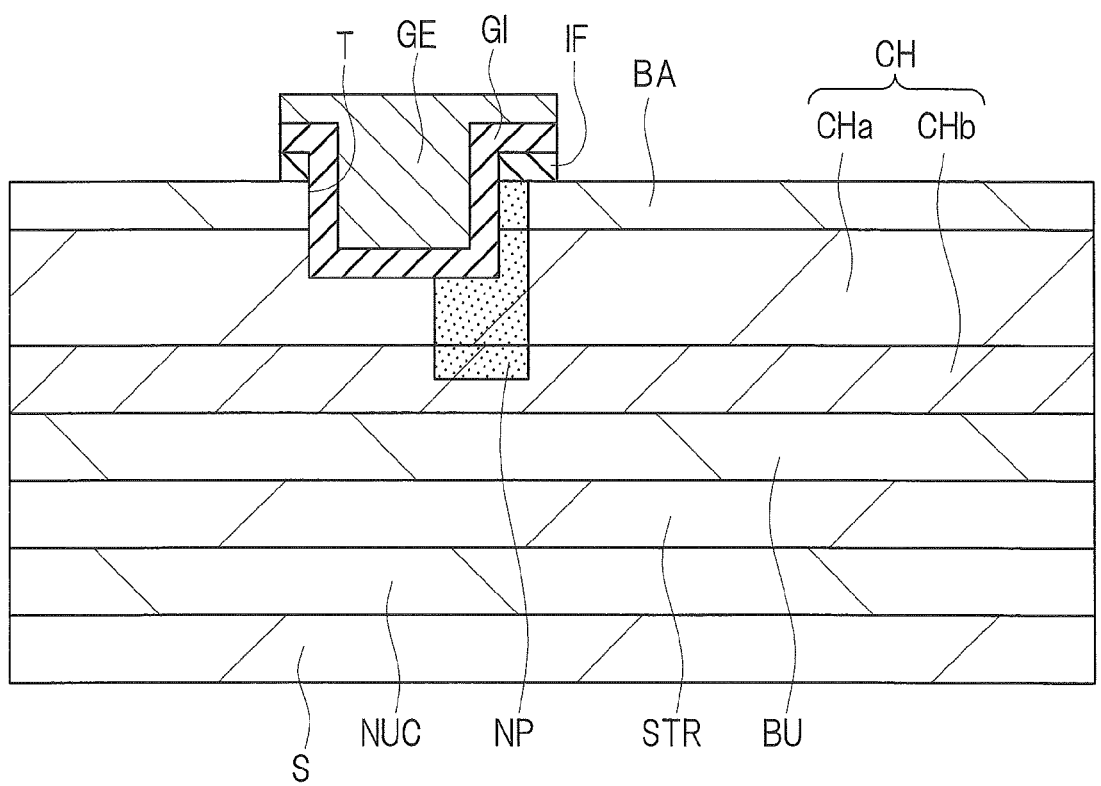
FIG. 42 is a sectional view showing the manufacturing process of the semiconductor device of the fourth embodiment continued from FIG. 41.

Next, as shown in FIG. 42, a gate insulating film GI is formed on the insulating film IF including inside of the trench T, and a gate electrode GE is then formed on the gate insulating film GI inside the trench T. The gate insulating film GI and the gate electrode GE can be formed in the same manner as the first embodiment.

Figure 43:
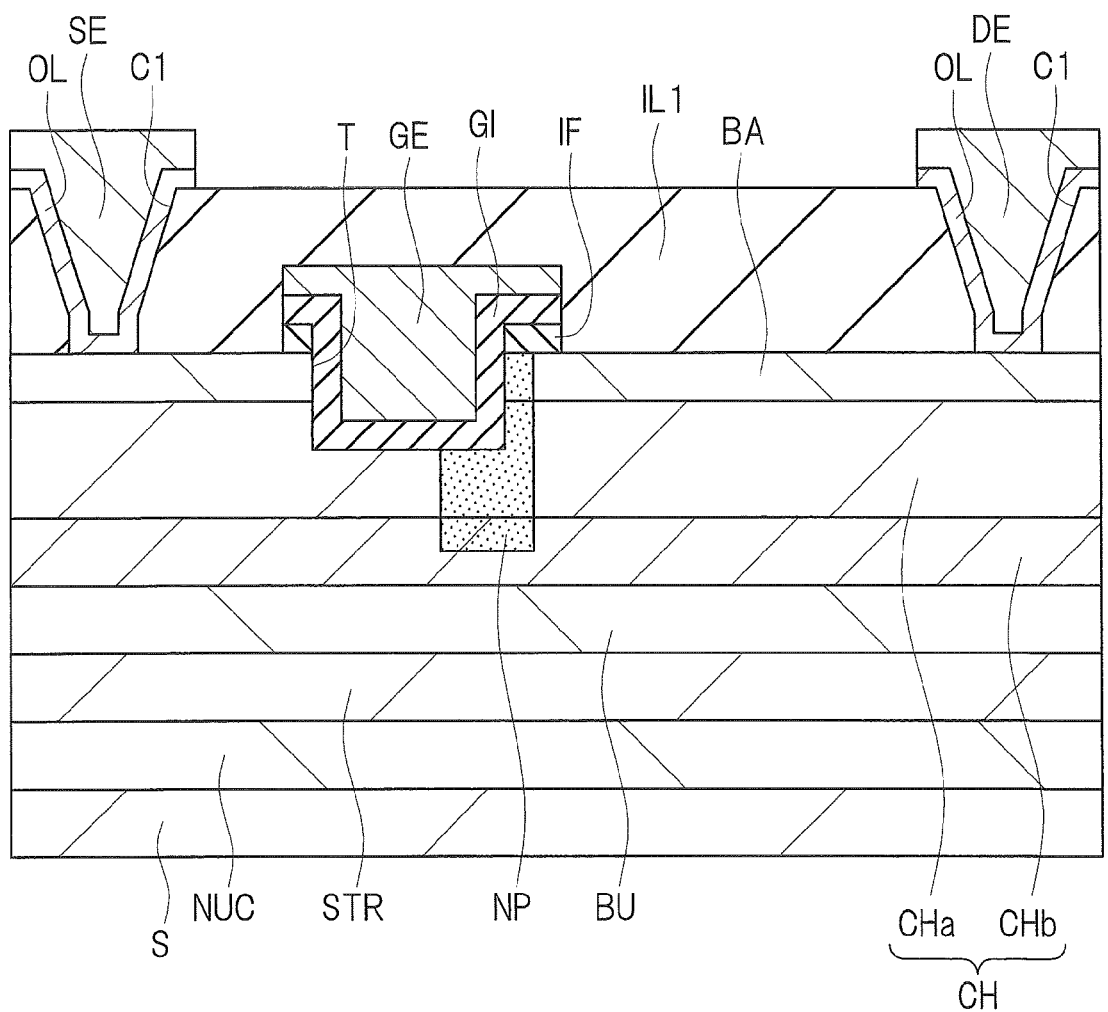
FIG. 43 is a sectional view showing the manufacturing process of the semiconductor device of the fourth embodiment continued from FIG. 42.

Thereafter, as shown in FIG. 43, an insulating layer IL1, an ohmic layer OL, a source electrode SE and a drain electrode DE are formed on the gate electrode GE, and an insulating layer (not shown) is further formed on the source electrode SE and the drain electrode DE. The insulating layer IL1, the ohmic layer OL, the source electrode SE, the drain electrode DE, and the like can be formed in the same manner as the first embodiment.

APPLICATION EXAMPLE 1

Figure 44:
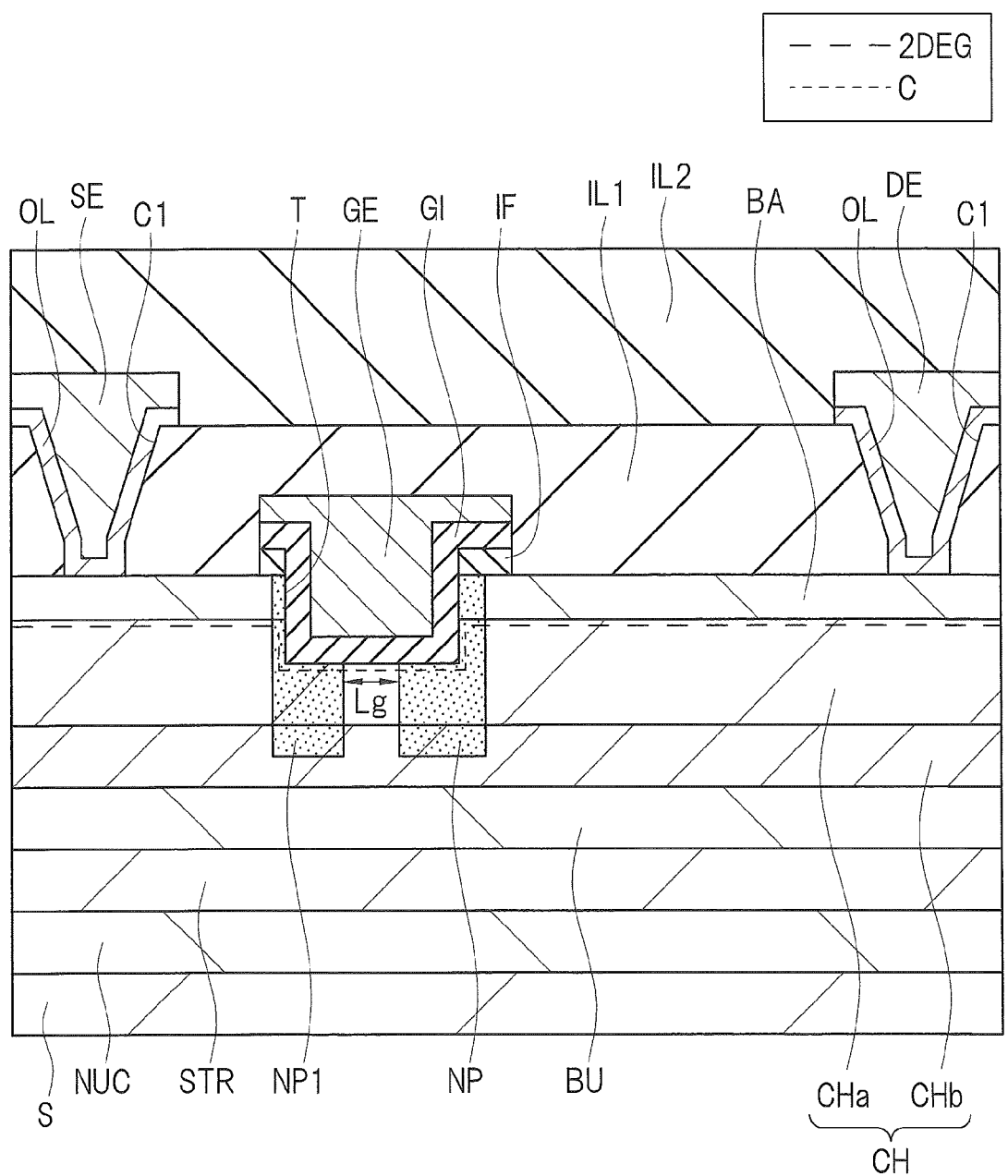
FIG. 44 is a sectional view showing a configuration of an application example 1 of the semiconductor device of the fourth embodiment.

FIG. 44 is a sectional view showing a configuration of an application example 1 of the semiconductor device of the present embodiment. In the embodiment shown in FIG. 38, the n-type high-concentration impurity region NP is formed only on the side surface portion of the trench T positioned on the drain electrode DE side, but the n-type high-concentration impurity region NP may be formed on a side surface portion of the trench T positioned on the source electrode SE side and on a side surface portion of the trench T positioned on the drain electrode DE side. In this manner, the on resistance of the recess edge portion on the source electrode side can also be reduced.

Since a point different from the embodiment shown in FIG. 38 is only the configuration of the n-type high-concentration impurity region NP, this point will be described in detail.

The semiconductor device of the application example 1 of the present embodiment shown in FIG. 44 has an n-type high-concentration impurity region NP1 in contact with a side surface portion of the trench T positioned on the source electrode SE side and an n-type high-concentration impurity region NP in contact with a side surface portion of the trench T positioned on the drain electrode DE side. The n-type high-concentration impurity regions NP1 and NP are regions in which impurities such as silicon (Si) ions are implanted into the channel layer CH (main channel layer CHa and channel lower layer CHb). The impurity concentration is a high concentration referred to as $n^+$, and it is a concentration whose maximum value is 4e18 ($4\times10^{18}$)/cm$^3$ or more.

As described above, the n-type high-concentration impurity region NP1 in contact with the side surface portion of the trench T positioned on the source electrode SE side and the n-type high-concentration impurity region NP in contact with the side surface portion of the trench T positioned on the drain electrode DE side are provided. As a result, the channel resistance Ras generated along the side surface of the trench T on the source electrode SE side and the channel resistance Rad (see FIG. 1) generated along the side surface of the trench T on the drain electrode DE side can be reduced.

Further, in the semiconductor device of the present embodiment, the gate length Lg is a distance between the n-type high-concentration impurity regions NP1 and NP (see FIG. 44).

Also in the high-concentration impurity region NP1, with the same intent as the embodiment shown in FIG. 38, it is preferred that a position of an end portion of the high-concentration impurity region NP1 positioned on the drain electrode DE side is located on the drain electrode DE side relative to the side surface portion of the gate electrode GE positioned on the source electrode SE side when seen from above. In this manner, in the portion of the gate length Lg in FIG. 44 where the MIS channel is formed, a distance between the MIS channel and a bottom surface of the gate electrode becomes constant, and a parallel flat plate structure is formed, so that ideal gate modulation can be realized.

Further, in the semiconductor device of the present embodiment, by adopting the nm/n structure in the channel layer CH, carries are spread to the back face side (also referred to as back side or buffer layer BU side) of the channel layer CH and the roughness scattering can be reduced in the vicinity of the channel C portion in the same manner as the case of the first embodiment. Therefore, the carrier mobility (here, electron mobility) in the vicinity of the channel C portion can be improved and the on resistances can be reduced.

The semiconductor device (FIG. 44) of the application example 1 can be formed through the same process as that of the semiconductor device shown in FIG. 38 (FIG. 39 to FIG. 43).

For example, the n-type high-concentration impurity regions NP on the source electrode SE side and the drain electrode DE side can be formed by providing two openings in the photoresist film PR1 serving as a mask at the ion implantation of Si ions.

APPLICATION EXAMPLE 2

Figure 45:
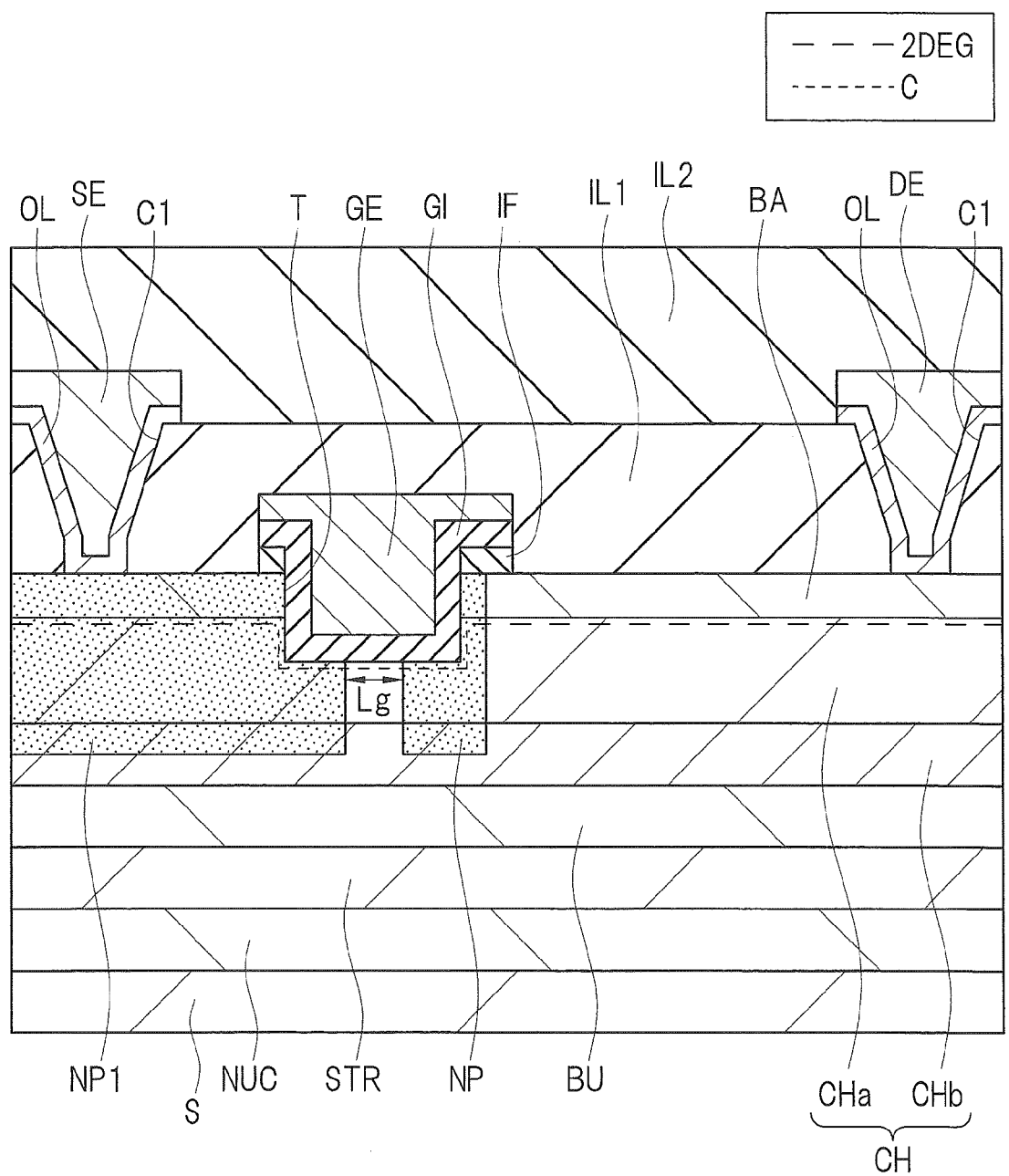
FIG. 45 is a sectional view showing a configuration of an application example 2 of the semiconductor device of the fourth embodiment.

FIG. 45 is a sectional view showing a configuration of an application example 2 of the semiconductor device of the present embodiment. In the application example 2, the n-type high-concentration impurity regions NP1 and NP are formed on a side surface portion of the trench T on the source electrode SE side and on a side surface portion of the trench T on the drain electrode DE side, and the n-type high-concentration impurity region NP1 on the source electrode SE side of the trench T is extended to reach a portion below the source electrode SE. In this manner, not only the on resistance of the recess edge portion on the source electrode side can be reduced but also an ohmic-access resistance of the source electrode can be reduced by a simultaneous process.

Since a point different from the embodiment shown in FIG. 38 and FIG. 44 is only the configuration of the n-type high-concentration impurity region NP1 on the source electrode SE side, this point will be described in detail.

In the semiconductor device of the application example 2 of the present embodiment shown in FIG. 45, the n-type high-concentration impurity region NP1 in contact with a side surface portion of the trench T on the source electrode SE side and the n-type high-concentration impurity region NP in contact with a side surface portion of the trench T on the drain electrode DE side are formed. The n-type high-concentration impurity regions NP1 and NP are regions in which impurities such as silicon (Si) ions are implanted into the channel layer CH (main channel layer CHa and channel lower layer CHb). The impurity concentration is a high concentration referred to as $n^+$, and it is a concentration whose maximum value is 4e18 ($4\times10^{18}$)/cm$^3$ or more.

Here, the n-type high-concentration impurity region NP1 on the source electrode SE side of the trench T is extended from the side surface portion of the trench T on the source electrode SE side to a portion below the source electrode SE.

The configuration in which impurities such as silicon (Si) ions are implanted into the portion below the source electrode SE (sheet resistance R2s portion between source and gate, also referred to as ohmic contact portion) in this manner may be adopted.

As a result, the channel resistance Ras generated along the side surface of the trench T on the source electrode SE side, the channel resistance Rad generated along the side surface of the trench T on the drain electrode DE side, the sheet resistance R2s between source and gate, and the source resistance Rcs (see FIG. 1) can be reduced.

Further, in the semiconductor device of the present embodiment, the gate length Lg is a distance between the n-type high-concentration impurity regions NP1 and NP (see FIG. 45).

Further, in the semiconductor device of the present embodiment, by adopting the nm/n structure in the channel layer CH, carries are spread to the back face side (also referred to as back side or buffer layer BU side) of the channel layer CH and the roughness scattering can be reduced in the vicinity of the channel C portion in the same manner as the case of the first embodiment. Therefore, the carrier mobility (here, the electron mobility) in the vicinity of the channel C portion can be improved and the on resistance can be reduced.

The semiconductor device of the application example 2 (FIG. 45) can be formed through the same process as that of the semiconductor device shown in FIG. 38 (FIG. 39 to FIG. 43).

For example, the n-type high-concentration impurity regions NP1 and NP on the source electrode SE side and the drain electrode DE side can be formed by providing two openings in the photoresist film PR1 serving as a mask at the ion implantation of Si ions. At this time, the width of the opening on the source electrode SE side is increased, and Si ions are implanted so as to reach the region in which the source electrode SE is to be formed.

APPLICATION EXAMPLE 3

In the semiconductor devices shown in FIG. 38, FIG. 44 and FIG. 45, the nm/n structure described in the first embodiment is applied as the channel layer CH, but other channel layers described in the second embodiment and the third embodiment may be applied as the channel layer CH.

The three-layered structure (nm/n/un) described in the second embodiment may be applied as the channel layers CH of the semiconductor devices shown in FIG. 38, FIG. 44 and FIG. 45.

In this case, the channel layer CH has a three-layered structure (nm/n/un) of a main channel layer CHa containing n-type impurities, a channel first lower layer CHb positioned below the main channel layer CHa and containing n-type impurities at a concentration higher than the impurity concentration of the main channel layer CHa, and an undoped channel second lower layer CHc positioned below the channel first lower layer CHb (see FIG. 24).

Then, for the trench T penetrating through the insulating film IF and the barrier layer BA to reach the middle of the main channel layer CHa, an n-type high-concentration impurity region NP1 or NP is provided on a side surface portion of the trench T positioned on the source electrode SE side or the drain electrode DE side.

Alternatively, the two-layered structure (n/un) described in the third embodiment may be applied as the channel layers CH of the semiconductor devices shown in FIG. 38, FIG. 44 and FIG. 45.

In this case, the channel layer CH has a two-layered structure (nm/un) of a main channel layer CHA containing low-concentration n-type impurities and an undoped channel lower layer CHB positioned below the main channel layer CHA.

Then, for the trench T penetrating through the insulating film IF and the barrier layer BA to reach the middle of the main channel layer CHA, an n-type high-concentration impurity region NP1 or NP is provided on a side surface portion of the trench T positioned on the source electrode SE side or the drain electrode DE side.

In the configuration of the application example 3, since the undoped channel second lower layer CHc or the undoped channel lower layer CHB is present, influence of the implanted ions (here, Si ions) on the buffer layer BU can be reduced.

(Fifth Embodiment)

Figure 46:
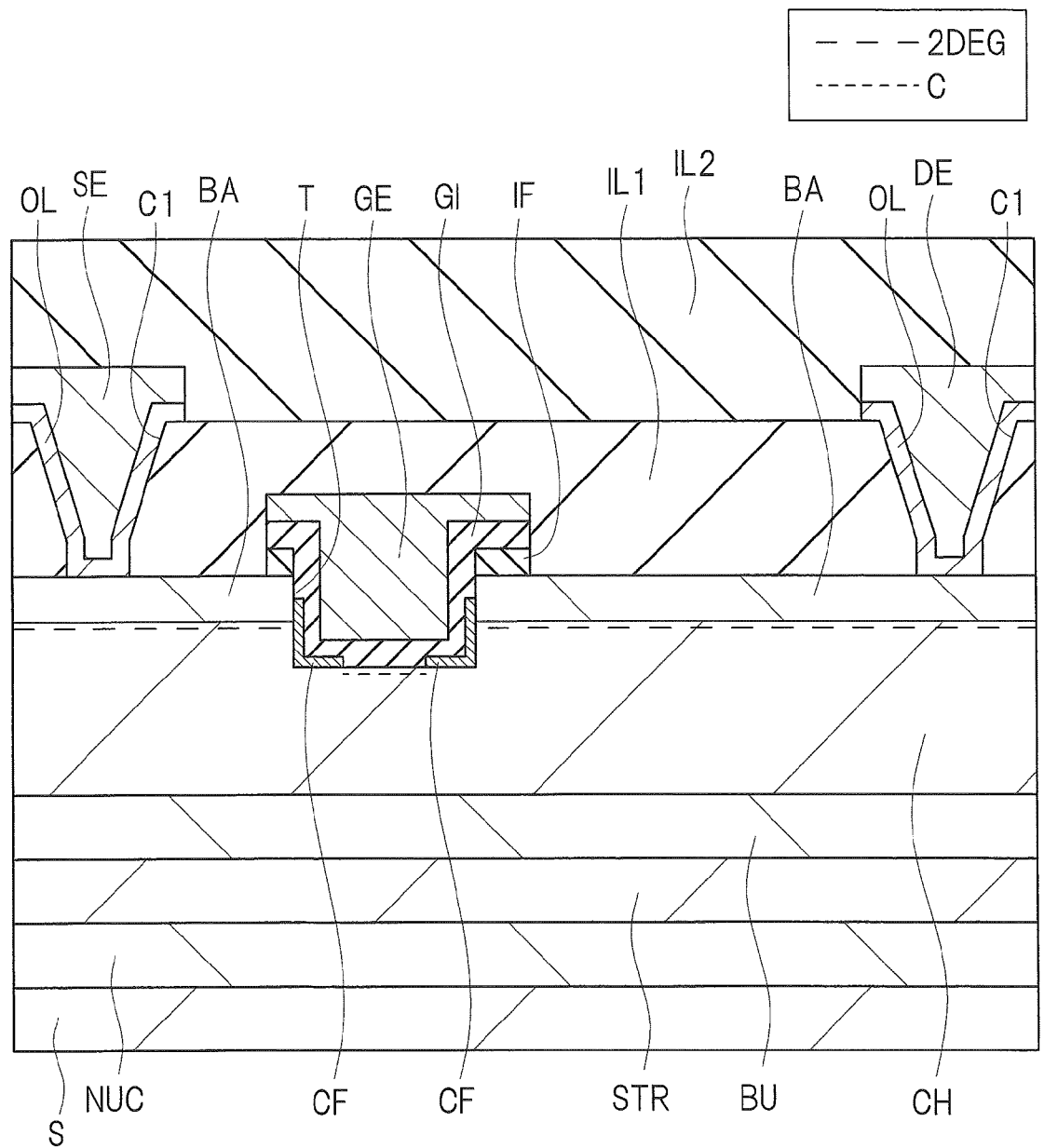
FIG. 46 is a sectional view showing a configuration of a semiconductor device of a fifth embodiment.

Hereinafter, a semiconductor device of the fifth embodiment will be described in detail with reference to the drawings. FIG. 46 is a sectional view showing a configuration of the semiconductor device of the present embodiment.

[Description of Structure]

The semiconductor device shown in FIG. 46 is a MIS (Metal Insulator Semiconductor) type field effect transistor (FET) using nitride semiconductor. The semiconductor device is also referred to as high electron mobility transistor (HEMT) or power transistor. The semiconductor device of the present embodiment is a so-called recess gate type semiconductor device.

The semiconductor device of the present embodiment has a stacked body (nitride semiconductor layer) in which a nucleation layer NUC, a strain relaxing layer STR, a buffer layer BU, a channel layer (also referred to as electron transit layer) CH and a barrier layer BA are sequentially formed on a substrate S.

Further, a gate electrode GE of the semiconductor device of the present embodiment is formed, via an insulating film GI, inside a trench dug so as to penetrate through an insulating film IF and the barrier layer BA to reach the middle of the channel layer CH.

Furthermore, a source electrode SE and a drain electrode DE of the semiconductor device of the present embodiment are formed on the barrier layer BA on both sides of the gate electrode GE.

This semiconductor device will be described below in detail. As shown in FIG. 46, in the semiconductor device of the present embodiment, the nucleation layer NUC is formed on the substrate S and the strain relaxing layer STR is formed on the nucleation layer NUC. The nucleation layer NUC is formed in order to produce crystal nuclei for the growth of a layer to be formed above such as the strain relaxing layer STR. Further, the nucleation layer NUC is formed in order to prevent the substrate S from converting due to diffusion of constituent elements (for example, Ga or the like) in the layer to be formed above into the substrate S. Further, the strain relaxing layer STR is formed in order to relax stress to the substrate S, thereby suppressing occurrence of warp of the substrate S or a crack therein.

The buffer layer BU is formed on the strain relaxing layer STR, the channel layer (also referred to as electron transit layer) made of nitride semiconductor is formed on the buffer layer BU, and the barrier layer BA made of nitride semiconductor is formed on the channel layer CH. More specifically, the buffer layer BU, the channel layer CH, and the barrier layer BA are sequentially formed (stacked) on a main surface (upper surface) of the strain relaxing layer STR in this order from below. The source electrode SE and the drain electrode DE are formed on the barrier layer BA via ohmic layers OL, respectively. The buffer layer BU is an intermediate layer positioned between the channel layer CH and the strain relaxing layer STR.

The gate electrode GE is formed, via the gate electrode GI, inside a trench (also referred to as recess or concave portion) T dug so as to penetrate through the insulating film IF and the barrier layer BA to reach the middle of the channel layer CH.

Here, in the present embodiment, conductive films (also referred to as conductive region) CF are provided so as to cover corner portions corresponding to end portions of the bottom surface of the trench T. Therefore, the gate electrode GE is disposed, via the gate insulating film GI, on inner walls (side surface and bottom surface) of the trench T including surfaces of the conductive films CF.

The source electrode SE and the drain electrode DE are formed on the barrier layer BA on both sides of the gate electrode GE. The source electrode SE and the drain electrode DE are formed so as to be connected to the barrier layer BA, respectively. Since this connection is made via the ohmic layer OL as described above, the ohmic connection is formed.

An insulating layer IL1 is formed on the gate electrode GE. Further, the source electrode SE and the drain electrode DE are formed in contact holes formed in the insulating layer IL1 and on the contact holes. An insulating layer IL2 is formed on the insulating layer IL1, the source electrode SE and the drain electrode DE.

In the present embodiment, two dimensional electron gas 2DEG is produced on the channel layer side in the vicinity of the interface between the channel layer CH and the barrier layer BA. Further, when a positive potential (threshold potential) is applied to the gate electrode GE, a channel C is formed in the vicinity of the interface between the gate electrode GE and the channel layer CH. Note that, at the time of operation, a positive potential (threshold potential) is applied to the gate electrode GE, and the source potential is set to, for example, 0 V and the drain potential is set at, for example, the power source potential.

The above-described two dimensional electron gas 2DEG is formed by the following mechanism. The nitride semiconductors (here, gallium nitride-based semiconductor) constituting the channel layer CH and the barrier layer BA are different in forbidden band width (band gap) and electron affinity from each other. Therefore, well-type potential is generated in a junction surface between these semiconductors. Electrons are accumulated in the well-type potential, so that two dimensional electron gas 2DEG is generated in the vicinity of the interface between the channel layer CH and the barrier layer BA.

The two dimensional electron gas 2DEG formed in the vicinity of the interface between the channel layer CH and the barrier layer BA is split by the trench T in which the gate electrode GE is formed. Therefore, in the semiconductor device of the present embodiment, an off state can be maintained in a state where a positive potential (threshold potential) is not applied to the gate electrode GE, and an on state can be maintained in a state where a positive potential (threshold potential) is applied to the gate electrode GE. Thus, the normally-off operation can be performed.

Here, in the present embodiment, since the conductive films CF are provided so as to cover the corner portions corresponding to the end portions of the bottom surface of the trench T, a resistance (on resistance, also referred to as Ron) between the source electrode SE and the drain electrode DE in the state where the positive potential (threshold potential) is applied to the gate electrode GE can be reduced.

Figure 47:
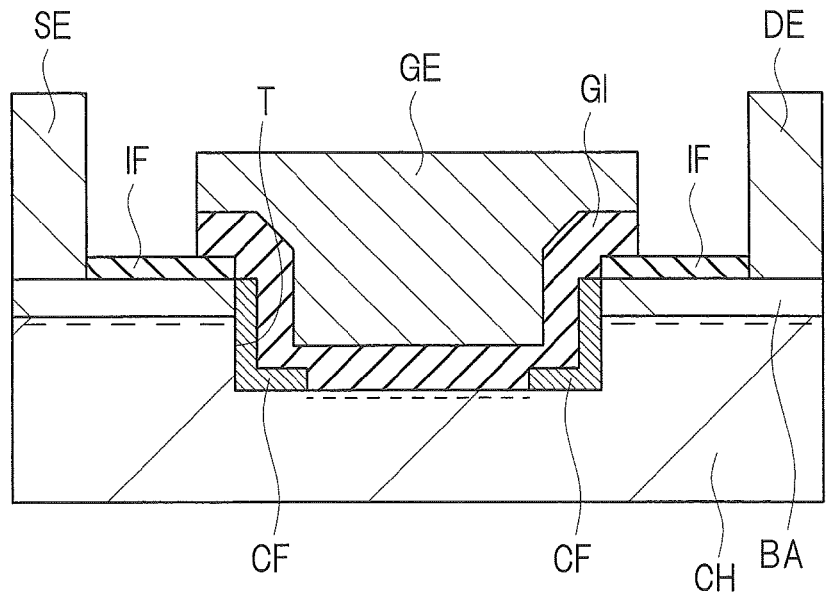
FIG. 47 is a sectional view schematically showing a configuration of a trench portion of the semiconductor device of the fifth embodiment.

FIG. 47 is a sectional view schematically showing a configuration of a trench portion of the semiconductor device of the present embodiment. As shown in FIG. 47, the conductive films CF are provided at corner portions corresponding to the end portions of the bottom surface of the trench T. Here, a sectional shape of the conductive film CF is L shape (or inverted L shape). The conductive film CF has a vertical portion (also referred to as longitudinal portion or first portion) extending along a side surface of the trench T and a horizontal portion (also referred to as lateral portion or second portion) extending along the bottom surface of the trench T. Here, the vertical portion of the conductive film CF extends up to the two dimensional electron gas 2DEG (interface between the channel layer CH and the barrier layer BA) along the side surface of the trench T.

By providing the conductive films CF in this manner, a current path reaching the drain electrode DE from the channel C through the conductive film CF and the two dimensional electron gas 2DEG is formed, and the on resistance between the channel C and the drain electrode DE can be reduced. Further, by providing the conductive films CF, a current path reaching the source electrode SE from the channel C through the conductive film CF and the two dimensional electron gas 2DEG is formed, and the on resistance between the channel C and the source electrode SE can be reduced.

Figure 48:
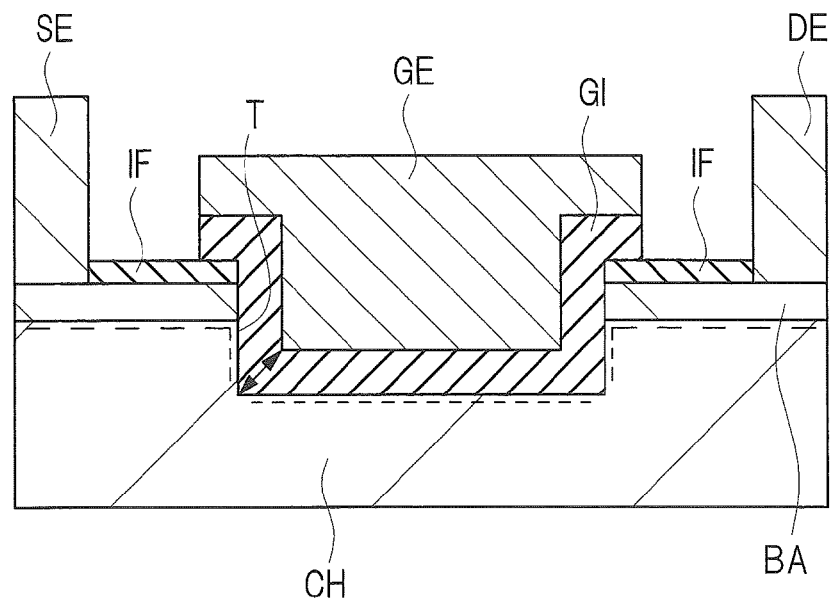
FIG. 48 is a sectional view schematically showing a configuration of a trench portion of a semiconductor device of a comparative example.

FIG. 48 is a sectional view schematically showing a configuration of a trench portion of a semiconductor device of a comparative example. In the semiconductor device of the comparative example shown in FIG. 48, the conductive films CF are not provided, and the gate electrode GE is provided inside the trench T via the gate insulating film GI. In such a case, the gate insulating film GI is directly disposed at corner portions corresponding to the end portions of the bottom surface of the trench T, and the film thickness thereof becomes large. For example, when the gate insulating film GI having almost equal film thickness Th is formed on a side surface and a bottom surface of the trench T, the film thickness of the gate insulating film GI at the corner portion becomes $\sqrt{2}Th$ ($>Th$) (see arrow in FIG. 48).

Therefore, the channel C becomes difficult to be formed at the corner portions. As a result, the resistance of the channel C is increased and the on resistance is also increased. Though it is conceivable that the gate insulating film GI at the corner portions is thinned in order to suppress the increase of the on resistance, a process of partially thinning the gate insulating film GI is complicated, and it is difficult to achieve the suppression of the on resistance by such a method.

On the other hand, in the present embodiment, since the conductive films CF are provided on the corner portions corresponding to the end portions of the bottom surface of the trench T, the current path extending from the channel C to reach the two dimensional electron gas 2DEG through the conductive film CF can be formed, so that the on resistance can be reduced. More specifically, the on resistance can be reduced without depending on the film thickness of the gate insulating film GI at the corner portions corresponding to the end portions of the bottom surface of the trench T.

Figure 49:
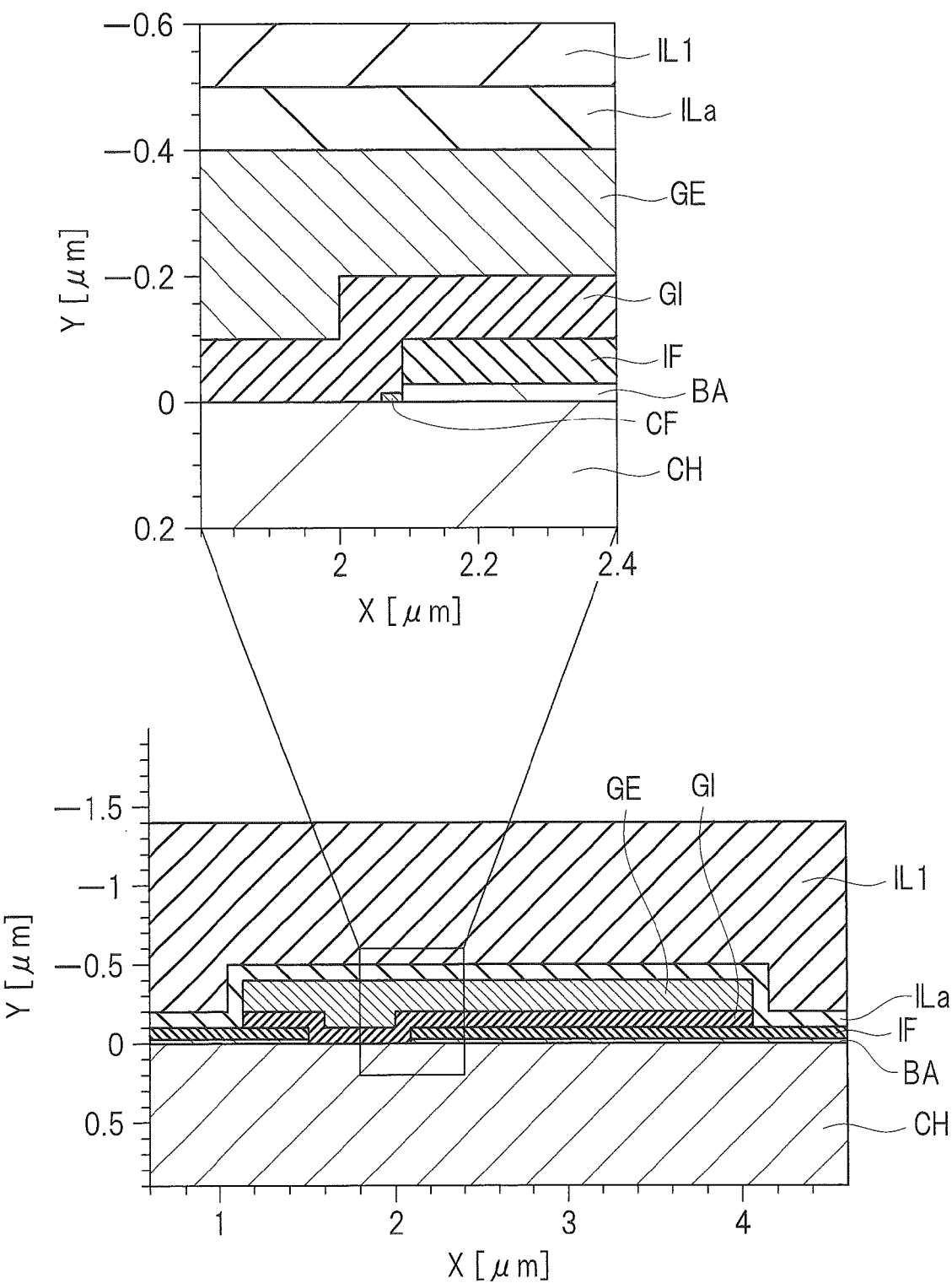
FIG. 49 is a sectional view schematically showing a configuration of a semiconductor device used for simulation of the fifth embodiment.
Figure 50:
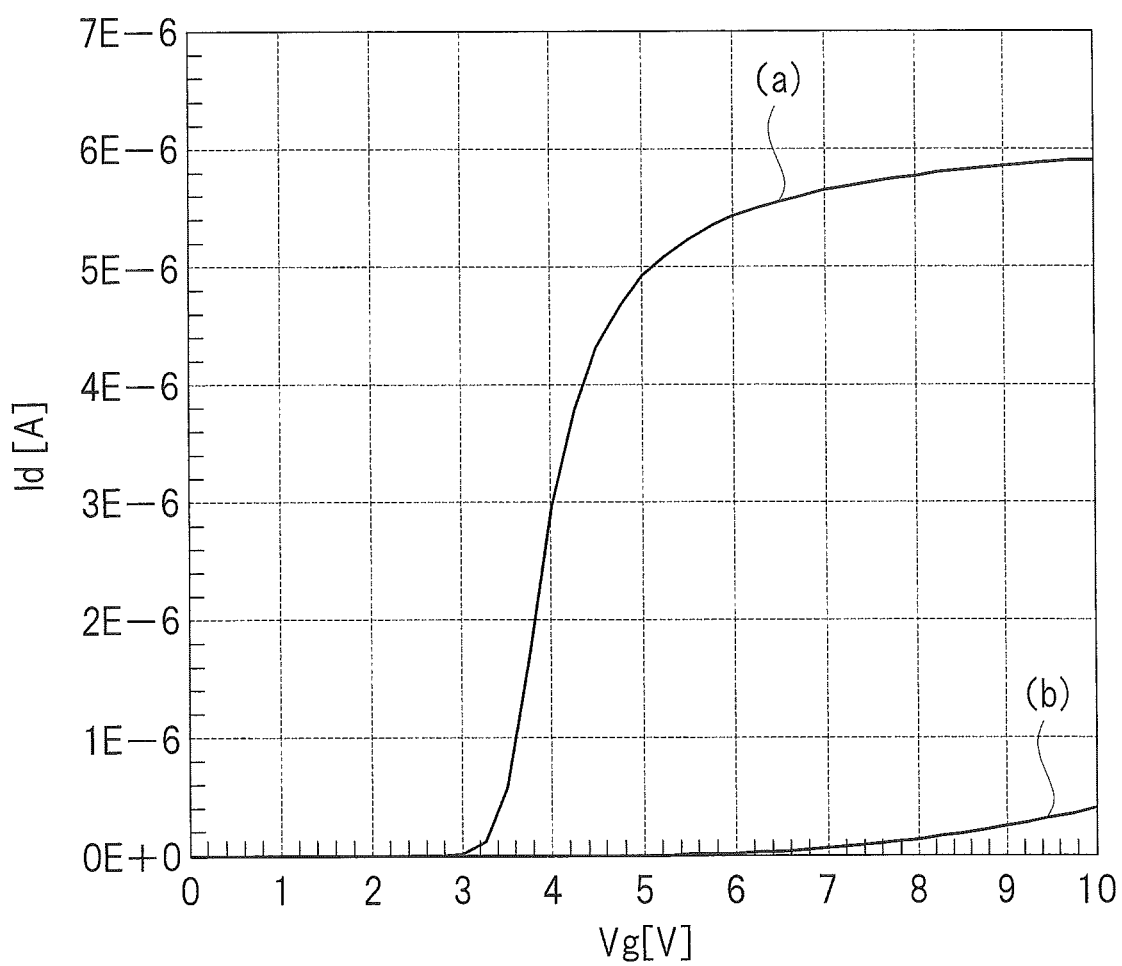
FIG. 50 is a graph showing relationships between the gate voltage and the drain current of the semiconductor device of the fifth embodiment and the semiconductor device of the comparative example.

Next, a simulation result of the semiconductor device of the present embodiment will be described. FIG. 49 is a sectional view schematically showing a configuration of a semiconductor device used for the simulation of the present embodiment. FIG. 50 is a graph showing relationships between the gate voltage and the drain current of the semiconductor device of the present embodiment and the semiconductor device of the comparative example. In the graph, a curve (a) shows characteristic of the semiconductor device of the present embodiment and a curve (b) shows characteristic of the semiconductor device of the comparative example.

As shown in FIG. 49, in the semiconductor device used in the simulation, the conductive films CF are provided at the corner portions corresponding to the end portions of the bottom surface of the trench T, and the gate electrode GE is disposed on the inner walls (side surfaces and bottom surface) of the trench T including the surfaces of the conductive films CF via the gate insulating film GI. In FIG. 49, a vertical axis represents a length [μm] in a Y direction (vertical direction in FIG. 49), and a horizontal axis represents a length [μm] in an X direction (lateral direction in FIG. 49). As the conductive film CF, silicon (Si) with phosphorus concentration of 1E22/cm$^3$ ($1 \times 10^{22}$/cm$^3$) is used, and as the gate electrode GE, titanium nitride is used. Further, the two dimensional electron gas 2DEG on the source electrode SE side is fixed to a reference potential (0 V). The on resistance (Ron) can be calculated by setting a low drain voltage (for example, 0.1 V) so that the transistor operates as a triode, measuring the drain current in the case where the transistor is in on state, and then dividing the measured drain current by the drain voltage. Note that ILa in FIG. 49 is an insulating film.

A vertical axis in the graph shown in FIG. 50 represents a drain current (Id) [A], and a horizontal axis represents a gate voltage (Vg) [V]. As shown in FIG. 50, in a curve (a), that is, in the semiconductor device of the present embodiment in which the conductive films CF are provided at the corner portions corresponding to the end portions of the bottom surface of the trench T, the drain current (Id) rapidly rises at the gate voltage (Vg) of 3.5 V or more. On the other hand, in a curve (b), that is, in the semiconductor device of the comparative example in which no conductive film CF is provided, even when the gate electrode (Vg) reaches 3.5 V or more, the drain current (Id) does not rise. Also from this simulation result, it can be confirmed that the drain current (Id) is greatly increased and the on resistance (Ron) can be reduced in the semiconductor device of the present embodiment.

[Description of Manufacturing Method]

Next, a manufacturing method of the semiconductor device of the present embodiment will be described with reference to FIG. 51 to FIG. 60 and the configuration of the semiconductor device will be further clarified. FIG. 51 to FIG. 60 are sectional views showing the manufacturing process of the semiconductor device of the present embodiment.

Figure 51:
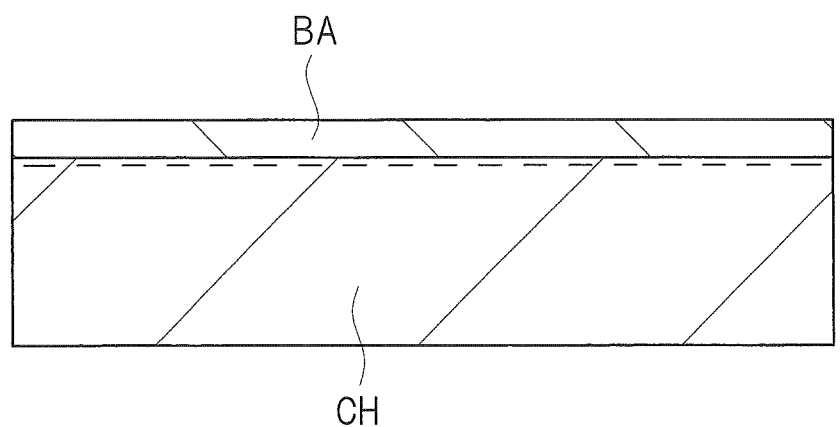
FIG. 51 is a sectional view showing a manufacturing process of the semiconductor device of the fifth embodiment.

As shown in FIG. 51, a channel layer CH and a barrier layer BA are formed over a substrate S. Note that, as described with reference to FIG. 46, the nucleation layer NUC, the strain relaxing layer STR, the buffer layer BU, the channel layer (also referred to as electron transit layer) CH and the barrier layer BA are sequentially formed on the substrate S.

As the substrate S, for example, a semiconductor substrate made of silicon (Si) whose (111) surface is exposed is used, and for example, an aluminum nitride (AlN) layer is hetero-epitaxially grown as the nucleation layer NUC on the semiconductor substrate S by using metal organic chemical vapor deposition (MOCVD) method or the like. Next, a superlattice structure obtained by repeatedly stacking stacked films (AlN/GaN film) of a gallium nitride (GaN) layer and an aluminum nitride (AlN) layer is formed as the strain relaxing layer STR on the nucleation layer NUC. For example, the gallium nitride (GaN) layer and the aluminum nitride (AlN) layer each having a film thickness of about 2 to 3 nm are repeatedly hetero-epitaxially grown so that the numbers of layers reach about 100 (total of 200 layers) by using the MOCVD method or the like. Note that, as the substrate S, a substrate made of SiC, sapphire or the like may be used instead of the above-described silicon.

Next, a buffer layer BU is formed on the strain relaxing layer STR. For example, an AlGaN layer is hetero-epitaxially grown as the buffer layer BU on the strain relaxing layer STR by using the MOCVD method or the like.

Next, as shown in FIG. 51, a channel layer CH is formed on the buffer layer BU. For example, a gallium nitride (GaN) layer is hetero-epitaxially grown on the buffer layer BU by using MOCVD or the like.

Next, for example, an AlGaN layer is hetero-epitaxially grown on the channel layer CH as the barrier layer BA by using MOCVD method or the like. The barrier layer BA is nitride semiconductor having a band gap wider than that of the channel layer CH.

The stacked body of the buffer layer BU, the channel layer CH, and the barrier layer BA is formed in this manner. The stacked body is formed by the above-described hetero-epitaxial growth, that is, a group-III plane growth stacking in the [0001] crystal axis (C axis) direction. In other words, the above-described stacked body is formed by (0001) Ga plane growth. Two dimensional electron gas 2DEG is produced in the vicinity of the interface between the channel layer CH and the barrier layer BA in the stacked body.

Figure 52:
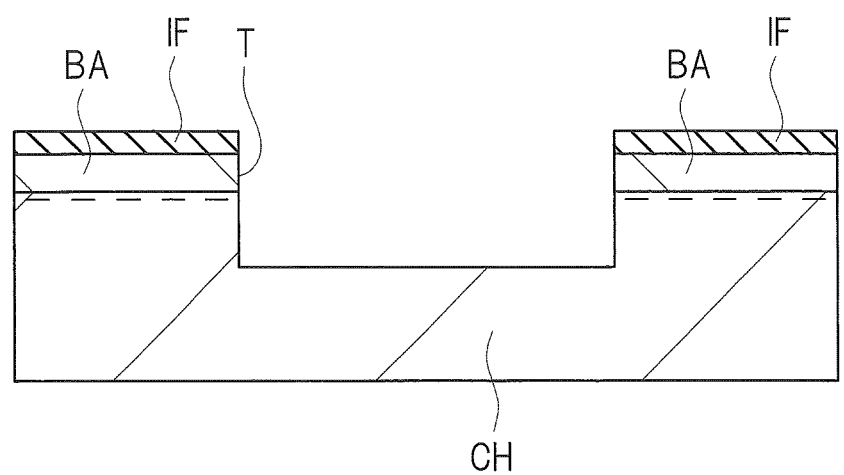
FIG. 52 is a sectional view showing the manufacturing process of the semiconductor device of the fifth embodiment.

Next, as shown in FIG. 52, an insulating film IF having an opening is formed on the barrier layer BA. For example, a silicon nitride film is deposited as the insulating film IF on the barrier layer BA by using thermal CVD (chemical vapor deposition) method or the like. Next, an opening is formed in the insulating film IF by using photolithography technique and etching technique.

Next, a trench T penetrating through the insulating film IF and the barrier layer BA to reach the middle of the channel layer CH is formed by etching the barrier layer BA and the channel layer CH with using the insulating film IF as a mask. After the etching, thermal treatment (annealing) may be performed for the recovery from etching damage.

Figure 53:
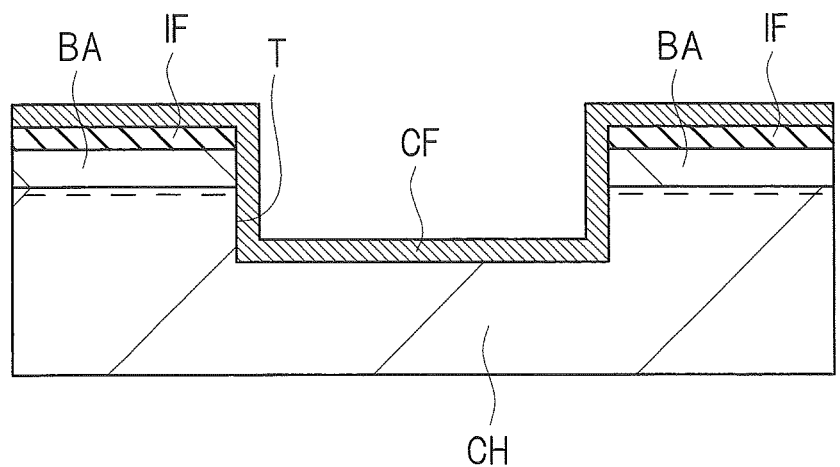
FIG. 53 is a sectional view showing the manufacturing process of the semiconductor device of the fifth embodiment.

Next, as shown in FIG. 53, a conductive film CF is formed on the insulating film IF including inside of the trench T. For example, as the conductive film CF, a polycrystalline silicon film is formed by CVD method or the like. As the conductive film CF, a polycrystalline silicon film doped with impurities (for example, n-type impurities) may be used. Further, as the conductive film CF, a metal film made of titanium, aluminum or gold or an alloy film containing these metals may be used instead of the polycrystalline silicon film. These films can be formed by using, for example, sputtering method or the like.

Figure 54:
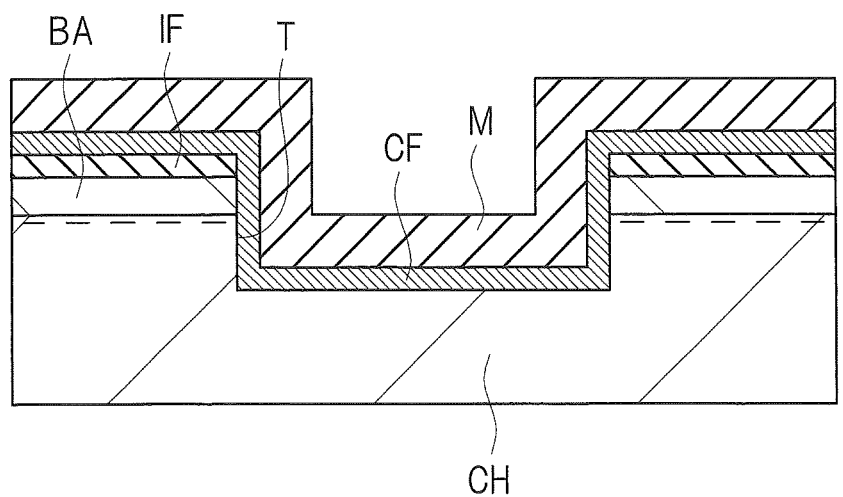
FIG. 54 is a sectional view showing the manufacturing process of the semiconductor device of the fifth embodiment.
Figure 55:
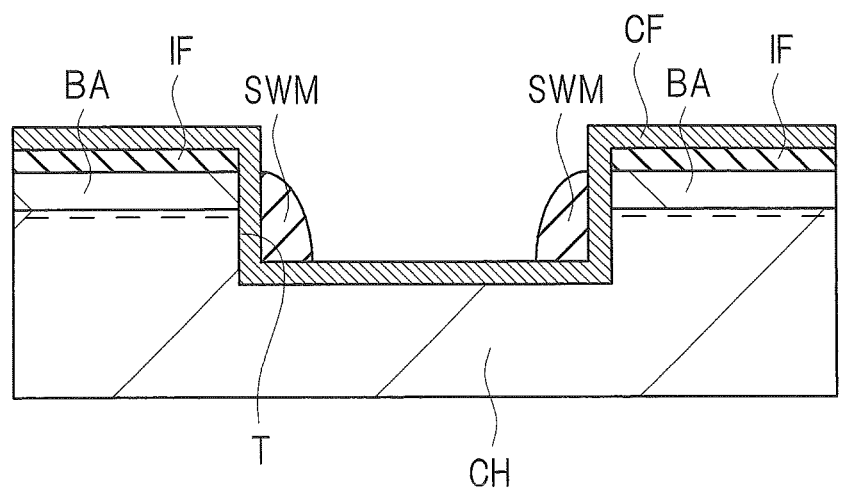
FIG. 55 is a sectional view showing the manufacturing process of the semiconductor device of the fifth embodiment.

Next, as shown in FIG. 54, an insulating film such as a silicon oxide film is formed as a mask film M on the conductive film CF by using CVD method or the like. As the insulating film, a silicon nitride film or the like may be used other than the silicon oxide film. Next, as shown in FIG. 55, by etching back the mask film M, sidewall films (sidewall insulating films) SWM are formed on sidewall portions of the trench T. In this etch back step, for example, the mask M is removed from the surface thereof by a predetermined film thickness by anisotropic dry etching. By this step, the mask film M is left in the form of sidewalls (sidewall shape) on the sidewall portions of the trench T, so that the sidewall films SWM can be formed. It is preferred that the heights of the sidewall films SWM are higher than the surface of the channel layer CH (interface between the channel layer CH and the barrier layer BA). For this reason, it is preferred that the film thickness and the etch back conditions of the mask film M are set so as to achieve such heights. Furthermore, it is preferred that the thickness (maximum film thickness in the gate length direction) of the sidewall film SWM is positioned inside the sidewall of the gate electrode GE described later. Therefore, it is preferred that the film thickness and the etch back conditions of the mask film M are set so as to achieve such a thickness. By the etch back step, the conductive film CF on the insulating film IF and the conductive film CF on the bottom surface of the trench T are exposed.

Figure 56:
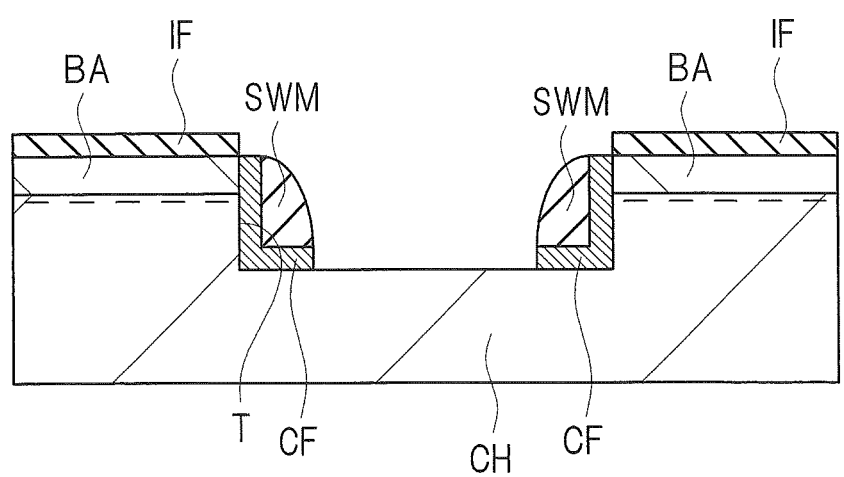
FIG. 56 is a sectional view showing the manufacturing process of the semiconductor device of the fifth embodiment.

Next, as shown in FIG. 56, the conductive film CF is removed with using the sidewall films SWM as masks. In this manner, the conductive films CF can be left only at the corner portions corresponding to the end portions of the bottom surface of the trench T. The sectional shape of the conductive film CF is, for example, L shape (or inverted L shape). In the conductive film CF, a portion extending along the side surface of the trench T is defined as a vertical portion (also referred to as longitudinal portion or first portion) and a portion extending along the bottom surface of the trench T is defined as a horizontal portion (also referred to as lateral portion or second portion). In the present embodiment, the sectional shape of the conductive film CF is L shape (or inverted L shape). More specifically, the length of the horizontal portion is larger than the film thickness of the vertical portion. The film thickness of the vertical portion indicates a thickness in the gate length direction of the conductive film CF extending along the side surface of the trench T.

Figure 61:
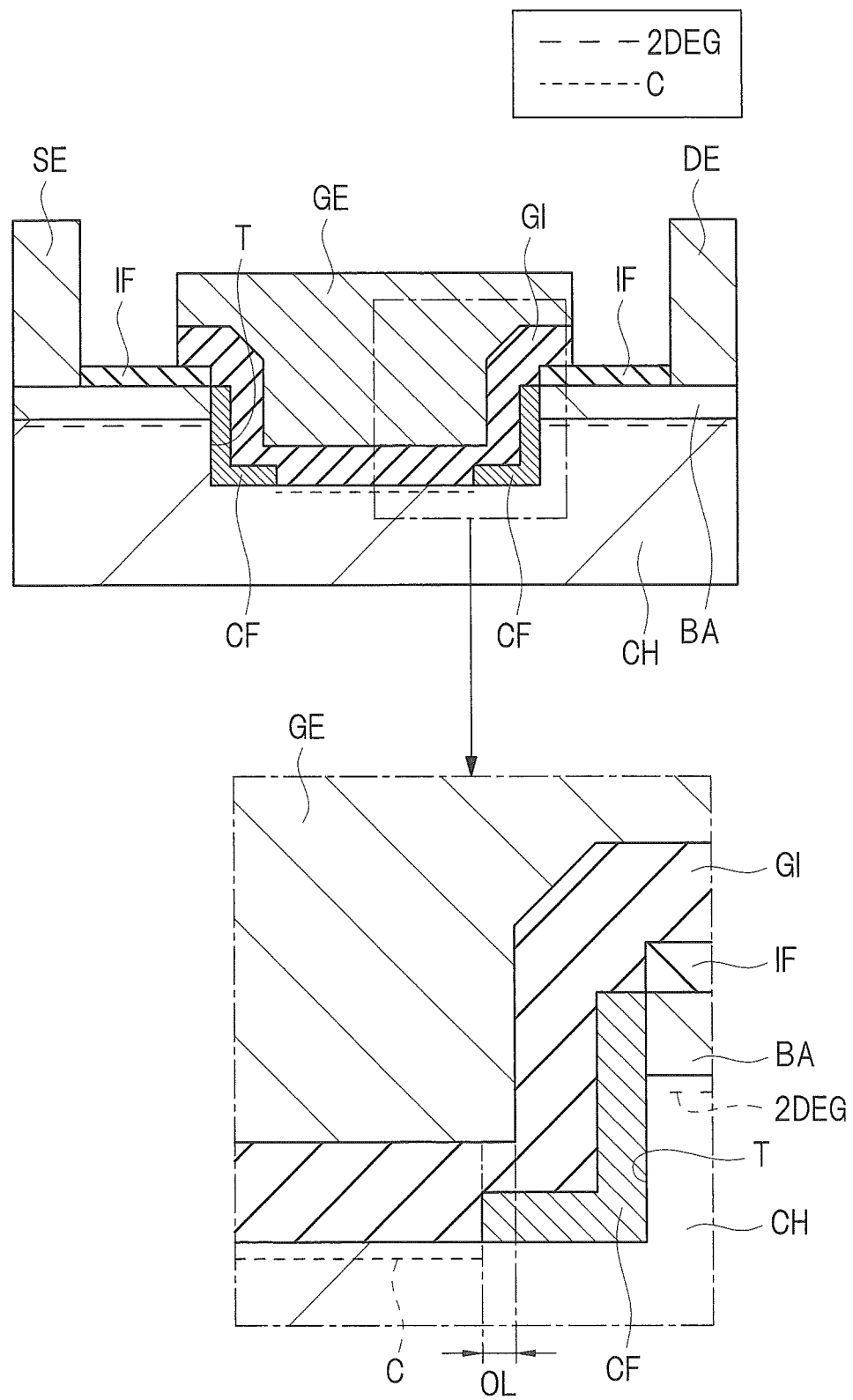
FIG. 61 is a sectional view of the semiconductor device of the fifth embodiment and a partially enlarged view of the vicinity of a conductive film of the semiconductor device.

It is preferred that the height of the vertical portion of the conductive film CF is higher than the surface (interface between the channel layer CH and the barrier layer BA) of the channel layer CH. Further, it is preferred that the length of the horizontal portion of the conductive film CF reaches inside of the sidewall of the gate electrode GE described later (see FIG. 61 shown below and the description thereof).

Figure 57:
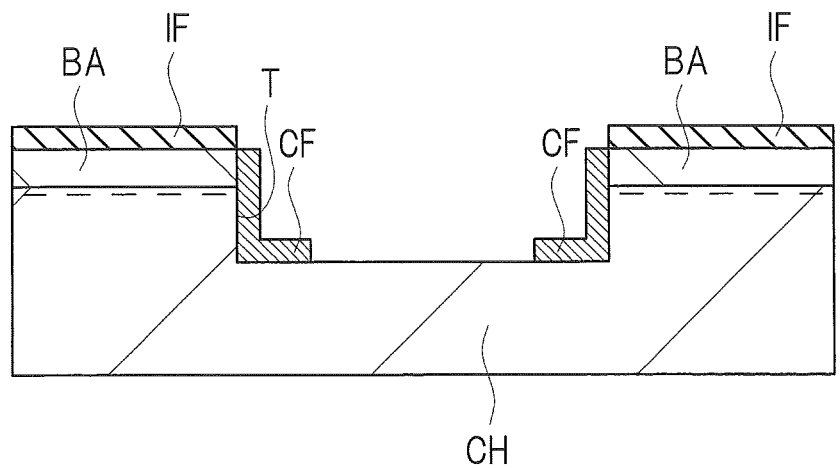
FIG. 57 is a sectional view showing the manufacturing process of the semiconductor device of the fifth embodiment.
Figure 58:
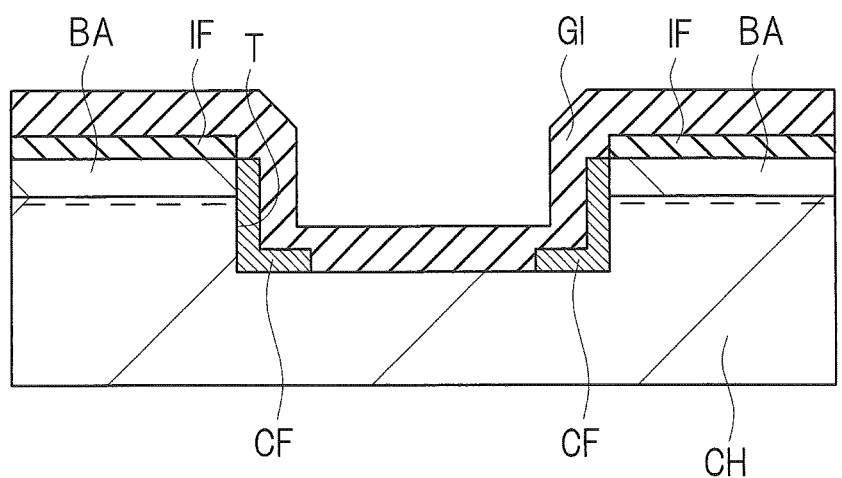
FIG. 58 is a sectional view showing the manufacturing process of the semiconductor device of the fifth embodiment.

Next, as shown in FIG. 57, the sidewall films SWM are removed by etching. Next, as shown in FIG. 58, a gate insulating film GI is formed on the insulating film IF including inside of the trench T in which the conductive films CF are formed. For example, alumina (aluminum oxide film, $Al_2O_3$) is deposited as the gate insulating film GI on the insulating film IF including inside of the trench T by using CVD method or the like. When the deposition method such as CVD method is used, film material is deposited isotropically. At this time, since the conductive films CF are formed at the corner portions corresponding to the end portions of the bottom surface of the trench T, it is possible to prevent the gate insulating film GI from being thick at the corner portions. As described above, the film thickness difference in the gate insulating film GI can be reduced.

As the gate insulating film GI, a silicon oxide film or a high dielectric constant film having dielectric constant higher than that of a silicon oxide film may be used instead of the alumina. As the high dielectric constant film, a hafnium oxide film ($HfO_2$ film) may be used. Further, as the high dielectric constant film, other hafnium-based insulating film such as a hafnium aluminate film, an HfON film (hafnium oxynitride film), an HfSiO film (hafnium silicate film), an HfSiON film (hafnium silicon oxynitride film), and an HfAlO film can be used.

Figure 59:
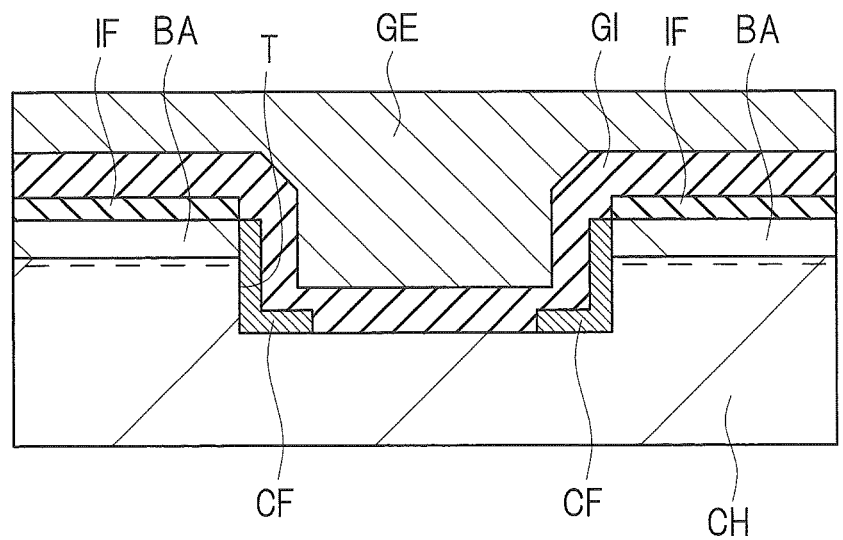
FIG. 59 is a sectional view showing the manufacturing process of the semiconductor device of the fifth embodiment.
Figure 60:
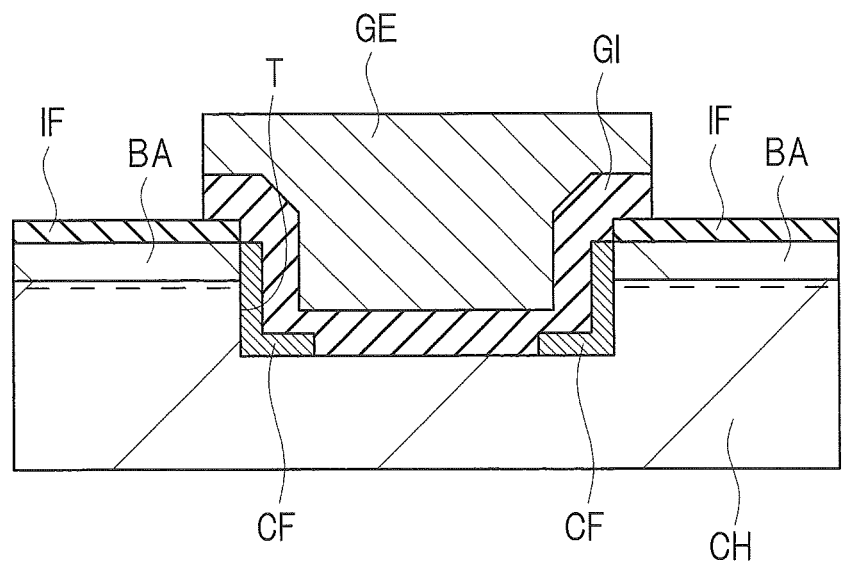
FIG. 60 is a sectional view showing the manufacturing process of the semiconductor device of the fifth embodiment.

Next, as shown in FIG. 59, a gate electrode GE is formed on the gate insulating film GI. For example, a stacked film (also referred to as Au/Ni film) composed of a nickel (Ni) film and a gold (Au) film positioned thereon is deposited as the conductive film by using sputtering method or the like on the gate insulating film GI so as to have a film thickness capable of filling the inside of the trench T. Next, as shown in FIG. 60, by patterning the Au/Ni film by using photolithography technique and etching technique, the gate electrode GE is formed. Note that, when the Au/Ni film is etched, the gate insulating film GI below the Au/Ni film may be etched. Further, as the formation material of the gate electrode GE, a titanium nitride film or the like can be used instead of the Au/Ni film. Further, a metal film other than the Au/Ni film may be used, and a polycrystalline silicon film containing impurities or the like may be used.

Next, as shown in FIG. 61, for example, a silicon oxide film is formed as an insulating layer (not shown) on the gate electrode GE by using CVD method or the like, and a source electrode SE and a drain electrode DE are formed in the insulating layer via ohmic layers (not shown). For example, as shown in FIG. 46, by using photolithography technique and etching technique, the insulating layer IL1 on the barrier layer BA on the both sides of the gate electrode GE is removed by etching to form contact holes C1. On the insulating layer IL1 including inside of the contact holes C1, the source electrode SE and the drain electrode DE are formed via the ohmic layers OL. For example, a stacked film (also referred to as Al/Ti film) composed of a titanium (Ti) film and an aluminum (Al) film positioned thereon is deposited on the insulating layer IL1 including insides of the contact holes C1 by vapor deposition method or the like. Further, for example, a stacked film (also referred to as TiN/Ti film) composed of a titanium (Ti) film and a titanium nitride (TiN) film positioned thereon is deposited on the Al/Ti film by using sputtering method or the like. In this manner, the stacked film (also referred to as TiN/Ti/Al/Ti film) composed of the titanium (Ti) film, the aluminum (Al) film, the titanium (Ti) film, and the titanium nitride (TiN) film is formed, and thermal treatment is performed at a temperature of, for example, 550° C. for about 30 minutes. The ohmic contact is provided by this heat treatment as the contact between the TiN/Ti/Al/Ti film and the GaN-based semiconductor interface. Next, an aluminum alloy film is deposited on the TiN/Ti/Al/Ti film (ohmic layer OL) by using sputtering method or the like. As the aluminum alloy, for example, an alloy of Al and Si (Al—Si), an alloy of Al and Cu (copper) (Al—Cu), an alloy of Al, Si and Cu (Al—Si—Cu) or the like can be used. Next, by patterning the TiN/Ti/Al/Ti film and the aluminum alloy film by using photolithography technique and etching technique, the source electrode SE and the drain electrode DE are formed in the contact holes C1 via the ohmic layers OL (see FIG. 46).

Thereafter, an insulating layer (also referred to as cover film or surface protection film) IL2 is formed on the insulating layer IL1 including regions on the source electrode SE and the drain electrode DE. For example, as the insulating layer IL2, a silicon oxynitride (SiON) film is deposited by using CVD method or the like (see FIG. 46).

Through the process described above, the semiconductor device of the present embodiment can be formed.

The above-described manufacturing process is shown by way of example only, and the semiconductor device of the present embodiment may be manufactured through the process other than the process described above.

(Sixth Embodiment)

Figure 62A:
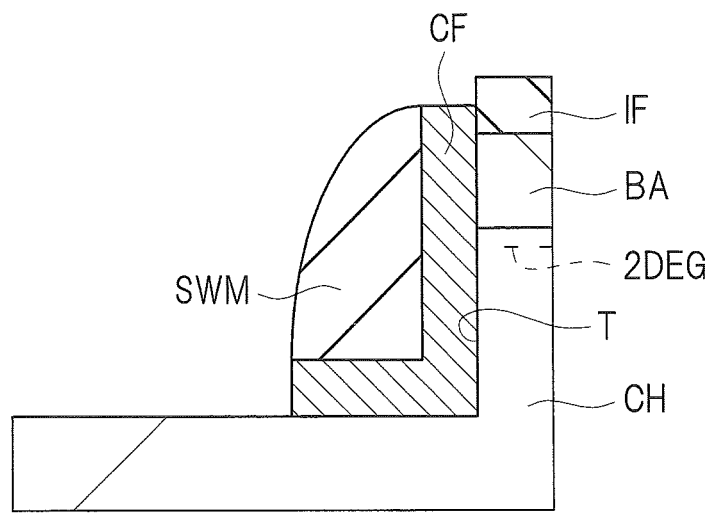
FIG. 62A is a sectional view showing a manufacturing process of a semiconductor device of a first example of a sixth embodiment and a configuration of the vicinity of a conductive film.
Figure 62B:
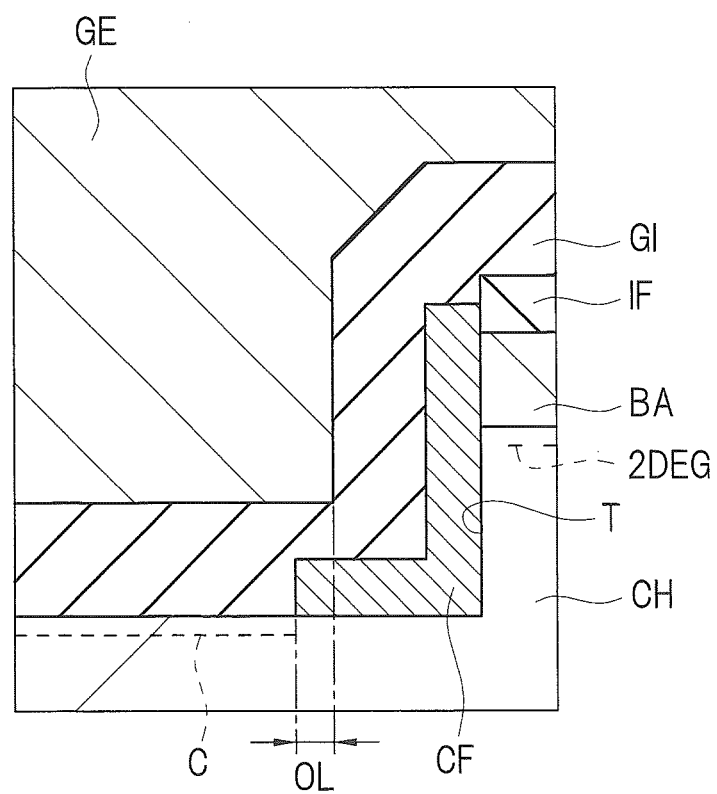
FIG. 62B is a sectional view showing a manufacturing process of a semiconductor device of the first example of the sixth embodiment and a configuration of the vicinity of the conductive film.
Figure 63A:
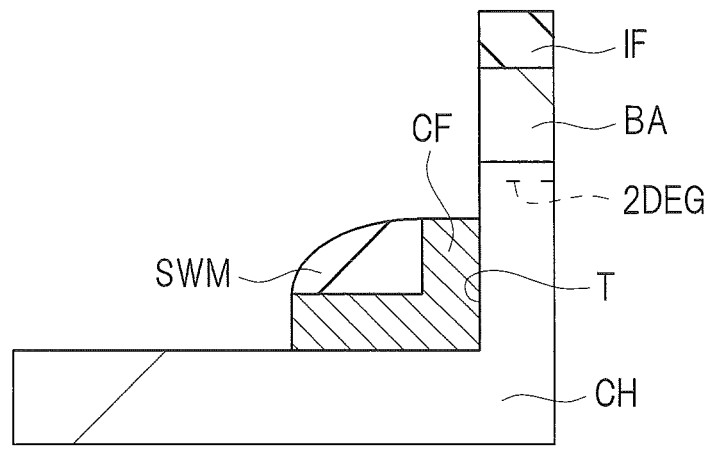
FIG. 63A is a sectional view showing a manufacturing process of a semiconductor device of a second example of the sixth embodiment and a configuration of the vicinity of a conductive film.
Figure 63B:
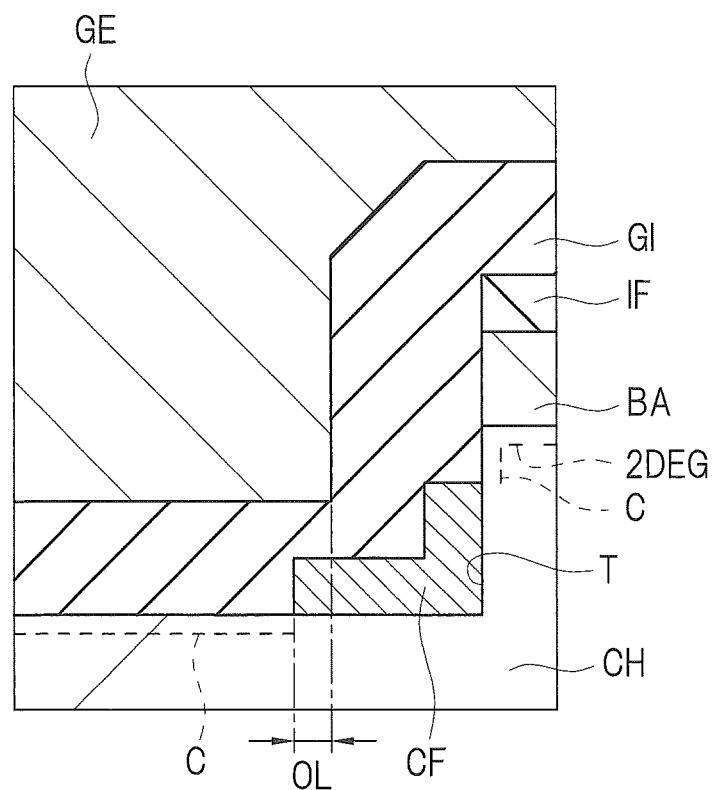
FIG. 63B is a sectional view showing a manufacturing process of a semiconductor device of the second example of the sixth embodiment and a configuration of the vicinity of the conductive film.

In the sixth embodiment, the shape of the conductive film CF will be described in detail. FIG. 61 is a sectional view of the semiconductor device of the fifth embodiment and a partially enlarged view of the vicinity of a conductive film of the semiconductor device. FIGS. 62A and 62B are sectional views showing a manufacturing process of a semiconductor device of a first example of the present embodiment and a configuration of the vicinity of a conductive film. FIGS. 63A and 63B are sectional views showing a manufacturing process of a semiconductor device of a second example of the present embodiment and a configuration of the vicinity of a conductive film.

As shown in FIG. 61, in the fifth embodiment, the height of the vertical portion of the conductive film CF formed at a corner portion corresponding to an end portion of the bottom surface of the trench T is set to be higher than a surface of the channel layer CH (interface between the channel layer CH and the barrier layer BA). By setting the height of the vertical portion of the conductive film CF in this manner, a current path between the conductive film CF and the two dimensional electron gas 2DEG can be secured, so that the on resistance can be reduced effectively.

Further, it is preferred that the horizontal portion of the conductive film CF is positioned inside the sidewall of the gate electrode GE. More specifically, it is preferred that the horizontal portion of the conductive film CF overlaps with the bottom surface of the gate electrode GE. This overlapping region is denoted by "OL". Note that the sidewall of the gate electrode GE means a sidewall formed corresponding to the sidewall of the trench T. Further, the bottom surface of the gate electrode GE corresponds to a region positioned between the sidewalls of the gate electrode GE and obtained by subtracting the film thicknesses of the gate insulating films GI formed on the sidewalls of the trench T from the width of the trench T in the gate length direction.

By forming the horizontal portion of the conductive film CF so as to extend from the sidewall of the trench T to inside of the sidewall of the gate electrode GE as described above, the current path between the channel C and the conductive film CF can be secured, so that the on resistance can be reduced effectively.

In the above-described fifth embodiment (see FIG. 46, FIG. 61, and others), the height of the vertical portion of the conductive film CF is set to be approximately equal to the surface of the barrier layer BA, but the top of the conductive film CF may be positioned to be lower so as to be in contact with the barrier layer BA.

Alternatively, as shown in the following first example, the height of the vertical portion of the conductive film CF may be set to be higher than the surface of the barrier layer BA. Further, as shown in the second example, the height of the vertical portion of the conductive film CF may be set to be lower than the bottom surface of the barrier layer BA. Note that, in the first example and the second example, the configuration and the manufacturing process other than the conductive film CF are similar to those of the fifth embodiment and others, and therefore, the description thereof is omitted.

FIRST EXAMPLE

As shown in FIG. 62B, the height of the vertical portion of the conductive film CF may be set to be higher than the surface of the barrier layer BA. In this case, the top of the conductive film CF is in contact with the insulating film IF. Also in this case, the height of the vertical portion of the conductive film CF is higher than the surface of the channel layer CH (interface between the channel layer CH and the barrier layer BA), and the current path between the conductive film CF and the two dimensional electron gas 2DEG can be secured, so that the on resistance can be reduced effectively.

Note that it is preferred that the horizontal portion of the conductive film CF is positioned inside the sidewall of the gate electrode GE like the semiconductor device shown in FIG. 61. More specifically, it is preferred that the horizontal portion of the conductive film CF overlaps with the bottom surface of the gate electrode GE. This overlapping region is denoted by "OL". By disposing the horizontal portion of the conductive film CF inside the sidewall of the gate electrode GE in this manner, the current path between the channel C and the conductive film CF can be secured, so that the on resistance can be reduced effectively.

For forming the conductive film CF shown in FIG. 62B, for example, as shown in FIG. 62A, the film thickness and the etch back conditions of the mask film M are adjusted in the etch back step of forming the sidewall film SWM so that the height of the sidewall film SWM is made higher than the surface of the barrier layer BA and the thickness of the sidewall film SWM reaches inside of the sidewall of the gate electrode GE. By removing the conductive film CF by etching with using this sidewall film SWM as a mask, the conductive film CF is left only at the corner portion corresponding to an end portion of the bottom surface of the trench T, and the conductive film CF in which the height of the vertical portion of the conductive film CF is higher than the surface of the barrier layer BA and the horizontal portion of the conductive film CF overlaps with the bottom surface of the gate electrode GE can be formed.

SECOND EXAMPLE

As shown in FIG. 63B, the height of the vertical portion of the conductive film CF may be made lower than the bottom surface of the barrier layer BA. In this case, a current path passing through the channel C extending along the bottom surface of the trench T, the conductive film CF, the channel C extending along the side surface of the trench T and the two dimensional electron gas 2DEG is formed. In this manner, the on resistance between the channel C and the drain electrode DE or the source electrode SE can be reduced.

Note that it is preferred that the horizontal portion of the conductive film CF is positioned inside the sidewall of the gate electrode GE like the semiconductor device shown in FIG. 61. More specifically, it is preferred that the horizontal portion of the conductive film CF overlaps with the bottom surface of the gate electrode GE. This overlapping region is denoted by "OL". By disposing the horizontal portion of the conductive film CF inside the sidewall of the gate electrode GE like this, a current path between the channel C extending along the bottom surface of the trench T and the conductive film CF can be secured, so that the on resistance can be reduced effectively. Further, it is preferred that the vertical portion of the conductive film CF extends to a position higher than the bottom surface of the gate electrode GE. More specifically, it is preferred that even the vertical portion of the conductive film CF also overlaps with the side surface of the gate electrode GE. By disposing the vertical portion of the conductive film CF so as to overlap with the side surface of the gate electrode GE in this manner, a current path between the channel C extending along the side surface of the trench T and the conductive film CF can be secured, so that the on resistance can be reduced effectively.

For forming the conductive film CF shown in FIG. 63B, for example, as shown in FIG. 63A, the film thickness and the etch back conditions of the mask film M are adjusted at the etch back step of forming the sidewall film SWM in the following manner. That is, the film thickness and the etch back conditions of the mask film M are adjusted so that the height of the sidewall film SWM is made lower than the bottom surface of the barrier layer BA and higher than the bottom surface of the gate electrode GE and the thickness of the sidewall film SWM reaches inside of the sidewall of the gate electrode GE. By removing the conductive film CF by etching with using this sidewall film SWM as a mask, the conductive film CF is left only at the corner portion corresponding to an end portion of the bottom surface of the trench T, and the conductive film CF in which the height of the vertical portion of the conductive film CF is lower than the bottom surface of the barrier layer BA and higher than the bottom surface of the gate electrode GE and the horizontal portion of conductive film CF overlaps with the bottom surface of the gate electrode GE can be formed.

(Seventh Embodiment)

Figure 64:
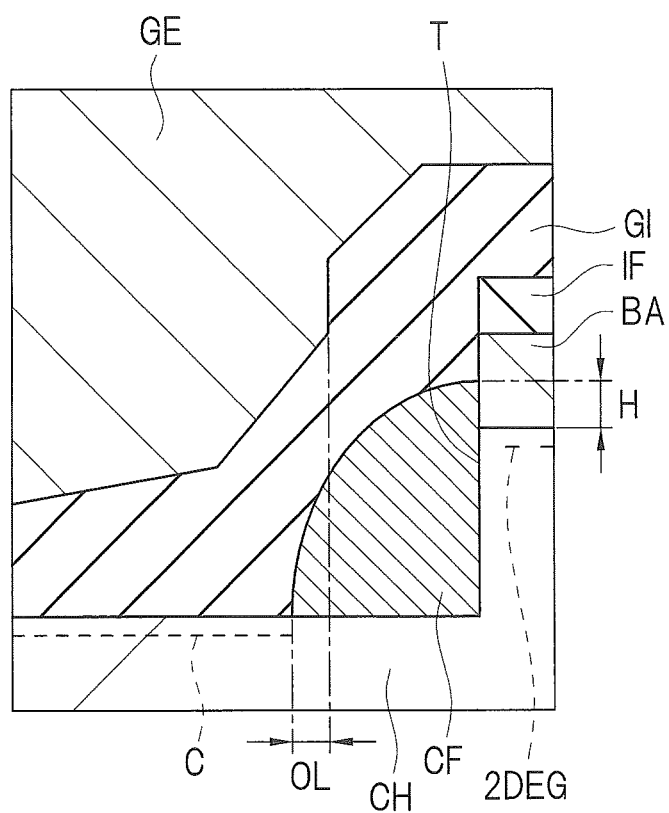
FIG. 64 is a sectional view showing a configuration of the vicinity of a conductive film portion of a semiconductor device of a seventh embodiment.

Though the conductive film CF has been arranged in an L shape (or inverted L shape) at the corner portion corresponding to an end portion of the bottom surface of the trench T in the fifth embodiment, the conductive film CF may be arranged in a sidewall shape (sidewall film shape). FIG. 64 is a sectional view showing a configuration of the vicinity of a conductive film portion of a semiconductor device of the seventh embodiment. In the present embodiment, since the configuration and the manufacturing process other than the conductive film CF are similar to those of the fifth embodiment and the like, the description thereof is omitted.

As shown in FIG. 64, in the present embodiment, a sidewall-shaped conductive film CF is provided at a corner portion corresponding to an end portion of a bottom surface of the trench T.

The height of the sidewall-shaped conductive film CF may be (1) higher than the surface of the channel layer CH (interface between the channel layer CH and the barrier layer BA) or may be (2) lower than the same like the height of the vertical portion described in the sixth embodiment. Also, when the height of the sidewall-shaped conductive film CF is made higher than the surface of the channel layer CH (interface between the channel layer CH and the barrier layer BA) like the case (1) above, the top of the sidewall-shaped conductive film CF may be arranged so as to be in contact with the insulating film IF or it may be arranged so as to be in contact with the barrier layer BA.

Further, it is preferred that the thickness of the sidewall-shaped conductive film CF (maximum film thickness in the gate length direction) is set to overlap with the bottom surface of the gate electrode GE like the length of the horizontal portion described in the sixth embodiment.

Also when the sidewall-shaped conductive film CF is provided at the corner portion corresponding to an end portion of the bottom surface of the trench T in this manner, the on resistance can be reduced.

For forming the sidewall-shaped conductive film CF, for example, after the conductive film CF is deposited on the insulating film IF including inside of the trench T (see FIG. 53), the conductive film is etched back. At this step, for example, the conductive film CF is removed from the surface thereof by a predetermined film thickness by anisotropic dry etching. By this step, the conductive film CF can be left in the form of sidewall on the sidewall portion of the trench T. At this time, the deposition film thickness and the etch back conditions of the conductive film CF are adjusted properly so that the height and the thickness of the sidewall-shaped conductive film CF fall within the above-described predetermined ranges.

Thereafter, after a gate insulating film GI is formed on the insulating film IF including inside of the trench T in which the conductive film CF is formed and a gate electrode GE is further formed on the gate insulating film GI, a source electrode SE and a drain electrode DE are formed in the same manner as the fifth embodiment and the like.

(Eighth Embodiment)

Figure 65:
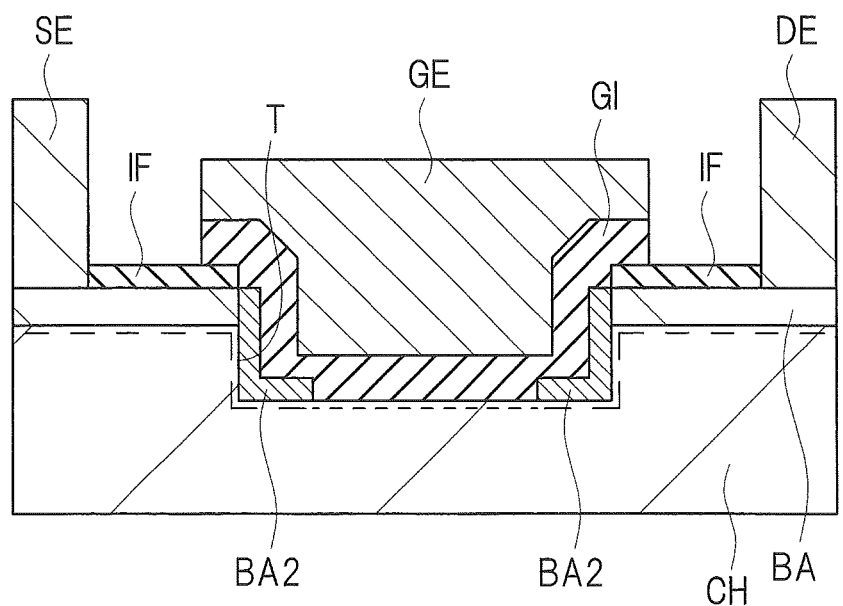
FIG. 65 is a sectional view showing a configuration of a semiconductor device of an eighth embodiment.

In the fifth embodiment, the conductive film CF is disposed at the corner portion corresponding to an end portion of the bottom surface of the trench T, but a barrier layer (second barrier layer) BA2 may be provided instead of the conductive film CF. FIG. 65 is a sectional view showing a configuration of the semiconductor device of the eighth embodiment. In the present embodiment, since the configuration and the manufacturing process other than the barrier layer BA2 corresponding to the conductive film CF are similar to those of the fifth embodiment and the like, description thereof is omitted.

As shown in FIG. 65, in the present embodiment, an L-shaped (or inverted L-shaped) barrier layer (second barrier layer) BA2 is disposed at a corner portion corresponding to an end portion of the bottom surface of the trench T. In this case, two dimensional electron gas 2DEG is produced along the corner portion corresponding to an end portion of the bottom surface of the trench T. Therefore, a current path passing through the channel C, the two dimensional electron gas 2DEG formed at the corner portion along the barrier layer BA2 and the two dimensional electron gas 2DEG formed along the barrier layer BA is formed. In this manner, the on resistance between the channel C and the drain electrode DE or the source electrode SE can be reduced.

The L-shaped (or inverted L-shaped) barrier layer BA2 may have a shape similar to the conductive film CF of the fifth embodiment. More specifically, the barrier layer BA2 has a vertical portion (also referred to as longitudinal portion or first portion) extending to the two dimensional electron gas 2DEG (interface between the channel layer CH and the barrier layer BA) along the side surface of the trench T and a horizontal portion (also referred to as lateral portion or second portion) extending along the bottom surface of the trench T.

The height of the vertical portion of the barrier layer BA2 may be (1) higher than the surface of the channel layer CH (interface between the channel layer CH and the barrier layer BA) or it may be (2) lower than the same like the conductive film CF. Also, when the height of the vertical portion of the barrier layer BA2 is made higher than the surface of the channel layer CH (interface between the channel layer CH and the barrier layer BA) like the case (1) above, the top of the vertical portion of the barrier layer BA2 may be arranged so as to be in contact with the insulating film IF or it may be arranged so as to be in contact with the barrier layer BA. When the height of the vertical portion of the barrier layer BA2 is made lower than the surface of the channel layer CH (interface between the channel layer CH and the barrier layer BA) like the case (2) above, a current path passing through the channel C extending along the bottom surface of the trench T, the two dimensional electron gas 2DEG formed at the corner portion along the barrier layer BA2, the channel C extending along the side surface of the trench T and the two dimensional electron gas 2DEG formed along the barrier layer BA is formed. However, the on resistance can be more reduced in the case (1) as compared with the case (2).

Further, it is preferred that the length of the horizontal portion of the barrier layer BA2 is set so as to overlap with the bottom surface of the gate electrode GE like the conductive film CF.

Also when the barrier layer (second barrier layer) BA2 is provided at the corner portion corresponding to an end portion of the bottom surface of the trench T in this manner, the on resistance can be reduced.

Further, the shape of the barrier layer (second barrier layer) BA2 may be formed in a sidewall shape like the conductive film CF of the seventh embodiment. Also in this case, the on resistance can be reduced.

Further, the barrier layer BA2 of the present embodiment can be formed by forming the barrier layer (second barrier layer) BA2 instead of the conductive film CF in the manufacturing process described in the fifth to seventh embodiments. The barrier layer BA2 is made of nitride semiconductor having a band gap wider than that of the channel layer CH. As the barrier layer BA2, for example, an AlGaN layer may be used.

Further, the AlGaN layer is hetero-epitaxially grown by using MOCVD method or the like.

Note that, as the semiconductor devices of the above-described fifth to eighth embodiments, the so-called n-channel type semiconductor devices have been described as examples, but the conductive film CF or the barrier layer BA2 can be applied to a p-channel type semiconductor device.

(Ninth Embodiment)

In the ninth embodiment, a planar layout of the semiconductor devices described in the fifth to eighth embodiments will be described.

Figure 66:
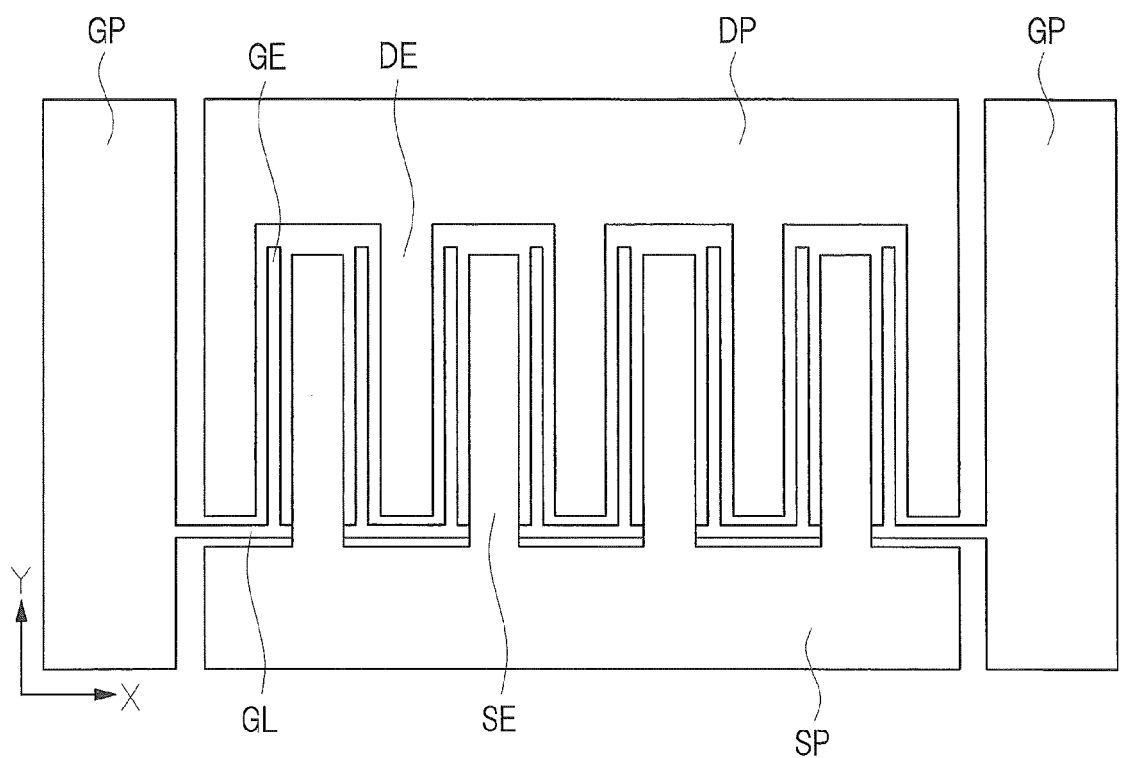
FIG. 66 is a plan view showing a configuration example of a semiconductor device of a ninth embodiment.

The planar shapes (layout) of the source electrodes SE, the drain electrodes DE, and the gate electrodes GE constituting the semiconductor devices described in the fifth to eighth embodiments are not particularly limited, but for example, the planar shapes shown in FIG. 66 may be adopted. FIG. 66 is a plan view showing a configuration example of a semiconductor device of the present embodiment. In FIG. 66, a space between the source electrode SE and the gate electrode GE and a space between the gate electrode GE and the drain electrode DE are similarly represented for the sake of simplicity.

As shown in FIG. 66, source electrodes SE extending in a Y direction are arranged at equal intervals in an X direction. Further, drain electrodes DE extending in the Y direction are arranged at equal intervals in the X direction. The plurality of source electrodes SE and the plurality of drain electrodes DE are alternately arranged along the X direction. Further, a gate electrode GE extending in the Y direction is arranged between each of the plurality of source electrodes SE and each of the plurality of drain electrodes DE.

The plurality of drain electrodes DE are connected to each other by a drain pad DP. The drain pad DP is disposed so as to extend in the X direction on one end side (upper side in FIG. 66) of the drain electrodes DE. In other words, the plurality of drain electrodes DE are arranged so as to project in the Y direction from the drain pad DP extending in the X direction. Such a shape may be referred to as comb shape.

The plurality of source electrodes SE are connected to each other by a source pad SP. The source pad SP is disposed so as to extend in the X direction on the other end side (lower side in FIG. 66) of the source electrode SE. In other words, the plurality of source electrodes SE are arranged so as to project in the Y direction from the source pad SP extending in the X direction. Such a shape may be referred to as comb shape.

Gate pads GP are disposed on both sides (left side and right side in FIG. 66) of the source pad SP (drain pad DP). The plurality of gate electrodes GE are electrically connected to a gate wiring GL arranged so as to extend in the X direction on the other end side (lower side in FIG. 66) of the gate electrodes GE. Further, the gate wiring GL extending in the X direction is electrically connected to the gate pads GP disposed on the left end and the right end of a drawing sheet of FIG. 66.

Figure 67:
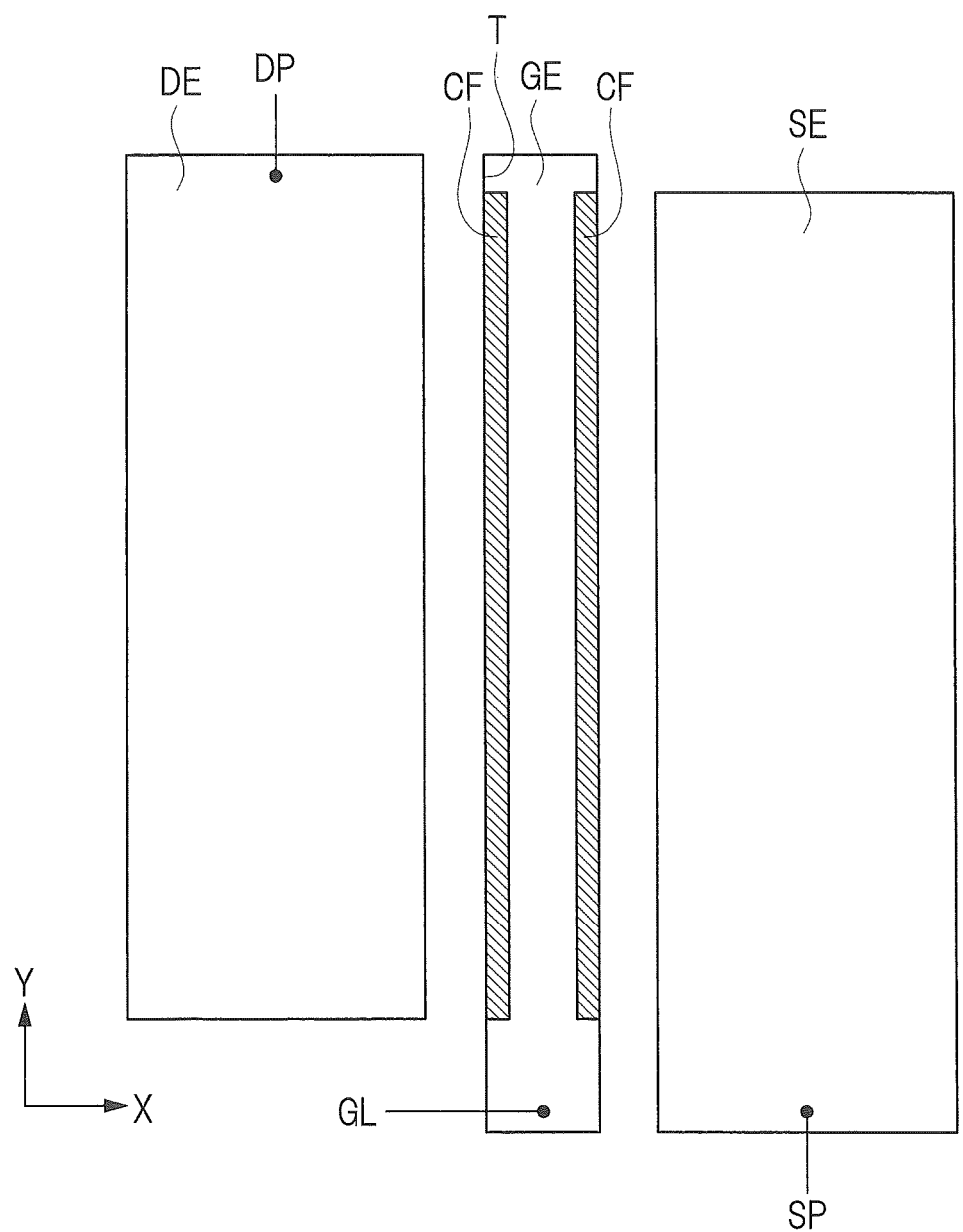
FIG. 67 is a plan view schematically showing the source electrode, the drain electrode, and the gate electrode shown in FIG. 66.

FIG. 67 is a plan view schematically showing the source electrode, the drain electrode, and the gate electrode shown in FIG. 66. As described above, the gate electrode GE extending in the Y direction is disposed between the source electrode SE extending in the Y direction and the drain electrode DE extending in the Y direction. The gate electrode GE is formed, via the gate insulating film GI, inside the trench T dug so as to penetrate through the insulating film IF and the barrier layer BA to reach the middle of the channel layer CH (see FIG. 46 and the like) as described in the fifth to eighth embodiments.

Note that, in FIG. 67, the planar shape of the trench T and the plane shape of the gate electrode GE are shown to have the same size for making the drawing easily understood.

More specifically, as shown in FIG. 67, the planar shape of the trench T is a rectangular shape having a long side extending in the Y direction and a short side extending in the X direction. Furthermore, as described in the fifth to eighth embodiments, the conductive films (also referred to as conductive regions) CF are provided so as to cover the corner portions corresponding to end portions of the bottom surface of the trench T (see FIG. 46 and the like). The planar shapes of the conductive films CF are shown in FIG. 67. The conductive films CF are arranged along two long sides of the rectangular trench T extending in the Y direction, respectively. The conductive films CF are not connected to each other, and are separated from each other. In other words, the conductive film CF is not formed along a short side of the rectangular trench T extending in the X direction.

The removing method of the conductive film CF in the vicinity of the short side extending in the X direction is not limited, but for example, a corresponding portion of a polycrystalline silicon film constituting the conductive film CF may be removed in advance before etching the sidewall film (sidewall insulating film) SWM is formed (see FIG. 53 to FIG. 57 and the like). Also, after the conductive film CF is removed by etching with using the sidewall film SWM as a mask, a portion of the conductive film CF positioned in the vicinity of the short side extending in the X direction may be further removed by etching (see FIG. 53 to FIG. 57 and the like). In addition, after the sidewall film SWM is formed, a portion of the sidewall film SWM positioned in the vicinity of the short side extending in the X direction is removed, and the conductive film CF may be removed by etching with using the sidewall film SWM as a mask (see FIG. 53 to FIG. 57 and the like).

Further, the embodiments above can be described also as the following additional statements, but it is needless to say that the scope of the invention is not limited to the following additional statements.

[Additional Statement]

(Additional Statement 1)

A semiconductor device including:

a first nitride semiconductor layer formed over a substrate;

a second nitride semiconductor layer formed on the first nitride semiconductor layer and having a band gap wider than that of the first nitride semiconductor layer;

a trench penetrating through the second nitride semiconductor layer to reach the middle of the first nitride semiconductor layer;

a conductive film formed at a corner portion corresponding to an end portion of a bottom surface of the trench; and a gate electrode disposed via a gate insulating film inside the trench including a region on the conductive film.

(Additional Statement 2)

The semiconductor device according to the additional statement 1, wherein the conductive film has a first portion disposed along a side surface of the trench from the corner portion and a second portion disposed along the bottom surface of the trench from the corner portion.

(Additional Statement 3)

The semiconductor device according to the additional statement 2, wherein a height of the first portion is higher than an interface between the first nitride semiconductor layer and the second nitride semiconductor layer.

(Additional statement 4)

The semiconductor device according to the additional statement 2, wherein a height of the first portion is equal to or lower than an interface between the first nitride semiconductor layer and the second nitride semiconductor layer.

(Additional Statement 5)

The semiconductor device according to the additional statement 2, wherein a length of the second portion is larger than a film thickness of the first portion.

(Additional Statement 6)

The semiconductor device according to the additional statement 2, wherein the second portion extends from a sidewall of the trench to inside of a sidewall of the gate electrode.

(Additional Statement 7)

The semiconductor device according to the additional statement 1, wherein the conductive film is formed in a sidewall shape so as to be in contact with a sidewall of the trench.

(Additional Statement 8)

A semiconductor device including:

a first nitride semiconductor layer formed over a substrate;

a second nitride semiconductor layer formed on the first nitride semiconductor layer and having a band gap wider than that of the first nitride semiconductor layer;

a trench penetrating through the second nitride semiconductor layer to reach the middle of the first nitride semiconductor layer;

a third nitride semiconductor layer formed at a corner portion corresponding to an end portion of a bottom surface of the trench and having a band gap wider than that of the first nitride semiconductor layer; and a gate electrode disposed via a gate insulating film inside the trench including a region on the third nitride semiconductor layer.

(Additional Statement 9)

The semiconductor device according to the additional statement 8, wherein the conductive film has a first portion disposed along a side surface of the trench from the corner portion and a second portion disposed along the bottom surface of the trench from the corner portion.

(Additional Statement 10)

The semiconductor device according to the additional statement 9, wherein a height of the first portion is higher than an interface between the first nitride semiconductor layer and the second nitride semiconductor layer.

(Additional Statement 11)

The semiconductor device according to the additional statement 9, wherein a height of the first portion is equal to or lower than an interface between the first nitride semiconductor layer and the second nitride semiconductor layer.

(Additional Statement 12)

The semiconductor device according to the additional statement 9, wherein a length of the second portion is larger than a film thickness of the first portion.

(Additional Statement 13)

The semiconductor device according to the additional statement 9, wherein the second portion extends from a sidewall of the trench to inside of a sidewall of the gate electrode.

(Additional Statement 14)

The semiconductor device according to the additional statement 8, wherein the conductive film is formed in a sidewall shape so as to be in contact with a sidewall of the trench.

(Additional Statement 15)

A manufacturing method of a semiconductor device including:

(a) a step of forming a stacked body by forming a first nitride semiconductor layer and a second nitride semiconductor layer having a band gap wider than that of the first nitride semiconductor layer on the first nitride semiconductor layer;

(b) a step of forming a trench penetrating through the second nitride semiconductor layer to reach the middle of the first nitride semiconductor layer by etching the stacked body;

(c) a step of forming a conductive film over the stacked body including inside of the trench;

(d) a step of etching the conductive film to leave the conductive film at a corner portion corresponding to an end portion of a bottom surface of the trench;

(e) a step of forming a gate insulating film inside the trench including a region on the conductive film; and (f) a step of forming a gate electrode on the gate insulating film.

(Additional Statement 16)

The manufacturing method of a semiconductor device according to the additional statement 15, wherein the step (d) includes:

(d1) a step of forming a mask film on the conductive film and anisotropically etching the mask film, thereby forming a sidewall film on a sidewall portion of the trench via the conductive film;

(d2) a step of etching the conductive film with using the sidewall film as a mask; and (d3) a step of removing the sidewall film.

(Additional Statement 17)

The manufacturing method of a semiconductor device according to the additional statement 16, wherein a height of the sidewall film is higher than an interface between the first nitride semiconductor layer and the second nitride semiconductor layer.

(Additional Statement 18)

The manufacturing method of a semiconductor device according to the additional statement 16, wherein a height of the sidewall film is equal to or lower than an interface between the first nitride semiconductor layer and the second nitride semiconductor layer.

0285 In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
   a first nitride semiconductor layer formed over a substrate;
   a second nitride semiconductor layer formed on the first nitride semiconductor layer;
   a third nitride semiconductor layer formed on the second nitride semiconductor layer and made of nitride semiconductor having a band gap wider than that of the second nitride semiconductor layer;
   a trench penetrating through the third nitride semiconductor layer to reach a middle of the second nitride semiconductor layer; and
   a gate electrode disposed inside the trench via a gate insulating film, wherein the second nitride semiconductor layer contains n-type impurities, a region of the second nitride semiconductor layer positioned on a first nitride semiconductor layer side has a concentration of the n-type impurities larger than a region of the second nitride semiconductor layer positioned on a third nitride semiconductor layer side, and the first nitride semiconductor layer is made of nitride semiconductor having a band gap wider than that of the second nitride semiconductor layer or nitride semiconductor containing p-type impurities.

2. The semiconductor device according to claim 1,
wherein the second nitride semiconductor layer has a first layer containing n-type impurities at a first concentration and a second layer formed on the first layer and containing n-type impurities at a second concentration lower than the first concentration.

3. The semiconductor device according to claim 2,
wherein the first concentration is in a range of $1 \times 10^{18}/cm^3$ or more to less than $1 \times 10^{19}/cm^3$, and the second concentration is in a range of $1 \times 10^{17}/cm^3$ or more to less than $1 \times 10^{18}/cm^3$.

4. The semiconductor device according to claim 2,
wherein the second nitride semiconductor layer has an undoped third layer below the first layer.

5. The semiconductor device according to claim 2, further comprising:
a source electrode and a drain electrode formed over the third nitride semiconductor layer on both sides of the gate electrode.

6. The semiconductor device according to claim 5,
wherein connection between the source electrode and the third nitride semiconductor layer and connection between the drain electrode and the third nitride semiconductor layer are ohmic connections.

7. The semiconductor device according to claim 5, further comprising:
an n-type impurity region in contact with a side surface portion of the trench positioned on a drain electrode side.

8. The semiconductor device according to claim 7,
wherein the impurity region includes a partial region of the third nitride semiconductor layer and a partial region of the second nitride semiconductor layer, and the partial regions contain silicon (Si).

9. The semiconductor device according to claim 7, further comprising:
another n-type impurity region in contact with a side surface portion of the trench positioned on a source electrode side.

10. The semiconductor device according to claim 9,
wherein the other n-type impurity region extends to a portion below the source electrode.

11. A semiconductor device comprising:
a first nitride semiconductor layer formed over a substrate;
a second nitride semiconductor layer formed on the first nitride semiconductor layer;
a third nitride semiconductor layer formed on the second nitride semiconductor layer and made of nitride semiconductor having a band gap wider than that of the second nitride semiconductor layer;

a trench penetrating through the third nitride semiconductor layer to reach a middle of the second nitride semiconductor layer; and a gate electrode disposed inside the trench via a gate insulating film, wherein the second nitride semiconductor layer contains n-type impurities, a region of the second nitride semiconductor layer positioned on a first nitride semiconductor layer side has a concentration of the n-type impurities smaller than a region of the second nitride semiconductor layer positioned on a third nitride semiconductor layer side, and the first nitride semiconductor layer is made of nitride semiconductor having a band gap wider than that of the second nitride semiconductor layer or nitride semiconductor containing p-type impurities.

12. The semiconductor device according to claim 11,
wherein the second nitride semiconductor layer has an undoped first layer and a second layer formed on the first layer and containing n-type impurities at a first concentration.

13. The semiconductor device according to claim 12,
wherein the first concentration is in a range of $1 \times 10^{17}/cm^3$ or more to less than $1 \times 10^{18}/cm^3$.

14. The semiconductor device according to claim 12, further comprising:
a source electrode and a drain electrode formed over the third nitride semiconductor layer on both sides of the gate electrode.

15. The semiconductor device according to claim 14,
wherein connection between the source electrode and the third nitride semiconductor layer and connection between the drain electrode and the third nitride semiconductor layer are ohmic connections.

16. The semiconductor device according to claim 14, further comprising:
an n-type impurity region in contact with a side surface portion of the trench positioned on a drain electrode side.

17. The semiconductor device according to claim 16,
wherein an end portion of the n-type impurity region positioned on a source electrode side is positioned on a source electrode side relative to a side surface portion of the gate electrode inside the trench positioned on a drain electrode side, and an end portion of the n-type impurity region positioned on a drain electrode side is positioned on a source electrode side relative to an end portion of the gate electrode positioned on a drain electrode side.

18. The semiconductor device according to claim 16,
wherein the impurity region includes a partial region of the third nitride semiconductor layer and a partial region of the second nitride semiconductor layer, and the partial regions contain silicon (Si).

19. The semiconductor device according to claim 16, further comprising:
another n-type impurity region in contact with a side surface portion of the trench positioned on a source electrode side.

20. The semiconductor device according to claim 19,
wherein the other n-type impurity region extends to a portion below the source electrode.

* * * * *

UNITED STATES PATENT AND TRADEMARK OFFICE
CERTIFICATE OF CORRECTION

PATENT NO. : 8,963,207 B2  
APPLICATION NO. : 14/188462  
DATED : February 24, 2015  
INVENTOR(S) : Tohru Kawai et al.

Page 1 of 1

It is certified that error appears in the above-identified patent and that said Letters Patent is hereby corrected as shown below:

On the Title page  
Item (30) Foreign Application Priority Data should read  
Feb. 25, 2013 (JP) ......................... 2013-035055  
Jul. 7, 2013 (JP) ........................ 2013-141305

Signed and Sealed this  
Twenty-second Day of September, 2015

Michelle K. Lee  
*Director of the United States Patent and Trademark Office*